United States Patent [19]
Uehara et al.

[11] Patent Number: 4,988,999
[45] Date of Patent: Jan. 29, 1991

[54] DIGITAL MODULATION METHOD

[75] Inventors: Toshihiro Uehara; Hotaka Minaguchi; Yoshinobu Oba, all of Tokyo, Japan

[73] Assignee: Nippon Hoso Kyokai, Tokyo, Japan

[21] Appl. No.: 506,270

[22] Filed: Apr. 9, 1990

[30] Foreign Application Priority Data

Apr. 12, 1989 [JP] Japan ................. 1-90537
Feb. 9, 1990 [JP] Japan ................. 1-28262

[51] Int. Cl.$^5$ ........................... H03M 7/00
[52] U.S. Cl. ......................... 341/59; 341/55
[58] Field of Search .............. 341/55, 58, 59, 341/68, 69, 70, 71, 72, 73, 74, 95, 107; 375/19

[56] References Cited

U.S. PATENT DOCUMENTS 4,760,378  7/1988  Iketani et al. .............. 341/59
4,833,471  5/1989  Tokuume et al. ........... 341/58 X

FOREIGN PATENT DOCUMENTS 19506    2/1981  Japan .
196469   8/1986  Japan .
62-16619 1/1987  Japan .................. 341/59
62-49724 3/1987  Japan .................. 341/58

Primary Examiner—William M. Shoop, Jr.
Assistant Examiner—H. L. Williams
Attorney, Agent, or Firm—Spencer & Frank

[57] ABSTRACT

A digital modulation method for modulating 8-bit digital data into 14-bit digital modulation codes. The number of consecutive identical bits in a series of 14-bit digital modulation codes is restricted to 2-7. The absolute value of DSV at the end of each 14-bit digital modulation code is restricted to 2 or less, and the absolute value of DSV at each bit of any 14-bit digital modulation codes is limited to 7 or less. The direct current component of the 14-bit modulation codes can be effectively reduced.

8 Claims, 9 Drawing Sheets

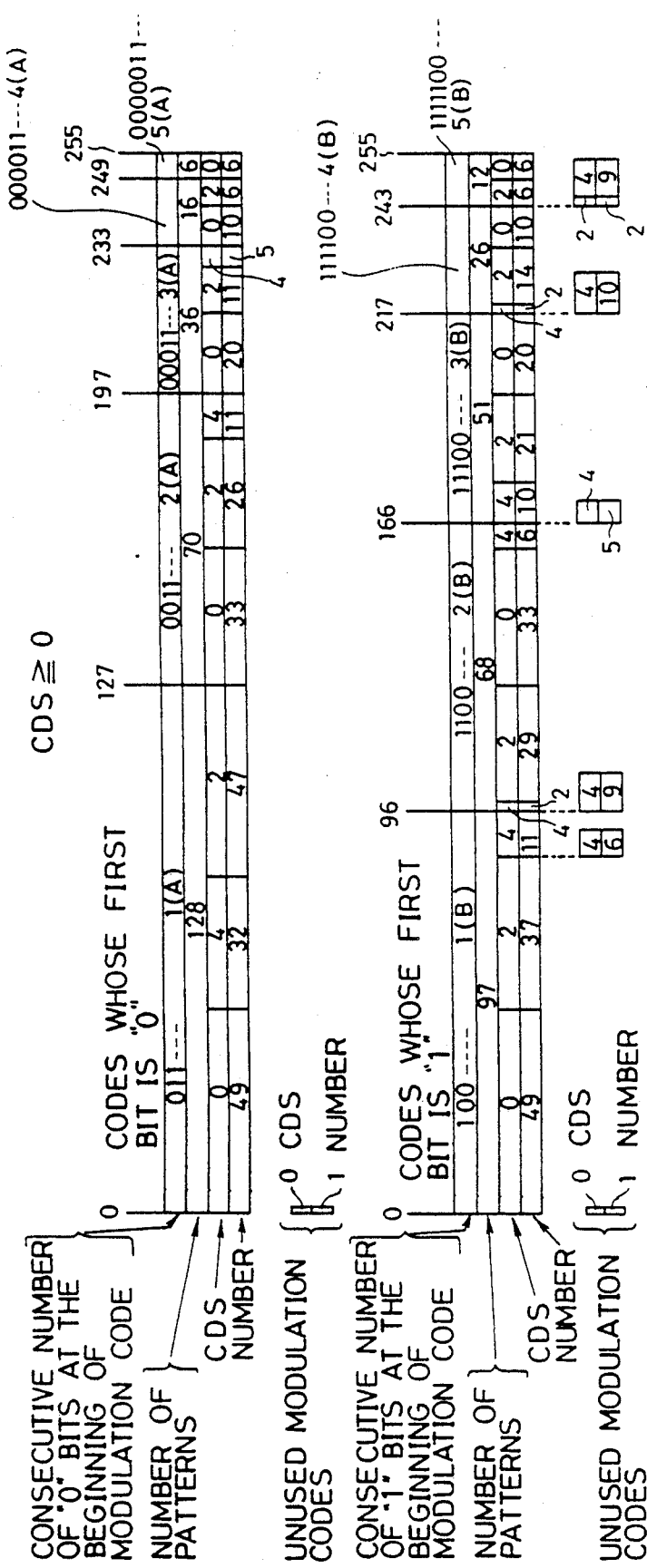

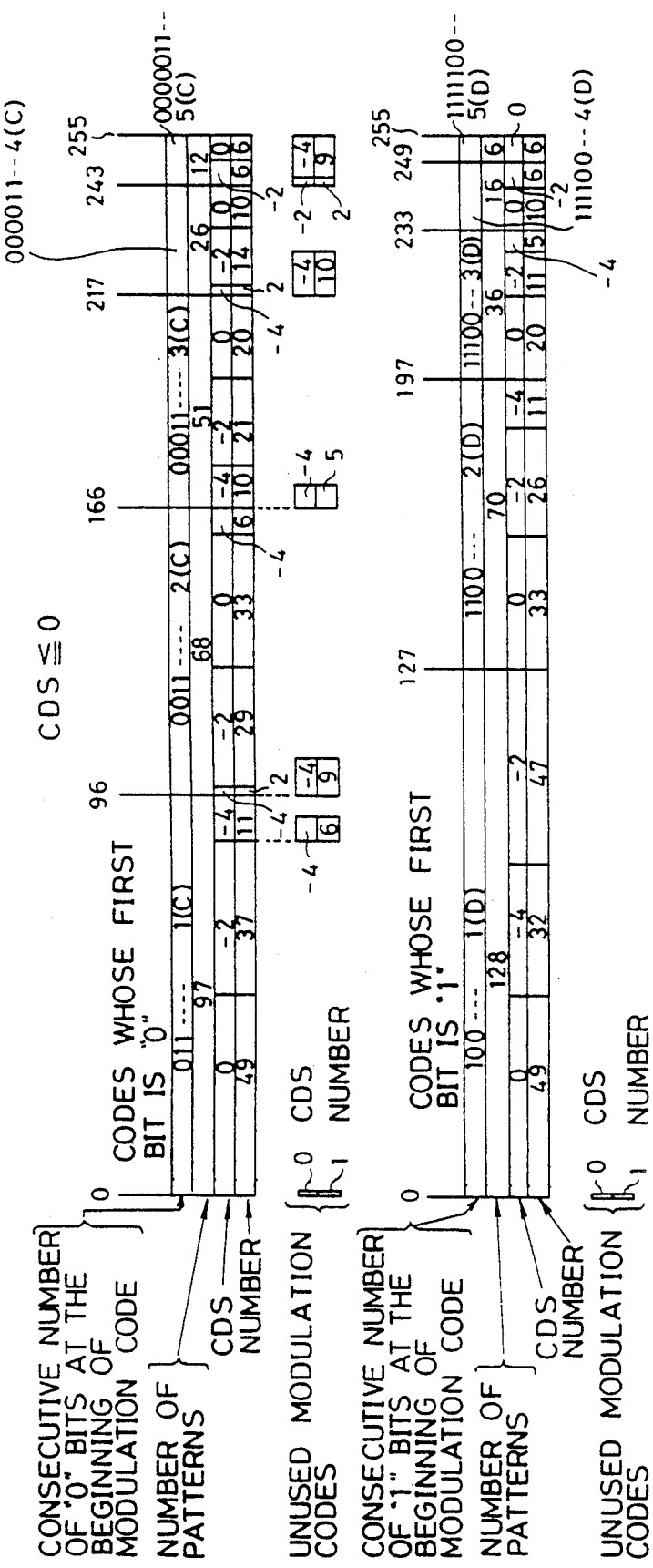

DIGITAL MODULATION METHOD

BACKGROUND OF THE INVENTION

1. Field of the Invention

The present invention relates to a digital modulation method which converts 8-bit digital data into 14-bit digital modulation codes.

2. Description of the Prior Art

Conventional apparatuses, which use rotary heads to record digital data to magnetic tape or to reproduce digital data recorded on magnetic tape, utilize rotary transformers to record or reproduce the digital data: recording is performed by supplying the digital data to the rotary head through the rotary transformer; and reproduction is performed by reading the digital signal with the rotary magnetic head through the rotary transformer.

Consequently, if the reproduced signal includes a DC (Direct Current) component, the digital data cannot be correctly reproduced. For this reason, the digital data must be recorded by using a DC free digital modulation system.

Among the conventional DC free digital modulation systems, the following systems are well known.

The 8–10 modulation system, the DR (Density Ratio) of which is 0.8, is described in Japanese Patent Application Laying-Open No. 56-19506.

The $M^2$ modulation system, the DR of which is 1, is known.

The 8–14 modulation system, the DR of which is 1.14, is described in Japanese Patent Application Laying-Open No. 61-196469. This system provides up to four 14-bit digital modulation codes for each 8-bit digital data. When the CDS (Code word Digital Sum) of a 14-bit modulation code is zero, the code is paired with the reversal pattern thereof. When the CDS of a 14-bit digital modulation code is not zero, the code is grouped with the following three codes: another 14-bit modulation code the absolute value and sign of CDS of which differ from those of the above code; and the reversal patterns of the respective codes.

Here, CDS is defined as a DSV calculated from the first bit to the last bit of a modulation code: DSV (Digital Sum Value) is a total sum obtained by adding $-1$ for respective bits "0" in a series of digital modulation codes and by adding 1 for respective bits "1" in the same codes. The reversal pattern is a pattern obtained by reversing each bit in a code: bit "1" is reversed to "0", whereas bit "0" is reversed to "1".

The above-mentioned conventional modulation systems have the following problems.

The 8–10 modulation system is not appropriate to a high-density recording because of its low DR of 0.8.

The $M^2$ modulation system is restricted in its high-density recording because of its DR of 1.

The 8–14 modulation system has up to 4 modulation codes for each 8-bit code, and the absolute value of CDS of the digital modulation codes are allowed up to 6. In addition, DSV at the end of each 14-bit digital modulation code in the code stream is allowed up to $\pm 4$, and DSV at each bit in a series of the 14-bit digital modulation codes is allowed up to $\pm 9$. Consequently, it is difficult to eliminate the DC component of the modulation codes in a short time, and hence, low frequency component must be adequately passed in a recording/reproducing system including the rotary transformer.

A further problem is presented in the 8–14 modulation system. Generally speaking, magnetizing depth on magnetic tape is about ¼ of the magnetized wavelength. When recording signals are over-written on the tape, the following problem occurs: recording a new signal of the shortest magnetized wavelength on the longest magnetized wavelength which is 4 times or more longer than the shortest magnetized wavelength results in the erasing residue in the deeper part of the recording medium. This erasing residue appears during reproduction of the new signal, and so the over-writing is practically difficult.

Thus, the 8–14 modulation system suffers from the problem caused by the erasing residue when over-writing is performed because the number of consecutive identical bits ("0" or "1") in a 8–14 modulation code train is 2–9.

Incidentally, in the later description, the term "consecutive identical bits" means two or more consecutive identical bits: for example, "000" or "11".

SUMMARY OF THE INVENTION

It is therefore an object of the present invention to provide digital modulation system which can solve the above problems: the digital modulation system that allows high density recording, that can reduce the DC component with high efficiency, and that can perform azimuth recording and over-writing.

In a first aspect of the present invention, there is provided a digital modulation method for converting 8-bit digital data into 14-bit digital modulation codes, the digital modulation method comprising:

step 1 for selecting up to four 14-bit digital modulation codes for each 8-bit digital data, the 14-bit digital modulation code is selected by the procedures of (a) selecting among the $2^{14}$ 14-bit digital codes, a digital code the numbers of consecutive identical bits in which are 5 or less in the first 6 bits, 2–7 from the second bit to 13th bit, and 6 or less in the last 7 bits, the absolute value of CDS of the selected digital code being 4 or less, and repeating this selecting procedure, (b) selecting among the selected 14-bit digital codes at the procedure (a), a digital code the first bit of which is "0", and the value of CDS of which is 0, and pairing the selected 14-bit digital code with the reversal code thereof to make the 2 digital codes one group, or selecting among the selected 14-bit digital codes at the procedure (a), a digital code the first bit of which is "1", and the value of CDS of which is $+2$ or $+4$, combining the selected 14-bit digital codes with the reversal codes thereof, and further combining the two 14-bit digital codes with a pair of 14-bit digital codes selected at the above procedure to make the 4 digital codes one group, and repeating this selecting procedure, (c) selecting among the selected 14-bit digital codes at the procedure (a), a digital code the first bit of which is "0", and the value of CDS of which is $+2$, and another digital code the first bit of which is "1", and the value of CDS of which is $+2$ or $+4$, and combining the two selected 14-bit digital codes with the reversal codes thereof to make the 4 digital codes one group, and repeating this selecting procedure, (d) selecting among the selected 14-bit digital codes at the procedure (a), a digital code the first bit of which is "0", and the value of CDS of which is $+4$, and another digital code the first bit of which is "1", and the value of CDS of which is $+2$, and combining the two selected 14-bit digital codes with the reversal codes thereof to make the 4 digital codes one group, and repeating this selecting procedure, and (e) selecting 256 groups among the groups formed in the above procedures as the 14-bit digital modulation codes;

step 2 for selecting one group of 14-bit digital modulation codes among the 256 groups of the 14-bit digital modulation codes, the selected group corresponding to inputted 8-bit digital data;

step 3 for further selecting one or more 14-bit digital modulation codes in the selected group at step 2, each of the 14-bit digital modulation codes satisfying the requirement that the number of consecutive identical bits at the joint portion of the preceding 14-bit digital modulation code already selected and the 14-bit digital modulation code to be selected is 2-7; and step 4 for further selecting one 14-bit digital modulation code among the selected modulation codes at step 3 so that the one 14-bit digital modulation code satisfies the requirement that the absolute value of the DSV at each bit of the modulation code (called bit DSV hereinafter) is equal to or less than 7.

In a second aspect of the present invention, there is provided a digital modulation method for converting 8-bit digital data into 14-bit digital modulation codes, the digital modulation method comprising:

step 1 for selecting up to four 14-bit digital modulation codes for each 8-bit digital data, the 14-bit digital modulation code is selected by the procedures of (a) selecting among the $2^{14}$ 14-bit digital codes, a digital code the numbers of consecutive identical bits in which are 6 or less in the first 7 bits, 2-7 from the second bit to 13th bit, and 5 or less in the last 6 bits, and repeating this selecting procedure, (b) selecting among the 14-bit digital codes selected at the procedure (a), a digital code the first bit of which is "0", and the CDS of which has the absolute value equal to or less than 6, and repeating this selecting procedure, (c) selecting among the 14-bit digital codes selected at the procedure (a), a digital code the first bit of which is "1", and the CDS of which has the absolute value equal to or less than 4, and repeating this selecting procedure, (d) selecting among the 14-bit digital codes selected at the procedure (b), a digital code the value of CDS of which is 0, and pairing the selected 14-bit digital code with the reversal code thereof to make the 2 digital codes one group, and repeating this selecting procedure, (e) selecting among the 14-bit digital codes selected at the procedure (b), a digital code the value of CDS of which is +2, +4 or +6, selecting among the 14-bit digital codes selected at the procedure (c), a digital code the value of CDS of which is +2 or +4, and combining the two selected 14-bit digital codes with the reversal codes thereof to make the 4 digital codes one group, and repeating this selecting procedure, and (f) selecting 256 groups among the groups formed in the above procedures as the 14-bit digital modulation codes;

step 2 for selecting one group of 14-bit digital modulation codes among the 256 groups of the 14-bit digital modulation codes, the selected group corresponding to inputted 8-bit digital data;

step 3 for further selecting one or more 14-bit digital modulation codes in the selected group at step 2, each of the 14-bit digital modulation codes satisfying the requirement that the number of consecutive identical bits at the joint portion of the preceding 14-bit digital modulation code already selected and the 14-bit digital modulation code to be selected is 2-7; and step 4 for further selecting one 14-bit digital modulation code among the selected modulation codes at step 3 so that the one 14-bit digital modulation code satisfies the requirement that the absolute value of the bit DSV of the modulation code is equal to or less than 8.

BRIEF DESCRIPTION OF THE DRAWINGS

FIG. 4 is a view showing the number of 14-bit digital modulation codes whose CDS $\geq 0$;

FIG. 5 is a view showing the number of 14-bit digital modulation codes whose CDS $\geq 0$;

DESCRIPTION OF THE PREFERRED EMBODIMENTS

The invention will now be described with reference to the accompanying drawings.

[A]FIRST EMBODIMENT

Figure 1:
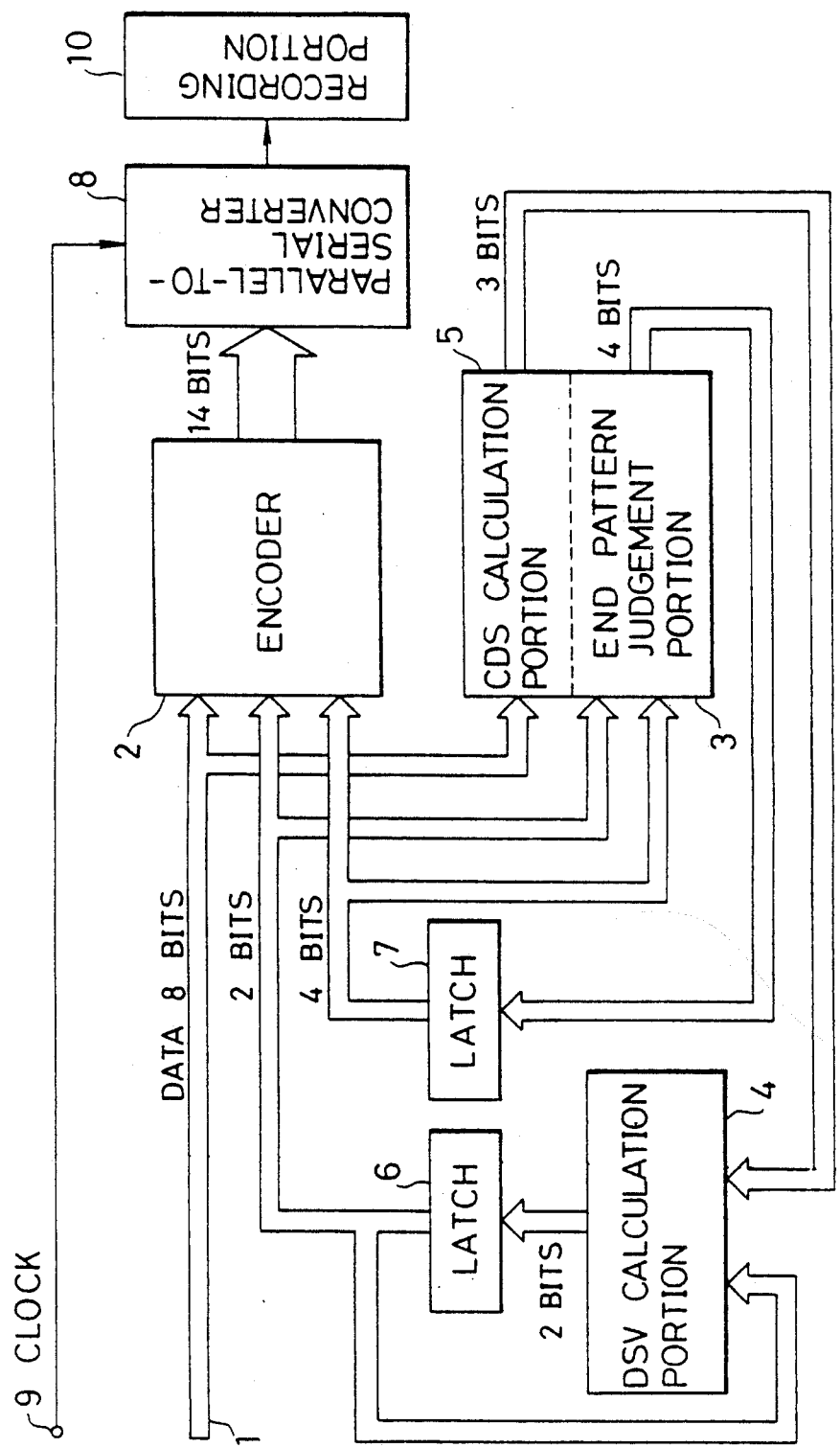
FIG. 1 is a block diagram showing a digital modulation apparatus for carrying out the digital modulation according to the first embodiment of the digital modulation method of the present invention.

FIG. 1 is a block diagram showing a digital modulation apparatus for carrying out the digital modulation according to the first embodiment of the digital modulation method of the present invention.

In FIG. 1, 8-bit digital data 1 is converted to a 14-bit digital modulation code by an encoder 2. An end pattern judgement portion 3 converts the end pattern of the last 6-bits of the 14-bit digital modulation code into a 4-bit code in Table 9 (although the last 8 bits of the modulation codes are given in Table 9, only the last 6 bits should be considered). A CDS calculation portion 5 computes the CDS of the 14-bit digital modulation code supplied, and converts the resultant CDS into a 3-bit code in Table 7. A DSV calculation portion 4 adds the CDS of the current 14-bit digital modulation code to the DSV at the end of the preceding 14-bit digital modulation code, yielding a new DSV, and converts the new DSV into a 2-bit code shown in Table 8.

A parallel-to-serial converter 8 converts the 14-bit digital modulation code into a serial signal in synchronism with a clock signal 9. A recording portion 10 records the serial modulation signal produced from the parallel-to-serial converter 8 on a recording medium such as magnetic tape or the like.

TABLE 7

| CDS of modulation codes | Corresponding 3-bit codes |
| --- | --- |
| −4 | 000 |
| −2 | 001 |
| 0 | 010 |
| 2 | 011 |
| 4 | 100 |

TABLE 8

| DSV at the end of the preceding modulation codes | Corresponding 2-bit codes |
| --- | --- |
| −2 | 00 |
| 0 | 01 |
| 2 | 10 |

TABLE 9

| End pattern of the preceding modulation code | Corresponding 2-bit codes |
| --- | --- |
| ... xxxxx110 | 0000 |
| ... xxxx1100 | 0001 |
| ... xxx11000 | 0010 |
| ... xx110000 | 0011 |
| ... x1100000 | 0100 |
| ... 11000000 | 0101 |
| ... xxxxx001 | 0110 |
| ... xxxx0011 | 0111 |
| ... xxx00111 | 1000 |
| ... xx001111 | 1001 |
| ... x0011111 | 1010 |
| ... 00111111 | 1011 | x: Don't care bit

The output code of the CDS calculation portion 5 is supplied to the DSV calculation portion 4.

The DSV calculation portion 4 supplies the code to the encoder 2 via a latch 6. The end pattern judgement portion 3 supplies the code to the encoder 2 via a latch 7.

Next, the method for selecting a 14-bit digital modulation code corresponding to each inputted 8-bit digital data will be described.

First, the method for selecting up to four 14-bit digital modulation codes for each 8-bit digital data will be described. The 14-bit digital modulation code is selected by the procedures of (a) selecting among the $2^{14}$ 14-bit digital codes, a digital code the numbers of consecutive identical bits in which are 5 or less in the first 6 bits, 2–7 from the second bit to 13th bit, and 6 or less in the last 7 bits, the absolute value of CDS of the selected digital code being 4 or less, and repeating this selecting procedure, (b) selecting among the selected 14-bit digital codes at the procedure (a), a digital code the first bit of which is "0", and the value of CDS of which is 0, and pairing the selected 14-bit digital code with the reversal code thereof to make the 2 digital codes one group, and repeating this selecting procedure, or selecting among the selected 14-bit digital codes at the procedure (a), a digital code the first bit of which is "1", and the value of CDS of which is +2 or +4, combining the selected 14-bit digital codes with the reversal codes thereof, and further combining the two 14-bit digital codes with a pair of 14-bit digital codes selected at the above procedure to make the 4 digital codes one group, and repeating this selecting procedure, (c) selecting among the selected 14-bit digital codes at the procedure (a), a digital code the first bit of which is "0", and the value of CDS of which is +2, and another digital code the first bit of which is "1", and the value of CDS of which is +2 or +4, and combining the two selected 14-bit digital codes with the reversal codes thereof to make the 4 digital codes one group, and repeating this selecting procedure, (d) selecting among the selected 14-bit digital codes at the procedure (a), a digital code the first bit of which is "0", and the value of CDS of which is +4, and another digital code the first bit of which is "1", and the value of CDS of which is +2, and combining the two selected 14-bit digital codes with the reversal codes thereof to make the 4 digital codes one group, and repeating this selecting procedure, and (e) selecting 256 groups among the groups formed in the above procedures as the 14-bit digital modulation codes.

Next, the selection procedure of a 14-bit digital modulation code (current modulation code) corresponding to inputted 8-bit data will be described.

First, the DSV at the end of the preceding modulation code is calculated, and the end pattern of the preceding modulation code is decided as one of the twelve end patterns shown in Table 9.

Subsequently, the current 14-bit digital modulation code is selected by the encoder 2 in response to the 8-bit data, the DSV at the end of the preceding modulation code, and the end pattern of the preceding modulation code.

More specifically, the following steps are taken for selecting the current 14-bit digital modulation code.

(1) The 14-bit digital modulation codes satisfying the following conditions are selected from Tables 4 and 5: (a) the number of consecutive identical bits at the joint portion with the preceding 14-bit digital modulation code is two to seven; and (b) the absolute value of the DSV at the end of the digital modulation code (called end DSV hereinafter) is equal to or less than two.

(2) When two or more 14-bit digital modulation codes are selected at step (1), the 14-bit digital modulation code that gives the least absolute value of the end DSV is chosen.

(3) When two or more 14-bit digital modulation codes are still chosen in step (2), the 14-bit digital modulation code is selected by calculating the bit DSV of the modulation code, determining the bit DSV the absolute value of which is minimum for each modulation code, and choosing the code including the bit DSV whose minimum absolute value is minimum.

(4) When two or more 14-bit digital modulation codes are further found in step (3), the 14-bit digital modulation code is selected by finding the maximum absolute value of the bit DSV of each modulation code, and choosing the code including the bit DSV whose maximum absolute value is equal to or less than six.

(5) When two or more modulation code are still found in step (4), is selected the 14-bit digital modulation code satisfying the condition that the number of consecutive identical bits at the joint portion with the preceding 14-bit digital modulation code is equal to or less than six.

(6) When any modulation codes selected at step (4) does not satisfy step (5), or two or more modulation codes satisfy step (5), is selected a 14-bit digital modulation code satisfying the condition that the consecutive identical bits in that modulation code is equal to or less than six.

(7) When any modulation code selected at step (4) does not satisfy steps (5) and (6), or when any modulation code selected at step (5) does not satisfy step (6), or when two or more modulation codes are further found at step (6), the following steps are taken.

(7a) When the end DSV of the modulation code is −2, the code of higher priority (corresponding to smaller number in Table 10) is selected according to Table 10. Likewise, when the end DSV of the modulation code is +2, the code of higher priority is selected according to Table 11.

(7b) When two or more modulation codes belonging to the equal highest priority are found in step (7a), all of them are temporarily selected. When the end DSV is zero, is selected the modulation code satisfying the last six bits of which are not "...111111", nor "...000000" in the modulation codes.

(8) When any modulation code selected at step (4) does not satisfy steps (5), (6) and (7), or when any modulation code selected at step (5) does not satisfy step (6) and (7), or when any modulation code selected at step (6) does not satisfy step (7), or when two or more modulation codes are further found at step (7), is selected the modulation code including the bit DSV whose maximum absolute value is minimum.

(9) When two or more modulation codes are still found at step (8), is selected the modulation code including the bit DSV whose minimum absolute value appears fastest in the bit string of the modulation code.

(10) When two or more modulation codes are further found at step (9), is selected the modulation code whose bit will be reversed fastest after the joint point with the preceding modulation code.

TABLE 10

In the case where DSV at the end of modulation code is "−2"

| End pattern of modulation codes | Priority |
|---|---|
| ... xxxxx001 | 4 |
| ... xxxx0011 | 1 |
| ... xxx00111 | 2 |
| ... xx001111 | 3 |
| ... x0011111 | 8 |
| ... xxxxx110 | 10 |
| ... xxxx1100 | 5 |
| ... xxx11000 | 6 |
| ... xx110000 | 7 |
| ... x1100000 | 9 |
| ... 11000000 | 11 | x: Don't care bit

TABLE 11

In the case where DSV at the end of modulation code is "+2"

| End pattern of modulation codes | Priority |
|---|---|
| ... xxxxx110 | 4 |
| ... xxxx1100 | 1 |
| ... xxx11000 | 2 |
| ... xx110000 | 3 |
| ... x1100000 | 8 |
| ... xxxxx001 | 10 |
| ... xxxx0011 | 5 |
| ... xxx00111 | 6 |
| ... xx001111 | 7 |
| ... x0011111 | 9 |
| ... 00111111 | 11 | x: Don't care bit

The 14-bit digital modulation code thus selected is fed to the parallel-to-serial converter 8. The modulation code entered the parallel-to-serial converter 8 is serially read out in synchronism with the clock 9, and is fed to the recording portion 10, where the 14-bit digital modulation code is recorded on the recording medium such as magnetic tape or the like.

On the other hand, the 14-bit digital modulation code selected by the encoder 2 is supplied to the DSV calculation portion 4, and to the end pattern judgement portion 3. The DSV calculation portion 4 adds the CDS of the current modulation code to the DSV at the end of the preceding modulation code to obtain a new DSV. The new DSV is converted into a 2-bit code according to Table 8, and is supplied to the encoder 2 through latch 6. The end pattern judgement portion 3 converts the last 6 bits of the 14-bit modulation code into a 4-bit code according to Table 9, and supplies the 4-bit code to the encoder 2 through latch 7.

The above procedure is repeated for every 8-bit input data. Thus, a 14-bit digital modulation code train is obtained, in which the number of consecutive identical bits is restricted to 2-7, and the absolute value of the DSV is restricted equal to or less than 7.

Figure 2:
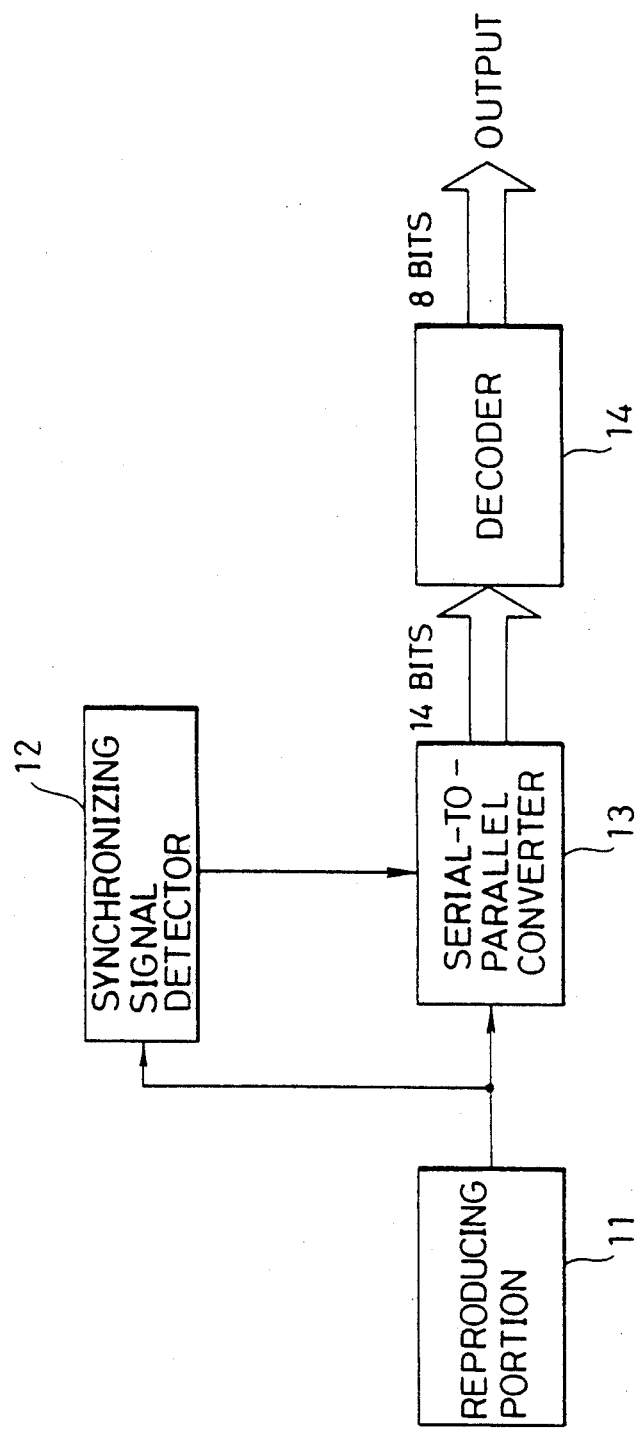
FIG. 2 is a block diagram showing an embodiment of the decoding circuit.

FIG. 2 shows an example of the decoding circuit. In FIG. 2, reference numeral 11 designates a reproducing portion, 12 designates a synchronizing signal detector, 13 denotes a serial-to-parallel converter, and 14 denotes a decoder. The decoding procedure by the decoding circuit will now be described.

The serial modulation code reproduced by the reproducing portion 11 is supplied to the synchronizing signal detector 12 and the serial-to-parallel converter 13. The synchronizing signal detector 12 detects the synchronizing signal inserted at the beginning of the synchronizing block, and supplies it to the parallel-to-serial portion 13. The synchronizing signal is used to synchronize with each 14-bit digital modulation code. The serial-to-parallel converter 13, using the synchronizing signal from the synchronizing signal detector 12, converts the serial 14-bit digital modulation code to a parallel 14-bit digital modulation code, and supplies it to the decoder 14. The decoder 14 decodes the 14-bit digital modulation cod into corresponding 8-bit data by using a ROM.

Next, the 14-bit digital modulation code produced from the encoder 2 in FIG. 1 will be described.

The 14-bit digital modulation code converted from the 8-bit code satisfies the following requirements.

(1) The number of consecutive identical bits in the first 6 bits is equal to or less than 5.

(2) The number of consecutive identical bits included from the second bit to the 13th bit is 2-7.

(3) The number of consecutive identical bits included in the last 7 bits is equal to or less than 6.

(4) The absolute value of CDS of the modulation code is equal to or less than 4.

The end patterns of the modulation codes that satisfy the above requirements (1) to (4) are summed up as the following 12 items (A)-(M).

| | |
|---|---|
| (A) ... ... ... | 110 |
| (B) ... ... ... | 1100 |
| (C) ... ... ... | 11000 |
| (D) ... ... ... | 110000 |
| (E) ... ... ... | 1100000 |
| (F) ... ... ... | 11000000 |
| (G) ... ... ... | 001 |
| (H) ... ... ... | 0011 |
| (J) ... ... ... | 00111 |
| (K) ... ... ... | 001111 |

-continued

| | |
|---|---|
| (L) ... ... ... | 0011111 |
| (M) ... ... ... | 00111111 |

The beginning of the modulation code succeeding to the modulation codes (A)-(M) is one of the following items.

First, the beginning of the modulation code succeeding to the modulation code (A) is one of the following five items (A1)-(A5).

| | |
|---|---|
| (A1) | 011 ... ... ... ... |
| (A2) | 0011 ... ... ... ... |
| (A3) | 00011 ... ... ... |
| (A4) | 000011 ... ... ... |
| (A5) | 0000011 ... ... |

Second, the beginning of the modulation code succeeding to the modulation code (B) is one of the following nine items (B1)-(B9).

| | |
|---|---|
| (B1) | 011 ... ... ... ... |
| (B2) | 0011 ... ... ... ... |
| (B3) | 00011 ... ... ... |
| (B4) | 000011 ... ... ... |
| (B5) | 0000011 ... ... |
| (B6) | 1100 ... ... ... ... |
| (B7) | 11100 ... ... ... |
| (B8) | 111100 ... ... ... |
| (B9) | 1111100 ... ... |

The beginning of the modulation code succeeding to the modulation code (C) is one of the following eight items (C1)-(C8).

| | |
|---|---|
| (C1) | 011 ... ... ... ... |
| (C2) | 0011 ... ... ... ... |
| (C3) | 00011 ... ... ... |
| (C4) | 000011 ... ... ... |
| (C5) | 1100 ... ... ... ... |
| (C6) | 11100 ... ... ... |
| (C7) | 111100 ... ... ... |
| (C8) | 1111100 ... ... |

The beginning of the modulation code succeeding to the modulation code (D) is one of the following seven items (D1)-(D7).

| | |
|---|---|
| (D1) | 011 ... ... ... ... |
| (D2) | 0011 ... ... ... ... |
| (D3) | 00011 ... ... ... |
| (D4) | 1100 ... ... ... ... |
| (D5) | 11100 ... ... ... |
| (D6) | 111100 ... ... ... |
| (D7) | 1111100 ... ... |

The beginning of the modulation code succeeding to the modulation code (E) is one of the following six items (E1)-(E6).

| | |
|---|---|
| (E1) | 011 ... ... ... ... |
| (E2) | 0011 ... ... ... ... |
| (E3) | 1100 ... ... ... ... |
| (E4) | 11100 ... ... ... |
| (E5) | 111100 ... ... ... |
| (E6) | 1111100 ... ... |

The beginning of the modulation code succeeding to the modulation code (F) is one of the following five items (F1)-(F5).

| | |
|---|---|
| (F1) | 011 ... ... ... ... |
| (F2) | 1100 ... ... ... ... |
| (F3) | 11100 ... ... ... |
| (F4) | 111100 ... ... ... |
| (F5) | 1111100 ... ... |

The beginning of the modulation code succeeding to the modulation code (G) is one of the reversal patterns of the modulation codes (A1)-(A5).

The beginning of the modulation code succeeding to the modulation code (H) is one of the reversal patterns of the modulation codes (B1)-(B9).

The beginning of the modulation code succeeding to the modulation code (J) is one of the reversal patterns of the modulation codes (C1)-(C8).

The beginning of the modulation code succeeding to the modulation code (K) is one of the reversal patterns of the modulation code (D1)-(D7).

The beginning of the modulation code succeeding to the modulation code (L) is one of the reversal patterns of the modulation codes (E1)-(E6).

The beginning of the modulation code succeeding to the modulation code (M) is one of the reversal patterns of the modulation codes (F1)-(F5).

The numbers of the modulation codes that satisfy the requirements (1)-(4) are shown in Tables 1 and 2. The code "10000000111111" (CDS=0), and the code "01111111000000" (CDS=0) are excluded from the numbers.

TABLE 1

| Beginning pattern of modulation codes | The number of possible modulation codes | | | | | | | |
|---|---|---|---|---|---|---|---|---|
| | CDS Value | | | | | | CDS | CDS |
| | −4 | −2 | 0 | 2 | 4 | Total | ≦0 | ≧0 |
| 0000011...... | 9 | 8 | 6 | 0 | 0 | 23 | 23 | 6 |
| 000011....... | 12 | 14 | 10 | 6 | 0 | 42 | 36 | 16 |
| 00011......... | 15 | 21 | 20 | 11 | 5 | 72 | 56 | 36 |
| 0011.......... | 17 | 29 | 33 | 26 | 11 | 116 | 79 | 70 |
| 011............ | 17 | 37 | 49 | 47 | 32 | 182 | 103 | 128 |
| Total | 70 | 109 | 118 | 90 | 48 | 435 | 297 | 256 |

TABLE 2

| Beginning pattern of modulation codes | The number of possible modulation codes | | | | | | | |
|---|---|---|---|---|---|---|---|---|
| | CDS Value | | | | | | CDS | CDS |
| | −4 | −2 | 0 | 2 | 4 | Total | ≦0 | ≧0 |
| 1111100 ... | 0 | 0 | 6 | 8 | 9 | 23 | 6 | 23 |
| 111100 ... | 0 | 6 | 10 | 14 | 12 | 42 | 16 | 36 |
| 11100 ... | 5 | 11 | 20 | 21 | 15 | 72 | 36 | 56 |
| 1100 ... | 11 | 26 | 33 | 29 | 17 | 116 | 70 | 79 |
| 100 ... | 32 | 47 | 49 | 37 | 17 | 182 | 128 | 103 |
| Total | 48 | 90 | 118 | 109 | 70 | 435 | 256 | 297 |

More than 256 modulation codes whose CDS≧0, and more than 256 modulation codes whose CDS≦0 are necessary, which follow one of the modulation codes (A)-(M). In addition, the converted modulation code must correspond to one 8-bit data to avoid transmission error.

The number of modulation codes that can succeed one of the modulation codes (A)-(M) is shown in Table 3.

For example, the CDS of the modulation codes that terminate with ". . . 00111111" is "2" or "4". Accordingly, the end DSV of the modulation code takes a value of "0" or "2", and so the succeeding modulation code must satisfy the requirements that its CDS≦0, and it must begin with any one of the bit train "0000011", "000011", "00011", "0011", and "100". The number of the modulation codes that satisfy the requirements are 322 as shown in Table 3, which is greater than the necessary number of 256.

Likewise, the CDS of the modulation codes that terminate with ". . . 11000000" is "−2" or "4". Accordingly, the end DSV of the modulation code takes a value of "0" or "−2", and so the succeeding modulation code must satisfy the requirements that its CDS≧0, and it must begin with any one of the bit train "1111100", "111100", "11100", "1100", and "011". The number of the modulation codes that satisfy the requirements are 322 as shown in Table 3, which is greater than the necessary number of 256.

TABLE 3

| End pattern of modulation codes | The number of possible successive modulation codes | | | | | | | |
|---|---|---|---|---|---|---|---|---|
| | CDS Value | | | | | | | |
| | −4 | −2 | 0 | 2 | 4 | Total | CDS ≦0 | CDS ≧0 |
| . . . 110 | 70 | 109 | 118 | 90 | 48 | 435 | 297 | 256 |
| . . . 1100 | 86 | 152 | 187 | 162 | 101 | 688 | 425 | 450 |
| . . . 11000 | 71 | 144 | 181 | 162 | 101 | 665 | 402 | 444 |
| . . . 110000 | 65 | 130 | 171 | 156 | 101 | 623 | 366 | 428 |
| . . . 1100000 | 50 | 109 | 151 | 145 | 96 | 551 | 310 | 392 |
| . . . 11000000 | 33 | 80 | 118 | 119 | 85 | 435 | 231 | 322 |
| . . . 001 | 48 | 90 | 118 | 109 | 70 | 435 | 256 | 297 |
| . . . 0011 | 101 | 162 | 187 | 152 | 86 | 688 | 450 | 425 |
| . . . 00111 | 101 | 162 | 181 | 144 | 77 | 665 | 444 | 402 |
| . . . 001111 | 101 | 156 | 171 | 130 | 65 | 623 | 428 | 366 |
| . . . 0011111 | 96 | 145 | 156 | 109 | 50 | 550 | 392 | 310 |
| . . . 00111111 | 85 | 119 | 118 | 80 | 33 | 435 | 322 | 231 |

FIG. 4 shows the number of modulation codes of respective classes when CDS≧0, and FIG. 5 shows the number of modulation code of respective classes when CDS≦0.

Tables 4 and 5 show the correspondence between the 8-bit data and the modulation codes: Table 4 shows the correspondence when CDS≧0; and Table 5 shows the correspondence when CDS≧0.

TABLE 4

| | | | (CDS ≧ 0) | | | |
|---|---|---|---|---|---|---|
| Class | 8-bit data | Modulation codes beginning with "0" | CDS | Class | 8-bit data | Modulation codes beginning with "1" | CDS |
| 1(A) | 0 | 01111110000001 | 0 | 1(B) | 0 | 10000001111110 | 0 |
| | 1 | 01111100110000 | 0 | | 1 | 10000011001111 | 0 |
| | 2 | 01111100011000 | 0 | | 2 | 10000011100111 | 0 |
| | 3 | 01111100001100 | 0 | | 3 | 10000011110011 | 0 |
| | 4 | 01111100000110 | 0 | | 4 | 10000011111001 | 0 |
| | 5 | 01111100000011 | 0 | | 5 | 10000011111100 | 0 |
| | 6 | 01111001110000 | 0 | | 6 | 10000110001111 | 0 |
| | 7 | 01111001100001 | 0 | | 7 | 10000110011110 | 0 |
| | 8 | 01111000111000 | 0 | | 8 | 10000111000111 | 0 |
| | 9 | 01111000110001 | 0 | | 9 | 10000111001110 | 0 |
| | 10 | 01111000011100 | 0 | | 10 | 10000111100011 | 0 |
| | 11 | 01111000011001 | 0 | | 11 | 10000111100110 | 0 |
| | 12 | 01111000001110 | 0 | | 12 | 10000111110001 | 0 |
| | 13 | 01111000000111 | 0 | | 13 | 10000111111000 | 0 |
| | 14 | 01110011110000 | 0 | | 14 | 10001100001111 | 0 |
| | 15 | 01110011100001 | 0 | | 15 | 10001100011110 | 0 |
| | 16 | 01110011001100 | 0 | | 16 | 10001100110011 | 0 |
| | 17 | 01110011000110 | 0 | | 17 | 10001100111001 | 0 |
| | 18 | 01110011000011 | 0 | | 18 | 10001100111100 | 0 |
| | 19 | 01110001111000 | 0 | | 19 | 10001110000111 | 0 |
| | 20 | 01110001110001 | 0 | | 20 | 10001110001110 | 0 |
| | 21 | 01110001100110 | 0 | | 21 | 10001110011001 | 0 |
| | 22 | 01110001100011 | 0 | | 22 | 10001110011100 | 0 |
| | 23 | 01110000111100 | 0 | | 23 | 10001111000011 | 0 |
| | 24 | 01110000111001 | 0 | | 24 | 10001111000110 | 0 |
| | 25 | 01110000110011 | 0 | | 25 | 10001111001100 | 0 |
| | 26 | 01110000011110 | 0 | | 26 | 10001111100001 | 0 |
| | 27 | 01110000001111 | 0 | | 27 | 10001111110000 | 0 |
| | 28 | 01100111110000 | 0 | | 28 | 10011000001111 | 0 |
| | 29 | 01100111100001 | 0 | | 29 | 10011000011110 | 0 |
| | 30 | 01100111001100 | 0 | | 30 | 10011000110011 | 0 |
| | 31 | 01100111000110 | 0 | | 31 | 10011000111001 | 0 |
| | 32 | 01100111000011 | 0 | | 32 | 10011000111100 | 0 |
| | 33 | 01100110011100 | 0 | | 33 | 10011001100011 | 0 |
| | 34 | 01100110011001 | 0 | | 34 | 10011001100110 | 0 |
| | 35 | 01100110001110 | 0 | | 35 | 10011001110001 | 0 |
| | 36 | 01100110000111 | 0 | | 36 | 10011001111000 | 0 |
| | 37 | 01100011111000 | 0 | | 37 | 10011100000111 | 0 |
| | 38 | 01100011110001 | 0 | | 38 | 10011100001110 | 0 |
| | 39 | 01100011100110 | 0 | | 39 | 10011100011001 | 0 |
| | 40 | 01100011100011 | 0 | | 40 | 10011100011100 | 0 |
| | 41 | 01100011001110 | 0 | | 41 | 10011100110001 | 0 |
| | 42 | 01100011000111 | 0 | | 42 | 10011100111000 | 0 |
| | 43 | 01100001111100 | 0 | | 43 | 10011110000011 | 0 |
| | 44 | 01100001111001 | 0 | | 44 | 10011110000110 | 0 |
| | 45 | 01100001110011 | 0 | | 45 | 10011110001100 | 0 |
| | 46 | 01100001100111 | 0 | | 46 | 10011110011000 | 0 |

TABLE 4-continued

(CDS ≧ 0)

| Class | 8-bit data | Modulation codes beginning with "0" | CDS | Class | 8-bit data | Modulation codes beginning with "1" | CDS |
|---|---|---|---|---|---|---|---|
| | 47 | 01100000111110 | 0 | | 47 | 10011111000001 | 0 |
| | 48 | 011000001111111 | 0 | | 48 | 10011111100000 | 0 |
| | 49 | 01111111001100 | 4 | | 49 | 10000011111110 | 2 |
| | 50 | 01111111000110 | 4 | | 50 | 10000110011111 | 2 |
| | 51 | 01111111000011 | 4 | | 51 | 10000110001111 | 2 |
| | 52 | 01111110011100 | 4 | | 52 | 10000111100111 | 2 |
| | 53 | 01111110011001 | 4 | | 53 | 10000111110011 | 2 |
| | 54 | 01111110001110 | 4 | | 54 | 10000111111001 | 2 |
| | 55 | 01111110000111 | 4 | | 55 | 10000111111100 | 2 |
| | 56 | 01111100111100 | 4 | | 56 | 10001100011111 | 2 |
| | 57 | 01111100111001 | 4 | | 57 | 10001100111110 | 2 |
| | 58 | 01111100110011 | 4 | | 58 | 10001110001111 | 2 |
| | 59 | 01111100011110 | 4 | | 59 | 10001110011110 | 2 |
| | 60 | 01111100001111 | 4 | | 60 | 10001111000111 | 2 |
| | 61 | 01111001111100 | 4 | | 61 | 10001111001110 | 2 |
| | 62 | 01111001111001 | 4 | | 62 | 10001111100011 | 2 |
| | 63 | 01111001110011 | 4 | | 63 | 10001111100110 | 2 |
| | 64 | 01111001100111 | 4 | | 64 | 10001111110001 | 2 |
| | 65 | 01111000111110 | 4 | | 65 | 10001111111000 | 2 |
| | 66 | 01111000011111 | 4 | | 66 | 10011000011111 | 2 |
| | 67 | 01110011111100 | 4 | | 67 | 10011000111110 | 2 |
| | 68 | 01110011111001 | 4 | | 68 | 10011001100111 | 2 |
| | 69 | 01110011110011 | 4 | | 69 | 10011001110011 | 2 |
| | 70 | 01110011100111 | 4 | | 70 | 10011001111001 | 2 |
| | 71 | 01110001001111 | 4 | | 71 | 10011001111100 | 2 |
| | 72 | 01110001111110 | 4 | | 72 | 10011100001111 | 2 |
| | 73 | 01110000111111 | 4 | | 73 | 10011100001110 | 2 |
| | 74 | 01100111111100 | 4 | | 74 | 10011100110011 | 2 |
| | 75 | 01100111111001 | 4 | | 75 | 10011100111001 | 2 |
| | 76 | 01100111110011 | 4 | | 76 | 10011100111100 | 2 |
| | 77 | 01100111100111 | 4 | | 77 | 10011110000111 | 2 |
| | 78 | 01100111001111 | 4 | | 78 | 10011110001110 | 2 |
| | 79 | 01100110011111 | 4 | | 79 | 10011110011001 | 2 |
| | 80 | 01100011111110 | 4 | | 80 | 10011110011100 | 2 |
| | 81 | 01111111000001 | 2 | | 81 | 10011111000011 | 2 |
| | 82 | 01111110011000 | 2 | | 82 | 10011111000110 | 2 |
| | 83 | 01111110001100 | 2 | | 83 | 10011111001100 | 2 |
| | 84 | 01111110000110 | 2 | | 84 | 10011111100001 | 2 |
| | 85 | 01111110000011 | 2 | | 85 | 10011111110000 | 2 |
| | 86 | 01111100111000 | 2 | | 86 | 10001111001111 | 4 |
| | 87 | 01111100110001 | 2 | | 87 | 10001111100111 | 4 |
| | 88 | 01111100011100 | 2 | | 88 | 10001111110011 | 4 |
| | 89 | 01111100011001 | 2 | | 89 | 10011001111110 | 4 |
| | 90 | 01111100001110 | 2 | | 90 | 10011100111110 | 4 |
| | 91 | 01111100000111 | 2 | | 91 | 10011110001111 | 4 |
| | 92 | 01111001111000 | 2 | | 92 | 10011110011110 | 4 |
| | 93 | 01111001110001 | 2 | | 93 | 10011111000111 | 4 |
| | 94 | 01111001100110 | 2 | | 94 | 10011111001110 | 4 |
| | 95 | 01111001100011 | 2 | | 95 | 10011111100011 | 4 |
| | 96 | 01111000111100 | 2 | | 96 | 10011111100110 | 4 |
| | 97 | 01111000111001 | 2 | 2(B) 97 | 11000111100111 | 4 |
| | 98 | 01111000110011 | 2 | | 98 | 11000111110011 | 4 |
| | 99 | 01111000011110 | 2 | | 99 | 11000000111111 | 2 |
| | 100 | 01111000001111 | 2 | | 100 | 11000001111110 | 2 |
| | 101 | 01110011111000 | 2 | | 101 | 11000011001111 | 2 |
| | 102 | 01110011110001 | 2 | | 102 | 11000011100111 | 2 |
| | 103 | 01110011100110 | 2 | | 103 | 11000011110011 | 2 |
| | 104 | 01110011100011 | 2 | | 104 | 11000011111001 | 2 |
| | 105 | 01110011001110 | 2 | | 105 | 11000011111100 | 2 |
| | 106 | 01110011000111 | 2 | | 106 | 11000110001111 | 2 |
| | 107 | 01110001111100 | 2 | | 107 | 11000110011110 | 2 |
| | 108 | 01110001111001 | 2 | | 108 | 11000110000111 | 2 |
| | 109 | 01110001110011 | 2 | | 109 | 11000110001110 | 2 |
| | 110 | 01110001100111 | 2 | | 110 | 11000111100011 | 2 |
| | 111 | 01110000111110 | 2 | | 111 | 11000111100110 | 2 |
| | 112 | 01110000011111 | 2 | | 112 | 11000111110001 | 2 |
| | 113 | 01100111111000 | 2 | | 113 | 11000111111000 | 2 |
| | 114 | 01100111110001 | 2 | | 114 | 11001100001111 | 2 |
| | 115 | 01100111100110 | 2 | | 115 | 11001100011110 | 2 |
| | 116 | 01100111100011 | 2 | | 116 | 11001100110011 | 2 |
| | 117 | 01100111001110 | 2 | | 117 | 11001100111001 | 2 |
| | 118 | 01100111000111 | 2 | | 118 | 11001100111100 | 2 |
| | 119 | 01100110011110 | 2 | | 119 | 11001110000111 | 2 |
| | 120 | 01100110001111 | 2 | | 120 | 11001110001110 | 2 |
| | 121 | 01100011111100 | 2 | | 121 | 11001110011001 | 2 |
| | 122 | 01100011111001 | 2 | | 122 | 11001110011100 | 2 |
| | 123 | 01100011110011 | 2 | | 123 | 11001111000011 | 2 |
| | 124 | 01100011100111 | 2 | | 124 | 11001111000110 | 2 |
| | 125 | 01100011001111 | 2 | | 125 | 11001111001100 | 2 |

TABLE 4-continued

| | | | (CDS ≧ 0) | | | | |
|---|---|---|---|---|---|---|---|
| Class | 8-bit data | Modulation codes beginning with "0" | CDS | Class | 8-bit data | Modulation codes beginning with "1" | CDS |
| | 126 | 01100001111110 | 2 | | 126 | 11001111100001 | 2 |
| | 127 | 01100000111111 | 2 | | 127 | 11001111110000 | 2 |
| 2(A) | 128 | 00111111100000 | 0 | | 128 | 11000000011111 | 0 |
| | 129 | 00111111000001 | 0 | | 129 | 11000000111110 | 0 |
| | 130 | 00111110011000 | 0 | | 130 | 11000001100111 | 0 |
| | 131 | 00111110001100 | 0 | | 131 | 11000001110011 | 0 |
| | 132 | 00111110000110 | 0 | | 132 | 11000001111001 | 0 |
| | 133 | 00111110000011 | 0 | | 133 | 11000001111100 | 0 |
| | 134 | 00111100111000 | 0 | | 134 | 11000011000111 | 0 |
| | 135 | 00111100110001 | 0 | | 135 | 11000011001110 | 0 |
| | 136 | 00111100011100 | 0 | | 136 | 11000011100011 | 0 |
| | 137 | 00111100011001 | 0 | | 137 | 11000011100110 | 0 |
| | 138 | 00111100001110 | 0 | | 138 | 11000011110001 | 0 |
| | 139 | 00111100000111 | 0 | | 139 | 11000011111000 | 0 |
| | 140 | 00111001111000 | 0 | | 140 | 11000110000111 | 0 |
| | 141 | 00111001110001 | 0 | | 141 | 11000110001110 | 0 |
| | 142 | 00111001100110 | 0 | | 142 | 11000110011001 | 0 |
| | 143 | 00111001100011 | 0 | | 143 | 11000110011100 | 0 |
| | 144 | 00111000111100 | 0 | | 144 | 11000111000011 | 0 |
| | 145 | 00111000111001 | 0 | | 145 | 11000111000110 | 0 |
| | 146 | 00111000100011 | 0 | | 146 | 11000111001100 | 0 |
| | 147 | 00111000011110 | 0 | | 147 | 11000111100001 | 0 |
| | 148 | 00111000001111 | 0 | | 148 | 11000111110000 | 0 |
| | 149 | 00110011111000 | 0 | | 149 | 11001100000111 | 0 |
| | 150 | 00110011110001 | 0 | | 150 | 11001100001110 | 0 |
| | 151 | 00110011100110 | 0 | | 151 | 11001100011001 | 0 |
| | 152 | 00110011100011 | 0 | | 152 | 11001100011100 | 0 |
| | 153 | 00110011001110 | 0 | | 153 | 11001100110001 | 0 |
| | 154 | 00110011000111 | 0 | | 154 | 11001100111000 | 0 |
| | 155 | 00110001111100 | 0 | | 155 | 11001110000011 | 0 |
| | 156 | 00110001111001 | 0 | | 156 | 11001110000110 | 0 |
| | 157 | 00110001110011 | 0 | | 157 | 11001110001100 | 0 |
| | 158 | 00110001100111 | 0 | | 158 | 11001110011000 | 0 |
| | 159 | 00110000111110 | 0 | | 159 | 11001111000001 | 0 |
| | 160 | 00110000011111 | 0 | | 160 | 11001111100000 | 0 |
| | 161 | 00111111100001 | 2 | | 161 | 11001100111110 | 4 |
| | 162 | 00111111001100 | 2 | | 162 | 11001110011110 | 4 |
| | 163 | 00111111000110 | 2 | | 163 | 11001111000111 | 4 |
| | 164 | 00111111000011 | 2 | | 164 | 11001111001110 | 4 |
| | 165 | 00111110011100 | 2 | | 165 | 11001111110011 | 4 |
| | 166 | 00111110011001 | 2 | | 166 | 11001111100110 | 4 |
| | 167 | 00111110001110 | 2 | 3(B) | 167 | 11100001111110 | 4 |
| | 168 | 00111110000111 | 2 | | 168 | 11100011100111 | 4 |
| | 169 | 00111100111100 | 2 | | 169 | 11100011110011 | 4 |
| | 170 | 00111100111001 | 2 | | 170 | 11100011111100 | 4 |
| | 171 | 00111100110011 | 2 | | 171 | 11100110011110 | 4 |
| | 172 | 00111100011110 | 2 | | 172 | 11100111000111 | 4 |
| | 173 | 00111100001111 | 2 | | 173 | 11100111001110 | 4 |
| | 174 | 00111001111100 | 2 | | 174 | 11100111100011 | 4 |
| | 175 | 00111001111001 | 2 | | 175 | 11100111100110 | 4 |
| | 176 | 00111001110011 | 2 | | 176 | 11100111111000 | 4 |
| | 177 | 00111001100111 | 2 | | 177 | 11100000011111 | 2 |
| | 178 | 00111000111110 | 2 | | 178 | 11100000111110 | 2 |
| | 179 | 00111000011111 | 2 | | 179 | 11100001100111 | 2 |
| | 180 | 00110011111100 | 2 | | 180 | 11100001100011 | 2 |
| | 181 | 00110011111001 | 2 | | 181 | 11100001111001 | 2 |
| | 182 | 00110011110011 | 2 | | 182 | 11100001111100 | 2 |
| | 183 | 00110011100111 | 2 | | 183 | 11100011000111 | 2 |
| | 184 | 00110011001111 | 2 | | 184 | 11100011001110 | 2 |
| | 185 | 00110001111110 | 2 | | 185 | 11100011100011 | 2 |
| | 186 | 00110000111111 | 2 | | 186 | 11100011100110 | 2 |
| | 187 | 00111111100110 | 4 | | 187 | 11100011110001 | 2 |
| | 188 | 00111111100011 | 4 | | 188 | 11100011111000 | 2 |
| | 189 | 00111111001110 | 4 | | 189 | 11100110000111 | 2 |
| | 190 | 00111111000111 | 4 | | 190 | 11100110001110 | 2 |
| | 191 | 00111110011110 | 4 | | 191 | 11100110001001 | 2 |
| | 192 | 00111110001111 | 4 | | 192 | 11100110011100 | 2 |
| | 193 | 00111100111110 | 4 | | 193 | 11100111000011 | 2 |
| | 194 | 00111100011111 | 4 | | 194 | 11100111000110 | 2 |
| | 195 | 00111001111110 | 4 | | 195 | 11100111001100 | 2 |
| | 196 | 00111000111111 | 4 | | 196 | 11100111100001 | 2 |
| | 197 | 00110011111110 | 4 | | 197 | 11100111110000 | 2 |
| 3(A) | 198 | 00011111110000 | 0 | | 198 | 11100000001111 | 0 |
| | 199 | 00011111100001 | 0 | | 199 | 11100000011110 | 0 |
| | 200 | 00011111001100 | 0 | | 200 | 11100000110011 | 0 |
| | 201 | 00011111000110 | 0 | | 201 | 11100000111001 | 0 |
| | 202 | 00011111000011 | 0 | | 202 | 11100000111100 | 0 |
| | 203 | 00011110011100 | 0 | | 203 | 11100001100011 | 0 |
| | 204 | 00011110011001 | 0 | | 204ª | 11100001100110 | 0 |

TABLE 4-continued

| | | | (CDS ≧ 0) | | | | |
|---|---|---|---|---|---|---|---|
| Class | 8-bit data | Modulation codes beginning with "0" | CDS | Class | 8-bit data | Modulation codes beginning with "1" | CDS |
| | 205 | 0001111001110 | 0 | | 205 | 1110001110001 | 0 |
| | 206 | 0001110000111 | 0 | | 206 | 1110001111000 | 0 |
| | 207 | 0001100111100 | 0 | | 207 | 1110011000011 | 0 |
| | 208 | 0001100111001 | 0 | | 208 | 1110011000110 | 0 |
| | 209 | 0001100110011 | 0 | | 209 | 1110011001100 | 0 |
| | 210 | 0001100011110 | 0 | | 210 | 1110011100001 | 0 |
| | 211 | 0001100001111 | 0 | | 211 | 1110011110000 | 0 |
| | 212 | 0001001111100 | 0 | | 212 | 1100110000011 | 0 |
| | 213 | 0001001111001 | 0 | | 213 | 1100110000110 | 0 |
| | 214 | 0001001110011 | 0 | | 214 | 1100110001100 | 0 |
| | 215 | 0001001100111 | 0 | | 215 | 1100110011000 | 0 |
| | 216 | 0001000111110 | 0 | | 216 | 1100111000001 | 0 |
| | 217 | 0001000011111 | 0 | | 217 | 1100111100000 | 0 |
| | 218 | 0001111110001 | 2 | 4(B) | 218 | 1110001111100 | 4 |
| | 219 | 0001111100110 | 2 | | 219 | 1110011111000 | 4 |
| | 220 | 0001111100011 | 2 | | 220 | 1110000001111 | 2 |
| | 221 | 0001111001110 | 2 | | 221 | 1110000011110 | 2 |
| | 222 | 0001111000111 | 2 | | 222 | 1110000110011 | 2 |
| | 223 | 0001110011110 | 2 | | 223 | 1110000111001 | 2 |
| | 224 | 0001110001111 | 2 | | 224 | 1110000111100 | 2 |
| | 225 | 0001100111110 | 2 | | 225 | 1110001100011 | 2 |
| | 226 | 0001100011111 | 2 | | 226 | 1110001100110 | 2 |
| | 227 | 0001001111110 | 2 | | 227 | 1110001110001 | 2 |
| | 228 | 0001000111111 | 2 | | 228 | 1110001111000 | 2 |
| | 229 | 0001111110011 | 4 | | 229 | 1110011000011 | 2 |
| | 230 | 0001111100111 | 4 | | 230 | 1110011000110 | 2 |
| | 231 | 0001111001111 | 4 | | 231 | 1110011001100 | 2 |
| | 232 | 0001110011111 | 4 | | 232 | 1110011100001 | 2 |
| | 233 | 0001100111111 | 4 | | 233 | 1110011110000 | 2 |
| 4(A) | 234 | 0000111111000 | 0 | | 234 | 1110000000111 | 0 |
| | 235 | 0000111110001 | 0 | | 235 | 1110000001110 | 0 |
| | 236 | 0000111100110 | 0 | | 236 | 1110000011001 | 0 |
| | 237 | 0000111100011 | 0 | | 237 | 1110000011100 | 0 |
| | 238 | 0000111001110 | 0 | | 238 | 1110000110001 | 0 |
| | 239 | 0000111000111 | 0 | | 239 | 1110000111000 | 0 |
| | 240 | 0000110011110 | 0 | | 240 | 1110001100001 | 0 |
| | 241 | 0000110001111 | 0 | | 241 | 1110001110000 | 0 |
| | 242 | 0000100111110 | 0 | | 242 | 1110011000001 | 0 |
| | 243 | 0000100011111 | 0 | | 243 | 1110011100000 | 0 |
| | 244 | 0000111111001 | 2 | 5(B) | 244 | 1111100000111 | 2 |
| | 245 | 0000111110011 | 2 | | 245 | 1111100001110 | 2 |
| | 246 | 0000111100111 | 2 | | 246 | 1111100011001 | 2 |
| | 247 | 0000111001111 | 2 | | 247 | 1111100011100 | 2 |
| | 248 | 0000110011111 | 2 | | 248 | 1111100111000 | 2 |
| | 249 | 0000100111111 | 2 | | 249 | 1111100111000 | 2 |
| 5(A) | 250 | 0000011111100 | 0 | | 250 | 1111100000011 | 0 |
| | 251 | 0000011111001 | 0 | | 251 | 1111100000110 | 0 |
| | 252 | 0000011110011 | 0 | | 252 | 1111100001100 | 0 |
| | 253 | 0000011100111 | 0 | | 253 | 1111100011000 | 0 |
| | 254 | 0000011001111 | 0 | | 254 | 1111100110000 | 0 |
| | 255 | 0000011001111 | 0 | | 255 | 1111100110000 | 0 |

TABLE 5

| | | | (CDS ≦ 0) | | | | |
|---|---|---|---|---|---|---|---|
| Class | 8-bit data | Modulation codes beginning with "0" | CDS | Class | 8-bit data | Modulation codes beginning with "1" | CDS |
| 1(C) | 0 | 0111110000001 | 0 | 1(D) | 0 | 1000001111110 | 0 |
| | 1 | 0111110011000 | 0 | | 1 | 1000011001111 | 0 |
| | 2 | 0111110001100 | 0 | | 2 | 1000011100111 | 0 |
| | 3 | 0111110001100 | 0 | | 3 | 1000011110011 | 0 |
| | 4 | 0111110000110 | 0 | | 4 | 1000011111001 | 0 |
| | 5 | 0111110000011 | 0 | | 5 | 1000011111100 | 0 |
| | 6 | 0111100110000 | 0 | | 6 | 1000011000111 | 0 |
| | 7 | 0111100100001 | 0 | | 7 | 1000011001110 | 0 |
| | 8 | 0111100011000 | 0 | | 8 | 1000011100111 | 0 |
| | 9 | 0111100010001 | 0 | | 9 | 1000011001110 | 0 |
| | 10 | 0111100001100 | 0 | | 10 | 1000011110011 | 0 |
| | 11 | 0111100001001 | 0 | | 11 | 1000011110011 | 0 |
| | 12 | 0111100001110 | 0 | | 12 | 1000011110001 | 0 |
| | 13 | 0111100000111 | 0 | | 13 | 1000011111000 | 0 |
| | 14 | 0111001110000 | 0 | | 14 | 1000110000111 | 0 |
| | 15 | 0111001100001 | 0 | | 15 | 1000110001110 | 0 |
| | 16 | 0111001100100 | 0 | | 16 | 1000110011001 | 0 |
| | 17 | 0111001100110 | 0 | | 17 | 1000110011001 | 0 |
| | 18 | 0111001100011 | 0 | | 18 | 1000110011100 | 0 |
| | 19 | 0111001111000 | 0 | | 19 | 1000111000111 | 0 |

TABLE 5-continued (CDS ≦ 0)

| Class | 8-bit data | Modulation codes beginning with "0" | CDS | Class | 8-bit data | Modulation codes beginning with "1" | CDS |
|---|---|---|---|---|---|---|---|
| | 20 | 011100011110001 | 0 | 20 | 10001110001110 | 0 |
| | 21 | 01110001100110 | 0 | 21 | 10001110011001 | 0 |
| | 22 | 01110001100011 | 0 | 22 | 10001110011100 | 0 |
| | 23 | 01110000111100 | 0 | 23 | 10001111000011 | 0 |
| | 24 | 01110000111001 | 0 | 24 | 10001111000110 | 0 |
| | 25 | 01110000110011 | 0 | 25 | 10001111001100 | 0 |
| | 26 | 01110000011110 | 0 | 26 | 10001111100001 | 0 |
| | 27 | 01110000001111 | 0 | 27 | 10001111110000 | 0 |
| | 28 | 01100111110000 | 0 | 28 | 10011000001111 | 0 |
| | 29 | 01100111100001 | 0 | 29 | 10011000011110 | 0 |
| | 30 | 01100111001100 | 0 | 30 | 10011000110011 | 0 |
| | 31 | 01100111000110 | 0 | 31 | 10011000111001 | 0 |
| | 32 | 01100111000011 | 0 | 32 | 10011000111100 | 0 |
| | 33 | 01100110011100 | 0 | 33 | 10011001100011 | 0 |
| | 34 | 01100110011001 | 0 | 34 | 10011001100110 | 0 |
| | 35 | 01100110001110 | 0 | 35 | 10011001110001 | 0 |
| | 36 | 01100110000111 | 0 | 36 | 10011001111000 | 0 |
| | 37 | 01100011111000 | 0 | 37 | 10011100000111 | 0 |
| | 38 | 01100011110001 | 0 | 38 | 10011100001110 | 0 |
| | 39 | 01100011100110 | 0 | 39 | 10011100011001 | 0 |
| | 40 | 01100011100011 | 0 | 40 | 10011100011100 | 0 |
| | 41 | 01100011001110 | 0 | 41 | 10011100110001 | 0 |
| | 42 | 01100011000111 | 0 | 42 | 10011100111000 | 0 |
| | 43 | 01100001111100 | 0 | 43 | 10011110000011 | 0 |
| | 44 | 01100001111001 | 0 | 44 | 10011110000110 | 0 |
| | 45 | 01100001110011 | 0 | 45 | 10011110001100 | 0 |
| | 46 | 01100001100111 | 0 | 46 | 10011110011000 | 0 |
| | 47 | 01100000111110 | 0 | 47 | 10011111000001 | 0 |
| | 48 | 01100000011111 | 0 | 48 | 10011111100000 | 0 |
| | 49 | 01111100000001 | −2 | 49 | 10000000110011 | −4 |
| | 50 | 01111001100000 | −2 | 50 | 10000000111001 | −4 |
| | 51 | 01111000110000 | −2 | 51 | 10000000111100 | −4 |
| | 52 | 01111000011000 | −2 | 52 | 10000001100011 | −4 |
| | 53 | 01111000001100 | −2 | 53 | 10000001100110 | −4 |
| | 54 | 01111000000110 | −2 | 54 | 10000001110001 | −4 |
| | 55 | 01111000000011 | −2 | 55 | 10000001111000 | −4 |
| | 56 | 01110011100000 | −2 | 56 | 10000011000011 | −4 |
| | 57 | 01110011000001 | −2 | 57 | 10000011000110 | −4 |
| | 58 | 01110001110000 | −2 | 58 | 10000011001100 | −4 |
| | 59 | 01110001100001 | −2 | 59 | 10000011100001 | −4 |
| | 60 | 01110000111000 | −2 | 60 | 10000011110000 | −4 |
| | 61 | 01110000110001 | −2 | 61 | 10000110000011 | −4 |
| | 62 | 01110000011100 | −2 | 62 | 10000110000110 | −4 |
| | 63 | 01110000011001 | −2 | 63 | 10000110001100 | −4 |
| | 64 | 01110000001110 | −2 | 64 | 10000110011000 | −4 |
| | 65 | 01110000000111 | −2 | 65 | 10000111000001 | −4 |
| | 66 | 01100111100000 | −2 | 66 | 10000111100000 | −4 |
| | 67 | 01100111000001 | −2 | 67 | 10001100000011 | −4 |
| | 68 | 01100110011000 | −2 | 68 | 10001100000110 | −4 |
| | 69 | 01100110001100 | −2 | 69 | 10001100001100 | −4 |
| | 70 | 01100110000110 | −2 | 70 | 10001100011000 | −4 |
| | 71 | 01100110000011 | −2 | 71 | 10001100110000 | −4 |
| | 72 | 01100011110000 | −2 | 72 | 10001110000001 | −4 |
| | 73 | 01100011100001 | −2 | 73 | 10001111000000 | −4 |
| | 74 | 01100011001100 | −2 | 74 | 10011000000011 | −4 |
| | 75 | 01100011000110 | −2 | 75 | 10011000000110 | −4 |
| | 76 | 01100011000011 | −2 | 76 | 10011000001100 | −4 |
| | 77 | 01100001111000 | −2 | 77 | 10011000011000 | −4 |
| | 78 | 01100001110001 | −2 | 78 | 10011000110000 | −4 |
| | 79 | 01100001100110 | −2 | 79 | 10011001100000 | −4 |
| | 80 | 01100001100011 | −2 | 80 | 10011100000001 | −4 |
| | 81 | 01100000111100 | −2 | 81 | 10000000111110 | −2 |
| | 82 | 01100000111001 | −2 | 82 | 10000001100111 | −2 |
| | 83 | 01100000110011 | −2 | 83 | 10000001110011 | −2 |
| | 84 | 01100000011110 | −2 | 84 | 10000001111001 | −2 |
| | 85 | 01100000001111 | −2 | 85 | 10000001111100 | −2 |
| | 86 | 01110001100000 | −4 | 86 | 10000011000111 | −2 |
| | 87 | 01110000110000 | −4 | 87 | 10000011001110 | −2 |
| | 88 | 01110000001100 | −4 | 88 | 10000011100011 | −2 |
| | 89 | 01100110000001 | −4 | 89 | 10000011100110 | −2 |
| | 90 | 01100011000001 | −4 | 90 | 10000011110001 | −2 |
| | 91 | 01100001110000 | −4 | 91 | 10000011111000 | −2 |
| | 92 | 01100001100001 | −4 | 92 | 10000110000111 | −2 |
| | 93 | 01100000111000 | −4 | 93 | 10000110001110 | −2 |
| | 94 | 01100000110001 | −4 | 94 | 10000110011001 | −2 |
| | 95 | 01100000011100 | −4 | 95 | 10000110011100 | −2 |
| | 96 | 01100000011001 | −4 | 96 | 10000111000011 | −2 |
| 2(C) | 97 | 00111000011000 | −4 | 97 | 10000111000110 | −2 |
| | 98 | 00111000001100 | −4 | 98 | 10000111001100 | −2 |

TABLE 5-continued (CDS ≦ 0)

| Class | 8-bit data | Modulation codes beginning with "0" | CDS | Class | 8-bit data | Modulation codes beginning with "1" | CDS |
|---|---|---|---|---|---|---|---|
| | 99 | 00111111000000 | −2 | | 99 | 10000111100001 | −2 |
| | 100 | 00111110000001 | −2 | | 100 | 10000111110000 | −2 |
| | 101 | 00111100110000 | −2 | | 101 | 10001100000111 | −2 |
| | 102 | 00111100011000 | −2 | | 102 | 10001100001110 | −2 |
| | 103 | 00111100001100 | −2 | | 103 | 10001100011001 | −2 |
| | 104 | 00111100000110 | −2 | | 104 | 10001100011100 | −2 |
| | 105 | 00111100000011 | −2 | | 105 | 10001100110001 | −2 |
| | 106 | 00111001110000 | −2 | | 106 | 10001100111000 | −2 |
| | 107 | 00111001100001 | −2 | | 107 | 10001110000011 | −2 |
| | 108 | 00111000111000 | −2 | | 108 | 10001110000110 | −2 |
| | 109 | 00111000110001 | −2 | | 109 | 10001110001100 | −2 |
| | 110 | 00111000011100 | −2 | | 110 | 10001110011000 | −2 |
| | 111 | 00111000011001 | −2 | | 111 | 10001111000001 | −2 |
| | 112 | 00111000001110 | −2 | | 112 | 10001111100000 | −2 |
| | 113 | 00111000000111 | −2 | | 113 | 10011000000111 | −2 |
| | 114 | 00110011110000 | −2 | | 114 | 10011000001110 | −2 |
| | 115 | 00110011100001 | −2 | | 115 | 10011000011001 | −2 |
| | 116 | 00110011001100 | −2 | | 116 | 10011000011100 | −2 |
| | 117 | 00110011000110 | −2 | | 117 | 10011000110001 | −2 |
| | 118 | 00110011000011 | −2 | | 118 | 10011000111000 | −2 |
| | 119 | 00110001111000 | −2 | | 119 | 10011001100001 | −2 |
| | 120 | 00110001110001 | −2 | | 120 | 10011001110000 | −2 |
| | 121 | 00110001100110 | −2 | | 121 | 10011100000011 | −2 |
| | 122 | 00110001100011 | −2 | | 122 | 10011100000110 | −2 |
| | 123 | 00110000111100 | −2 | | 123 | 10011100001100 | −2 |
| | 124 | 00110000111001 | −2 | | 124 | 10011100011000 | −2 |
| | 125 | 00110000110011 | −2 | | 125 | 10011100110000 | −2 |
| | 126 | 00110000011110 | −2 | | 126 | 10011110000001 | −2 |
| | 127 | 00110000001111 | −2 | | 127 | 10011111000000 | −2 |
| 2(D) | 128 | 00111111100000 | 0 | | 128 | 11000000011111 | 0 |
| | 129 | 00111111000001 | 0 | | 129 | 11000000111110 | 0 |
| | 130 | 00111110011000 | 0 | | 130 | 11000001100111 | 0 |
| | 131 | 00111110001100 | 0 | | 131 | 11000001110011 | 0 |
| | 132 | 00111110000110 | 0 | | 132 | 11000001111001 | 0 |
| | 133 | 00111110000011 | 0 | | 133 | 11000001111100 | 0 |
| | 134 | 00111100111000 | 0 | | 134 | 11000011000111 | 0 |
| | 135 | 00111100110001 | 0 | | 135 | 11000011001110 | 0 |
| | 136 | 00111100011100 | 0 | | 136 | 11000011100011 | 0 |
| | 137 | 00111100011001 | 0 | | 137 | 11000011100110 | 0 |
| | 138 | 00111100001110 | 0 | | 138 | 11000011110001 | 0 |
| | 139 | 00111100000111 | 0 | | 139 | 11000011111000 | 0 |
| | 140 | 00111001111000 | 0 | | 140 | 11000110000111 | 0 |
| | 141 | 00111001110001 | 0 | | 141 | 11000110001110 | 0 |
| | 142 | 00111001100110 | 0 | | 142 | 11000110011001 | 0 |
| | 143 | 00111001100011 | 0 | | 143 | 11000110011100 | 0 |
| | 144 | 00111000111100 | 0 | | 144 | 11000111000011 | 0 |
| | 145 | 00111000111001 | 0 | | 145 | 11000111000110 | 0 |
| | 146 | 00111000110011 | 0 | | 146 | 11000111001100 | 0 |
| | 147 | 00111000011110 | 0 | | 147 | 11000111100001 | 0 |
| | 148 | 00111000001111 | 0 | | 148 | 11000111110000 | 0 |
| | 149 | 00110011111000 | 0 | | 149 | 11001100000111 | 0 |
| | 150 | 00110011110001 | 0 | | 150 | 11001100001110 | 0 |
| | 151 | 00110011100110 | 0 | | 151 | 11001100011001 | 0 |
| | 152 | 00110011100011 | 0 | | 152 | 11001100011100 | 0 |
| | 153 | 00110011001110 | 0 | | 153 | 11001100110001 | 0 |
| | 154 | 00110011000111 | 0 | | 154 | 11001100111000 | 0 |
| | 155 | 00110001111100 | 0 | | 155 | 11001110000011 | 0 |
| | 156 | 00110001111001 | 0 | | 156 | 11001110000110 | 0 |
| | 157 | 00110001110011 | 0 | | 157 | 11001110001100 | 0 |
| | 158 | 00110001100111 | 0 | | 158 | 11001110011000 | 0 |
| | 159 | 00110000111110 | 0 | | 159 | 11001111000001 | 0 |
| | 160 | 00110000011111 | 0 | | 160 | 11001111100000 | 0 |
| | 161 | 00110011000001 | −4 | | 161 | 11000000011110 | −2 |
| | 162 | 00110001100001 | −4 | | 162 | 11000000110011 | −2 |
| | 163 | 00110000111000 | −4 | | 163 | 11000000111001 | −2 |
| | 164 | 00110000110001 | −4 | | 164 | 11000000111100 | −2 |
| | 165 | 00110000011100 | −4 | | 165 | 11000001100011 | −2 |
| | 166 | 00110000011001 | −4 | | 166 | 11000001100110 | −2 |
| 3(C) | 167 | 00011110000001 | −4 | | 167 | 11000001110001 | −2 |
| | 168 | 00011100011000 | −4 | | 168 | 11000001111000 | −2 |
| | 169 | 00011100001100 | −4 | | 169 | 11000011000011 | −2 |
| | 170 | 00011100000011 | −4 | | 170 | 11000011000110 | −2 |
| | 171 | 00011001100001 | −4 | | 171 | 11000011001100 | −2 |
| | 172 | 00011000111000 | −4 | | 172 | 11000011100001 | −2 |
| | 173 | 00011000110001 | −4 | | 173 | 11000011110000 | −2 |
| | 174 | 00011000011100 | −4 | | 174 | 11000110000011 | −2 |
| | 175 | 00011000011001 | −4 | | 175 | 11000110000110 | −2 |
| | 176 | 00011000000111 | −4 | | 176 | 11000110001100 | −2 |
| | 177 | 00011111100000 | −2 | | 177 | 11000110011000 | −2 |

TABLE 5-continued (CDS ≦ 0)

| Class | 8-bit data | Modulation codes beginning with "0" | CDS | Class | 8-bit data | Modulation codes beginning with "1" | CDS |
|---|---|---|---|---|---|---|---|
|  | 178 | 00011111000001 | −2 |  | 178 | 11000111000001 | −2 |
|  | 179 | 00011110011000 | −2 |  | 179 | 11000111100000 | −2 |
|  | 180 | 00011110001100 | −2 |  | 180 | 11001100000011 | −2 |
|  | 181 | 00011110000110 | −2 |  | 181 | 11001100000110 | −2 |
|  | 182 | 00011110000011 | −2 |  | 182 | 11001100001100 | −2 |
|  | 183 | 00011100111000 | −2 |  | 183 | 11001100011000 | −2 |
|  | 184 | 00011100110001 | −2 |  | 184 | 11001100110000 | −2 |
|  | 185 | 00011100011100 | −2 |  | 185 | 11001110000001 | −2 |
|  | 186 | 00011100011001 | −2 |  | 186 | 11001111000000 | −2 |
|  | 187 | 00011100001110 | −2 |  | 187 | 11000000011001 | −4 |
|  | 188 | 00011100000111 | −2 |  | 188 | 11000000011100 | −4 |
|  | 189 | 00011001111000 | −2 |  | 189 | 11000000110001 | −4 |
|  | 190 | 00011001110001 | −2 |  | 190 | 11000000111000 | −4 |
|  | 191 | 00011001100110 | −2 |  | 191 | 11000001100001 | −4 |
|  | 192 | 00011001100011 | −2 |  | 192 | 11000001110000 | −4 |
|  | 193 | 00011000111100 | −2 |  | 193 | 11000011000001 | −4 |
|  | 194 | 00011000111001 | −2 |  | 194 | 11000011100000 | −4 |
|  | 195 | 00011000110011 | −2 |  | 195 | 11000110000001 | −4 |
|  | 196 | 00011000011110 | −2 |  | 196 | 11000111000000 | −4 |
|  | 197 | 00011000001111 | −2 |  | 197 | 11001100000001 | −4 |
|  | 198 | 00011111110000 | 0 | 3(D) | 198 | 11100000001111 | 0 |
|  | 199 | 00011111100001 | 0 |  | 199 | 11100000011110 | 0 |
|  | 200 | 00011111001100 | 0 |  | 200 | 11100000110011 | 0 |
|  | 201 | 00011111000110 | 0 |  | 201 | 11100000111001 | 0 |
|  | 202 | 00011111000011 | 0 |  | 202 | 11100000111100 | 0 |
|  | 203 | 00011110011100 | 0 |  | 203 | 11100001100011 | 0 |
|  | 204 | 00011110011001 | 0 |  | 204 | 11100001100110 | 0 |
|  | 205 | 00011110001110 | 0 |  | 205 | 11100001110001 | 0 |
|  | 206 | 00011110000111 | 0 |  | 206 | 11100001111000 | 0 |
|  | 207 | 00011100111100 | 0 |  | 207 | 11100011000011 | 0 |
|  | 208 | 00011100111001 | 0 |  | 208 | 11100011000110 | 0 |
|  | 209 | 00011100110011 | 0 |  | 209 | 11100011001100 | 0 |
|  | 210 | 00011100011110 | 0 |  | 210 | 11100011100001 | 0 |
|  | 211 | 00011100001111 | 0 |  | 211 | 11100111110000 | 0 |
|  | 212 | 00011001111100 | 0 |  | 212 | 11100110000011 | 0 |
|  | 213 | 00011001111001 | 0 |  | 213 | 11100110000110 | 0 |
|  | 214 | 00011001110011 | 0 |  | 214 | 11100110001100 | 0 |
|  | 215 | 00011001100111 | 0 |  | 215 | 11100110011000 | 0 |
|  | 216 | 00011000111110 | 0 |  | 216 | 11100111000001 | 0 |
|  | 217 | 00011000011111 | 0 |  | 217 | 11100111100000 | 0 |
| 4(C) | 218 | 00001110000011 | −4 |  | 218 | 11100000001110 | −2 |
|  | 219 | 00001100000111 | −4 |  | 219 | 11100000011001 | −2 |
|  | 220 | 00001111110000 | −2 |  | 220 | 11100000011100 | −2 |
|  | 221 | 00001111100001 | −2 |  | 221 | 11100000110001 | −2 |
|  | 222 | 00001111001100 | −2 |  | 222 | 11100000111000 | −2 |
|  | 223 | 00001111000110 | −2 |  | 223 | 11100001100001 | −2 |
|  | 224 | 00001111000011 | −2 |  | 224 | 11100001110000 | −2 |
|  | 225 | 00001110011100 | −2 |  | 225 | 11100011000001 | −2 |
|  | 226 | 00001110011001 | −2 |  | 226 | 11100011100000 | −2 |
|  | 227 | 00001110001110 | −2 |  | 227 | 11100110000001 | −2 |
|  | 228 | 00001110000111 | −2 |  | 228 | 11100111000000 | −2 |
|  | 229 | 00001100111100 | −2 |  | 229 | 11100000001100 | −4 |
|  | 230 | 00001100111001 | −2 |  | 230 | 11100000011000 | −4 |
|  | 231 | 00001100110011 | −2 |  | 231 | 11100000110000 | −4 |
|  | 232 | 00001100011110 | −2 |  | 232 | 11100001100000 | −4 |
|  | 233 | 00001100001111 | −2 |  | 233 | 11100011000000 | −4 |
|  | 234 | 00001111111000 | 0 | 4(D) | 234 | 11110000000111 | 0 |
|  | 235 | 00001111110001 | 0 |  | 235 | 11110000001110 | 0 |
|  | 236 | 00001111100110 | 0 |  | 236 | 11110000011001 | 0 |
|  | 237 | 00001111100011 | 0 |  | 237 | 11110000011100 | 0 |
|  | 238 | 00001111001110 | 0 |  | 238 | 11110000110001 | 0 |
|  | 239 | 00001111000111 | 0 |  | 239 | 11110000111000 | 0 |
|  | 240 | 00001110011110 | 0 |  | 240 | 11110001100001 | 0 |
|  | 241 | 00001110001111 | 0 |  | 241 | 11110001110000 | 0 |
|  | 242 | 00001100111110 | 0 |  | 242 | 11110011000001 | 0 |
|  | 243 | 00001100011111 | 0 |  | 243 | 11110011100000 | 0 |
| 5(C) | 244 | 000000111111000 | −2 |  | 244 | 11110000000110 | −2 |
|  | 245 | 00000111110001 | −2 |  | 245 | 11110000001100 | −2 |
|  | 246 | 00000111100110 | −2 |  | 246 | 11110000011000 | −2 |
|  | 247 | 00000111100011 | −2 |  | 247 | 11110000110000 | −2 |
|  | 248 | 00000111000111 | −2 |  | 248 | 11110001100000 | −2 |
|  | 249 | 00000110001111 | −2 |  | 249 | 11110011000000 | −2 |
|  | 250 | 00000111111100 | 0 | 5(D) | 250 | 11111000000011 | 0 |
|  | 251 | 00000111111001 | 0 |  | 251 | 11111000000110 | 0 |
|  | 252 | 00000111110011 | 0 |  | 252 | 11111000001100 | 0 |
|  | 253 | 00000111100111 | 0 |  | 253 | 11111000011000 | 0 |
|  | 254 | 00000111001111 | 0 |  | 254 | 11111000110000 | 0 |

TABLE 5-continued

| | | (CDS ≦ 0) | | | | |
|---|---|---|---|---|---|---|
| Class | 8-bit data | Modulation codes beginning with "0" | CDS | Class | 8-bit data | Modulation codes beginning with "1" | CDS |
| | 255 | 00000110011111 | 0 | | 255 | 11111001100000 | 0 |

The modulation codes in 5(B) of Table 4 can be changed as shown in Table 12 to improve the end DSV: the six modulation codes whose CDS=0 in 5(B) is reduced to four by two, and two new modulation codes which have not been used and whose CDS =2 are added.

TABLE 12

| 8-bit data | Modulation codes | CDS |
|---|---|---|
| 248 | 111110001100001 | 2 |
| 249 | 111110001111000 | 2 |
| 250 | 111110001100001 | 2 |
| 251 | 111110001110000 | 2 |

Selecting a modulation code whose CDS=2 makes it possible to adjust the end DSV at the end of the selected modulation code to 0, when the end DSV at the end of the preceding modulation code is −2, the last bit pattern of the preceding code is any one of the patterns "01", "100", "1000", "10000", "100000", and "1000000", and the signal data is 250 or 251. The modulation codes in 5(C) of Table 5, which are the reversal codes of those in 5(B) of Table 4, can also be changed as shown in Table 13.

TABLE 13

| 8-bit data | Modulation codes | CDS |
|---|---|---|
| 248 | 00000111001110 | −2 |
| 249 | 00000111000111 | −2 |
| 250 | 00000110011110 | −2 |
| 251 | 00000110001111 | −2 |

Modulation codes which are not used in Tables 4 and 12, and whose CDS=4 can be used in place of the modulation codes in Table 4 or in Tables 4 and 12. Selecting a modulation code whose CDS=4 when the end DSV at the end of the preceding modulation code is −2 can improve the bit DSV of the selected modulation code because the bit DSV is sure to take 0 at a particular bit in the selected modulation code.

The modulation codes in Table 5 and Table 13, which are reversal patterns of the codes in Table 4 and Table 12, can be changed in a manner similar to the above, resulting in a similar improvement.

The modulation codes specified to correspond to 8-bit data in Tables 4 and 5 are an example, and so the combination of the modulation codes and the 8-bit code can be altered.

Types of the modulation codes that are allowed to take place according to the end pattern of the preceding modulation code are shown in Table 6.

TABLE 6

| End pattern of the preceding modulation codes | Consecutive number of "0" bits at the beginning of modulation code | | | | | Consecutive number of "1" bits at the beginning of modulation code | | | | |
|---|---|---|---|---|---|---|---|---|---|---|
| | 1 | 2 | 3 | 4 | 5 | 1 | 2 | 3 | 4 | 5 |
| CDS≧0 | (A) | (A) | (A) | (A) | (A) | (B) | (B) | (B) | (B) | (B) |
| | 1 | 2 | 3 | 4 | 5 | 1 | 2 | 3 | 4 | 5 |
| CDS≦0 | (C) | (C) | (C) | (C) | (C) | (D) | (D) | (D) | (D) | (D) |
| ............110 | o | o | o | o | o | | | | | |
| ...........1100 | o | o | o | o | o | | o | o | o | o |
| .........11000 | o | o | o | o | | | o | o | o | o |
| ........110000 | o | o | o | | | | o | o | o | o |
| .......1100000 | o | o | | | | | o | o | o | o |
| ...11000000* | o | | | | | | o | o | o | o |
| .............001 | | | | | | | o | o | o | o |
| ............0011 | | o | o | o | o | o | o | o | o | o |
| ..........00111 | | o | o | o | o | o | o | o | o | |
| ........001111 | | o | o | o | o | o | o | o | | |
| ......0011111 | | o | o | o | o | o | o | | | |
| ...00111111* | | o | o | o | o | o | | | | |

Notes with regard to Table 6:
"o" mark indicates that the modulation codes are allowed.
"*" indicates that a modulation code whose CDS ≧ 0 is selected when the end pattern of the preceeding modulation code is "...11000000", and that a modulation code whose CDS ≦ 0 is selected when the end pattern of the preceding modulation code is "...00111111".

For example, when the end pattern of the preceding modulation code is "...11000", and the end DSV of the preceding modulation code is −2, the modulation codes of classes 1(A), 2(A), 3(A), 4(A), 2(B), 3(B), 4(B), and 5(B) in Table 4 can take place as a current modulation code because the current modulation code to be selected must satisfy the requirements that the CDS≧0 and the number of consecutive identical bits in the joint portion of the two codes is 2-7.

In this case, suppose that the current 8-bit data is "166". Then, one of the two possible modulation codes "00111110011001" (CDS=2; 2(A)), and "11001111100110" (CDS =4; 2(B)) shown in Table 4 is selected: the end DSV of the preceding modulation code and the CDS of the current modulation code are added so as to obtain the end DSV of the current modulation code; the modulation code which will give less end DSV is selected, that is, the modulation code "00111110011001" (CDS=2) is selected. The resultant end DSV is 0 and it indicates that the direct current component is removed.

Figure 3A:
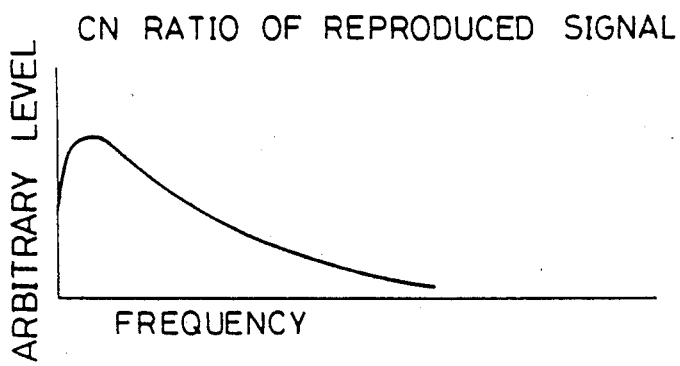
FIG. 3A is a graph showing a carrier-to-noise ratio of a reproduced signal.
Figure 3B:
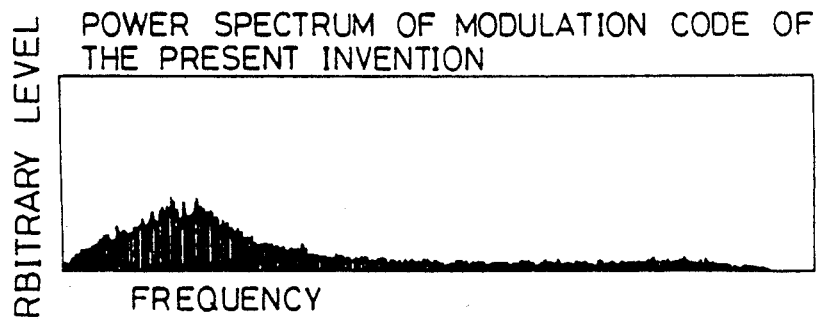
FIG. 3B is a graph showing a power spectrum of the first embodiment of the present invention.
Figure 3C:
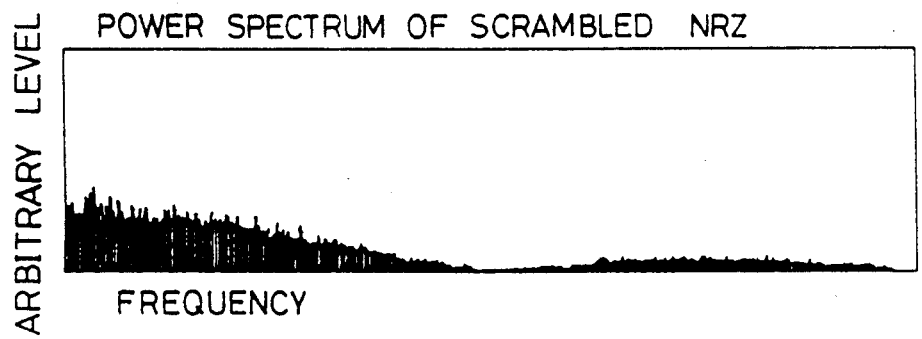
FIG. 3C is a graph showing a power spectrum of the scrambled NRZ.

FIG. 3A shows the CNR (carrier-to-noise ratio) characteristics when a sine wave recorded on magnetic tape is reproduced, FIG. 3B shows the power spectrum at the output terminal of the modulator of the embodiment when random 8-bit data are inputted to the modulator, and FIG. 3C shows the power spectrum of the scrambled NRZ at the output terminal of the scrambled NRZ modulator when random 8-bit data are inputted to the scrambled NRZ modulator. From these figures, it is seen that the power spectrum according to the digital modulation method of the present invention includes no direct current component, and is included within a record-reproduction bandwidth in which the high CNR is obtained. As a result, the record-reproduction characteristics of the magnetic tape and head system can be effectively used. Furthermore, the minimum magnetization transition width of the modulation codes of the digital modulation method according to the present invention is 1.14 times the minimum magnetization transition width of the scrambled NRZ. Consequently, the intercode interference can be reduced.

As described above, the embodiment restricts the number of consecutive identical bits in a stream of modulation codes to 2-7. As a result, the minimum magnetization transition width is 1.14T (=(28)T/14, where T is the bit period of the 8-bit data), the maximum magnetization transition width is 4.00T (=(7×8)T/14), DR is 1.14 (=(2×8)/14), and the ratio of the maximum magnetization transition width to the minimum magnetization transition width is 3.5. Consequently, the bit error rate of the magnetic recording is reduced, and the high-density recording becomes possible. In addition, azimuth recording and high quality over-writing become possible.

Furthermore, the embodiment restricts the absolute value of CDS of the modulation codes equal to or less than 4, allocates up to 4 modulation codes to each 8-bit data according to the DSV at the end of the preceding modulation code and the end pattern of the preceding code, and selects the modulation code the end DSV of which gives the least absolute value. As a result, the absolute value of the end DSV which is calculated at the end of each modulation code is within 2, and the absolute value of the bit DSV which is calculated at each bit of a modulation code is within 7. Thus, the direct current component can be effectively removed, and hence, the transmission of the modulation codes becomes possible by using a rotary transformer that does not pass the direct current component.

[B]SECOND EMBODIMENT

Figure 6:
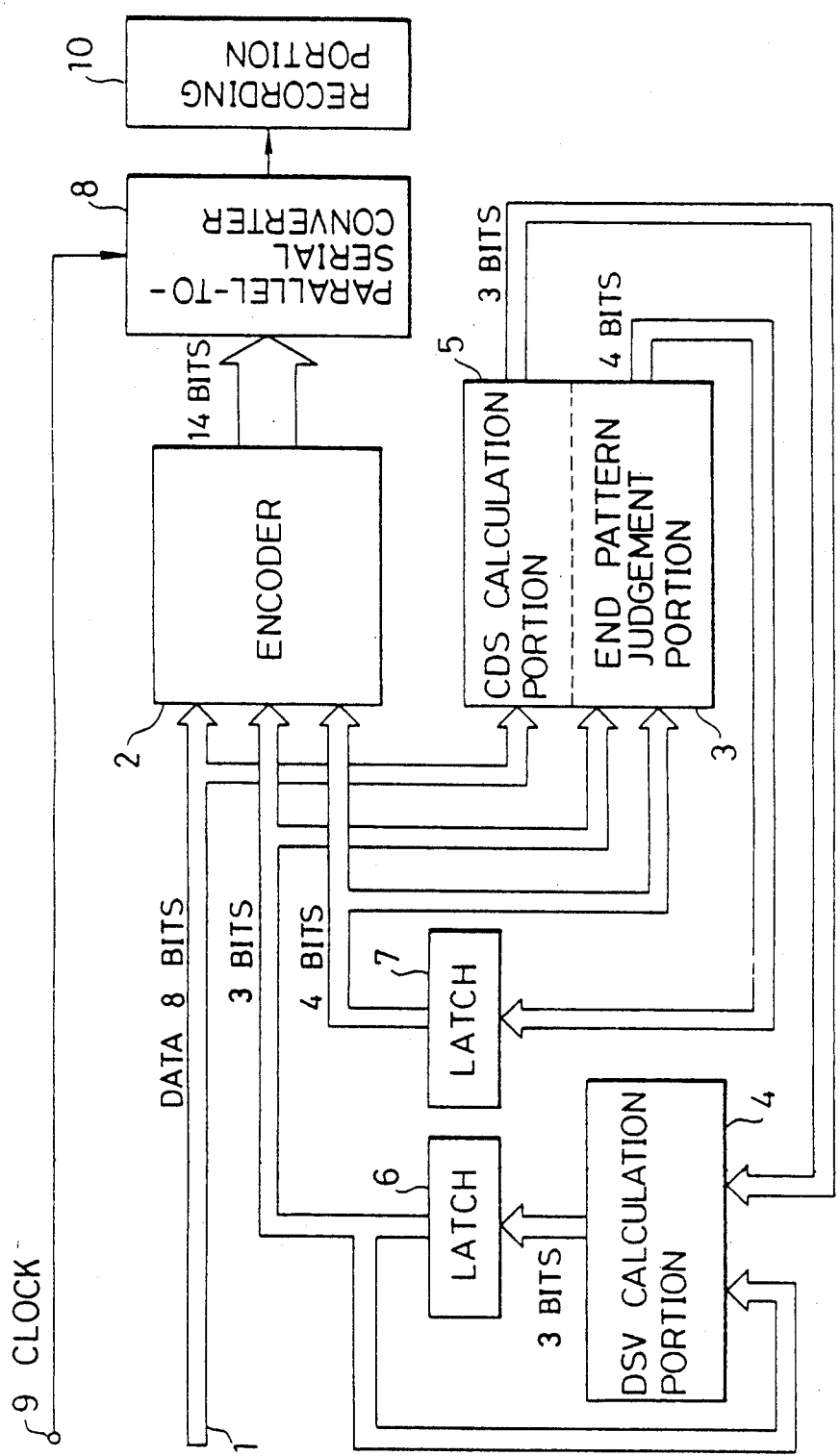
FIG. 6 is a block diagram showing a digital modulation apparatus for carrying out the digital modulation according to the second embodiment of the digital modulation method of the present invention.

FIG. 6 is a block diagram showing a digital modulation apparatus for carrying out the digital modulation according to the second embodiment of the digital modulation method of the present invention.

In FIG. 6, 8-bit digital data 1 is converted to a 14-bit digital modulation code by an encoder 2. An end pattern judgement portion 3 converts the end pattern of the last 5-bits of the 14-bit digital modulation code into a 4-bit code in Table 21 (although the last 7 bits of the modulation codes are given in Table 21, only the last 5 bits should be considered). A CDS calculation portion 5 computes the CDS of the 14-bit digital modulation code supplied, and converts the resultant CDS into a 3-bit code in Table 20. A DSV calculation portion 4 adds the CDS of the current 14-bit digital modulation code to the DSV at the end of the preceding 14-bit digital modulation code, yielding a new DSV, and converts the new DSV into a 3-bit code shown in Table 20.

A parallel-to-serial converter 8 converts the 14-bit digital modulation code into a serial signal in synchronism with a clock signal 9. A recording portion 10 records the serial modulation signal produced from the parallel-to-serial converter 8 on a recording medium such as magnetic tape or the like.

TABLE 20

| CDS,DSV of modulation codes | Corresponding 3-bit codes |
| --- | --- |
| −6 | 000 |
| −4 | 001 |
| −2 | 010 |
| 0 | 011 |
| 2 | 100 |
| 4 | 101 |
| 6 | 110 |

TABLE 21

| End pattern of the preceding modulation codes | corresponding 4-bit codes |
| --- | --- |
| ... xxxx110 | 0000 |
| ... xxx1100 | 0001 |
| ... xx11000 | 0010 |
| ... x110000 | 0011 |
| ... 1100000 | 0100 |
| ... xxxx001 | 1000 |
| ... xxx0011 | 1001 |
| ... xx00111 | 1010 |
| ... x001111 | 1011 |
| ... 0011111 | 1100 | x: Don't care bit

The resultant CDS converted into a 3-bit code shown in Table 20 by the CDS calculation portion 5, is supplied to the DSV calculation portion 4.

The DSV calculation portion 4 converts the resultant DSV into a 3-bit code shown in Table 20, and supplies the code to the encoder 2 via a latch 6. The end pattern judgement portion 3 converts the last five bits into a 4-bit code in Table 21, and supplies the code to the encoder 2 via a latch 7.

Next, the method for selecting a 14-bit digital modulation code corresponding to each inputted 8-bit digital data will be described.

First, the method for selecting up to four 14-bit digital modulation codes for each 8-bit digital data will be described.

The 14-bit digital modulation code is selected by the procedures of (a) selecting among the $2^{14}$ 14-bit digital codes, a digital code the numbers of consecutive identical bits in which are 6 or less in the first 7 bits, 2–7 from the second bit to 13th bit, and 5 or less in the last 6 bits, and repeating this selecting procedure, (b) selecting among the 14-bit digital codes selected at the procedure (a), a digital code the first bit of which is "0", and the CDS of which has the absolute value equal to or less than 6, and repeating this selecting procedure, (c) selecting among the 14-bit digital codes selected at the procedure (a), a digital code the first bit of which is "1", and the CDS of which has the absolute value equal to or less than 4, and repeating this selecting procedure, (d) selecting among the 14-bit digital codes selected at the procedure (b), a digital code the value of CDS of which is 0, and pairing the selected 14-bit digital code with the reversal code thereof to make the 2 digital codes one group, and repeating this selecting procedure, (e) selecting among the 14-bit digital codes selected at the procedure (b), a digital code the value of CDS of which is +2, +4 or +6, selecting among the 14-bit digital codes selected at the procedure (c), a digital code the value of CDS of which is +2 or +4, and combining the two selected 14-bit digital codes with the reversal codes thereof to make the 4 digital codes one group, and repeating this selecting procedure, and (f) selecting 256 groups among the groups formed in the above procedures as the 14-bit digital modulation codes.

Figure 7:
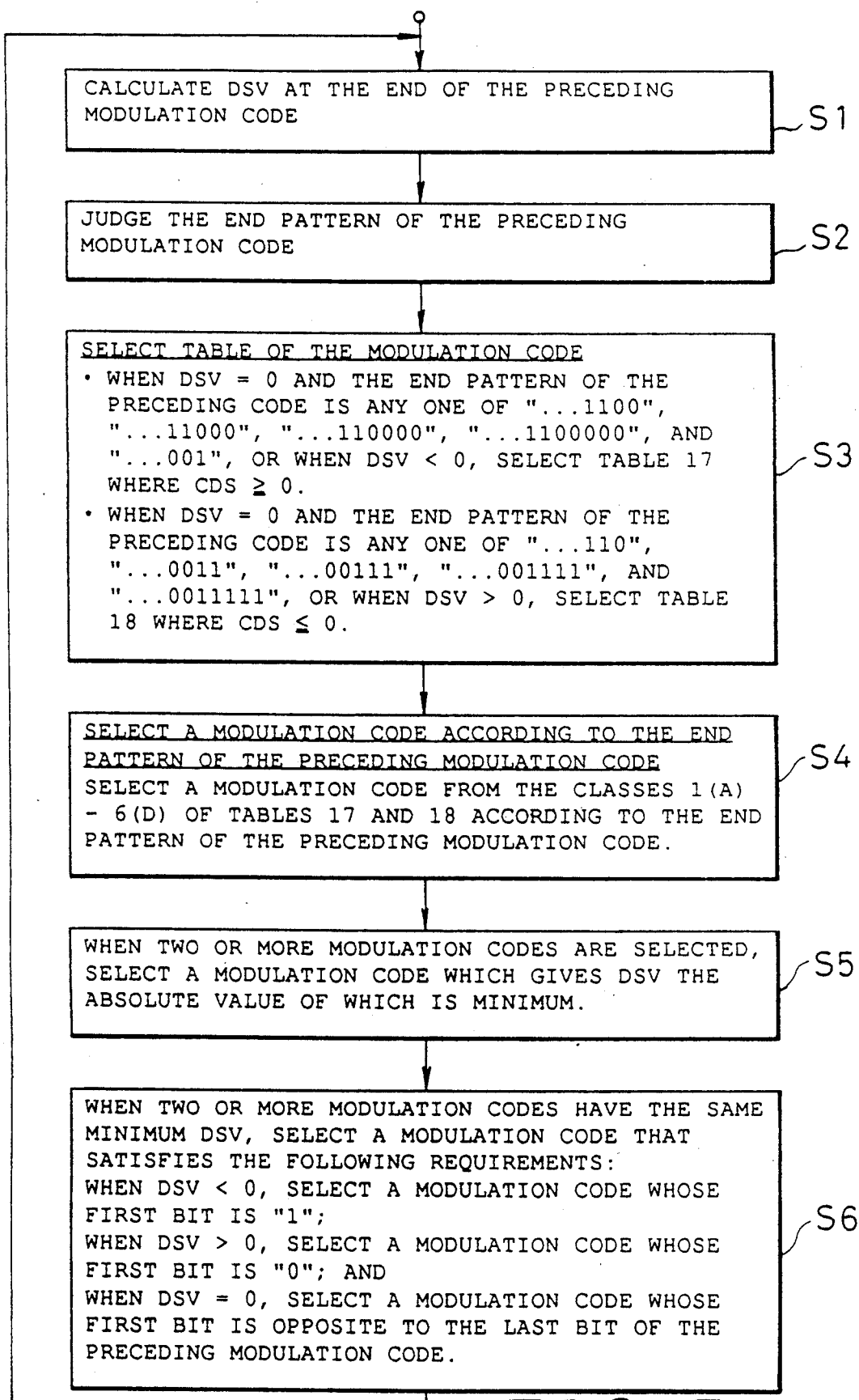
FIG. 7 is a flowchart showing the modulation procedure of the digital modulation apparatus for carrying out the digital modulation according to the second embodiment.

Next, the selection procedure of a 14-bit digital modulation code (current modulation code) corresponding to inputted 8-bit data will be described with reference to FIG. 7, which is a flowchart showing the modulation procedure according to the digital modulation method of the present invention.

At step S1, DSV at the end of the preceding modulation code is calculated.

At step S2, the end pattern of the preceding modulation code is judged

At step S3, when the DSV<0, the modulation codes in Table 17 are selected, and when DSV>0, the modulation codes in Table 18 are selected. On the other hand, when DSV=0 and the end pattern of the preceding code is any one of "... 110", "... 0011", "... 00111", "... 001111", and "... 0011111", the modulation codes in Table 18 are selected. Further, when DSV=0 and the end pattern of the preceding code is any one of "... 1100", "... 11000", "... 110000", "... 1100000", and "... 001", the modulation codes in Table 17 are selected.

At step S4, a modulation code is selected among the selected codes at step S3 and among the classes 1(A-)-6(D) in Tables 17 and 18, according to the end pattern of the preceding modulation code.

At step S5, is selected a modulation code which gives DSV the absolute value of which is minimum when two or more modulation codes are selected at step S4. In this case, the DSV is obtained by adding the DSV at the end of the preceding modulation code and the CDS of the current modulation code.

At step S6, a modulation code that satisfies the following requirements is selected when two or more modulation codes selected at step S5 have the same minimum DSV.

When DSV<0 at the end of the preceding modulation code, a modulation code whose first bit is "1" is selected.

When DSV>0 at the end of the preceding modulation code, a modulation code whose first bit is "0" is selected.

When DSV=0 at the end of the preceding modulation code, a modulation code whose first bit is opposite to the last bit of the preceding modulation code.

The 14-bit digital modulation code thus selected is fed to the parallel-to-serial converter 8. The modulation code entered the parallel-to-serial converter 8 is serially read out in synchronism with the clock 9, and is fed to the recording portion 10, where the 14-bit digital modulation code is recorded on the record medium such as magnetic tape or the like.

On the other hand, the 14-bit digital modulation code selected by the encoder 2 is supplied to the DSV calculation portion 4, and to the modulation code end pattern judgement portion 3. The DSV calculation portion 4 adds the CDS of the current modulation code to the DSV at the end of the preceding modulation code to obtain a new DSV. The new DSV is converted into a 3-bit code according to Table 20, and is supplied to the encoder 2 through latch 6. The end pattern judgement portion 3 converts the last 5 bits of the 14-bit modulation code into a 4-bit code according to Table 21, and supplies the 4-bit code to the encoder 2 through latch 7.

The above procedure is repeated for every 8-bit input data. Thus, a 14-bit digital modulation code train is obtained, in which the number of consecutive identical bits is restricted to 2-7, and the absolute value of the DSV is restricted equal to or less than 8.

Next, the 14-bit digital modulation code produced from the encoder 2 in FIG. 6 will be described.

The 14-bit digital modulation code converted from the 8-bit code satisfies the following requirements.

(1) The number of consecutive identical bits i the first 7 bits is equal to or less than 6.

(2) The number of consecutive identical bits included from the second bit to the 13th bit is 2−7.

(3) The number of consecutive identical bits included in the last 6 bits is equal to or less than 5.

(4) The absolute value of CDS of the modulation code is equal to or less than 6.

The end patterns of the modulation codes that satisfy the above requirements (1) to (4) are summed up as the following 10 items (A)-(K).

| | | |
|---|---|---|
| (A) | ......... | 110 |
| (B) | ......... | 1100 |
| (C) | ......... | 11000 |
| (D) | ......... | 110000 |
| (E) | ......... | 1100000 |
| (F) | ......... | 001 |
| (G) | ......... | 0011 |
| (H) | ......... | 00111 |
| (J) | ......... | 001111 |
| (K) | ......... | 0011111 |

The beginning of the modulation code succeeding to the modulation codes (A)-(K) is one of the following items.

First, the beginning of the modulation code succeeding to the modulation code (A) is one of the following five items (A1)-(A6).

| | |
|---|---|
| (A1) | 011............ |
| (A2) | 0011........... |
| (A3) | 00011.......... |
| (A4) | 000011......... |
| (A5) | 0000011........ |
| (A6) | 00000011....... |

Second, the beginning of the modulation code succeeding to the modulation code (B) is one of the following ten items (B1)-(B10).

| | |
|---|---|
| (B1) | 011............ |
| (B2) | 0011........... |
| (B3) | 00011.......... |
| (B4) | 000011......... |
| (B5) | 0000011........ |
| (B6) | 1100........... |
| (B7) | 11100.......... |
| (B8) | 111100......... |
| (B9) | 1111100........ |
| (B10) | 11111100....... |

The beginning of the modulation code succeeding to the modulation code (C) is one of the following nine items (C1)-(C9).

| | |
|---|---|
| (C1) | 011............ |
| (C2) | 0011........... |
| (C3) | 00011.......... |
| (C4) | 000011......... |
| (C5) | 1100........... |
| (C6) | 11100.......... |
| (C7) | 111100......... |
| (C8) | 1111100........ |
| (C9) | 11111100....... |

The beginning of the modulation code succeeding to the modulation code (D) is one of the following eight items (D1)–(D8).

| | |
|---|---|
| (D1) | 011............ |
| (D2) | 0011........... |
| (D3) | 00011.......... |
| (D4) | 1100........... |
| (D5) | 11100.......... |
| (D6) | 111100......... |
| (D7) | 1111100........ |
| (D8) | 11111100....... |

The beginning of the modulation code succeeding to the modulation code (E) is one of the following seven items (E1)–(E7).

| | |
|---|---|
| (E1) | 011............ |
| (E2) | 0011........... |
| (E3) | 1100........... |
| (E4) | 11100.......... |
| (E5) | 111100......... |
| (E6) | 1111100........ |
| (E7) | 11111100....... |

The beginning of the modulation code succeeding to the modulation code (F) is one of the reversal patterns of the modulation codes (A1)–(A6).

The beginning of the modulation code succeeding to the modulation code (G) is one of the reversal patterns of the modulation codes (B1)–(B10).

The beginning of the modulation code succeeding to the modulation code (H) is one of the reversal patterns of the modulation codes (C1)–(C9).

The beginning of the modulation code succeeding to the modulation code (J) is one of the reversal patterns of the modulation codes (D1)–(D8).

The beginning of the modulation code succeeding to the modulation code (K) is one of the reversal patterns of the modulation codes (E1)–(E7).

The numbers of the modulation codes that satisfy the requirements (1)–(4) are shown in Tables 14 and 15.

TABLE 14

| Beginning pattern of modulation codes | The number of possible modulation codes | | | | | | | | CDS ≦0 | CDS ≧0 |
|---|---|---|---|---|---|---|---|---|---|---|
| | CDS Value | | | | | | | Total | | |
| | −6 | −4 | −2 | 0 | 2 | 4 | 6 | | | |
| 00000011... | 5 | 6 | 5 | 1 | 0 | 0 | 0 | 17 | 17 | 1 |
| 0000011... | 6 | 9 | 8 | 6 | 0 | 0 | 0 | 29 | 29 | 6 |
| 000011... | 6 | 12 | 14 | 10 | 5 | 0 | 0 | 47 | 42 | 15 |
| 00011... | 7 | 14 | 21 | 20 | 10 | 4 | 0 | 76 | 62 | 34 |
| 0011... | 5 | 17 | 28 | 33 | 25 | 10 | 3 | 121 | 83 | 71 |
| 011... | 4 | 15 | 37 | 49 | 46 | 31 | 8 | 190 | 105 | 134 |
| Total | 33 | 73 | 113 | 119 | 86 | 45 | 11 | 480 | 338 | 261 |

TABLE 15

| Beginning pattern of modulation codes | The number of possible modulation codes | | | | | | | | CDS ≦0 | CDS ≧0 |
|---|---|---|---|---|---|---|---|---|---|---|
| | CDS Value | | | | | | | Total | | |
| | −6 | −4 | −2 | 0 | 2 | 4 | 6 | | | |
| 11111100... | 0 | 0 | 0 | 1 | 5 | 6 | 5 | 17 | 1 | 17 |
| 1111100... | 0 | 0 | 0 | 6 | 8 | 9 | 6 | 29 | 6 | 29 |
| 111100... | 0 | 0 | 5 | 10 | 14 | 12 | 6 | 47 | 15 | 42 |
| 11100... | 0 | 4 | 10 | 20 | 21 | 14 | 7 | 76 | 34 | 62 |
| 1100... | 3 | 10 | 25 | 33 | 28 | 17 | 5 | 121 | 71 | 83 |
| 100... | 8 | 31 | 46 | 49 | 37 | 15 | 4 | 190 | 134 | 105 |
| Total | 11 | 45 | 86 | 119 | 113 | 73 | 33 | 480 | 261 | 338 |

More than 256 modulation codes whose CDS≧0, and more than 256 modulation codes whose CDS≦0 are necessary, which follow one of the modulation codes (A)–(K). In addition, the converted modulation code must correspond to one 8-bit data to avoid transmission error.

The number of modulation codes than can succeed one of the modulation codes (A)–(K) is shown in Table 16.

TABLE 16

| End pattern of modulation codes | The number of possible modulation codes | | | | | | | | CDS ≦0 | CDS ≧0 |
|---|---|---|---|---|---|---|---|---|---|---|
| | CDS Value | | | | | | | Total | | |
| | −6 | −4 | −2 | 0 | 2 | 4 | 6 | | | |
| ...110 | 33 | 73 | 113 | 119 | 86 | 45 | 11 | 480 | 338 | 261 |
| ...1100 | 31 | 81 | 148 | 188 | 162 | 103 | 40 | 753 | 448 | 493 |
| ...11000 | 25 | 72 | 140 | 182 | 162 | 103 | 40 | 724 | 419 | 487 |
| ...110000 | 19 | 60 | 126 | 172 | 157 | 103 | 40 | 677 | 377 | 472 |
| ...1100000 | 12 | 46 | 105 | 152 | 147 | 99 | 40 | 601 | 315 | 438 |
| ...001 | 11 | 45 | 86 | 119 | 113 | 73 | 33 | 480 | 261 | 338 |
| ...0011 | 40 | 103 | 162 | 188 | 148 | 81 | 31 | 753 | 492 | 448 |
| ...00111 | 40 | 103 | 162 | 182 | 140 | 72 | 25 | 724 | 487 | 419 |
| ...001111 | 40 | 103 | 157 | 172 | 126 | 60 | 19 | 677 | 472 | 377 |

TABLE 16-continued

| End pattern of modulation codes | The number of possible modulation codes | | | | | | | | | |
|---|---|---|---|---|---|---|---|---|---|---|
| | CDS Value | | | | | | | | CDS | CDS |
| | −6 | −4 | −2 | 0 | 2 | 4 | 6 | Total | ≦0 | ≧0 |
| ...0011111 | 40 | 99 | 147 | 157 | 105 | 46 | 12 | 601 | 438 | 315 |

Figure 8:
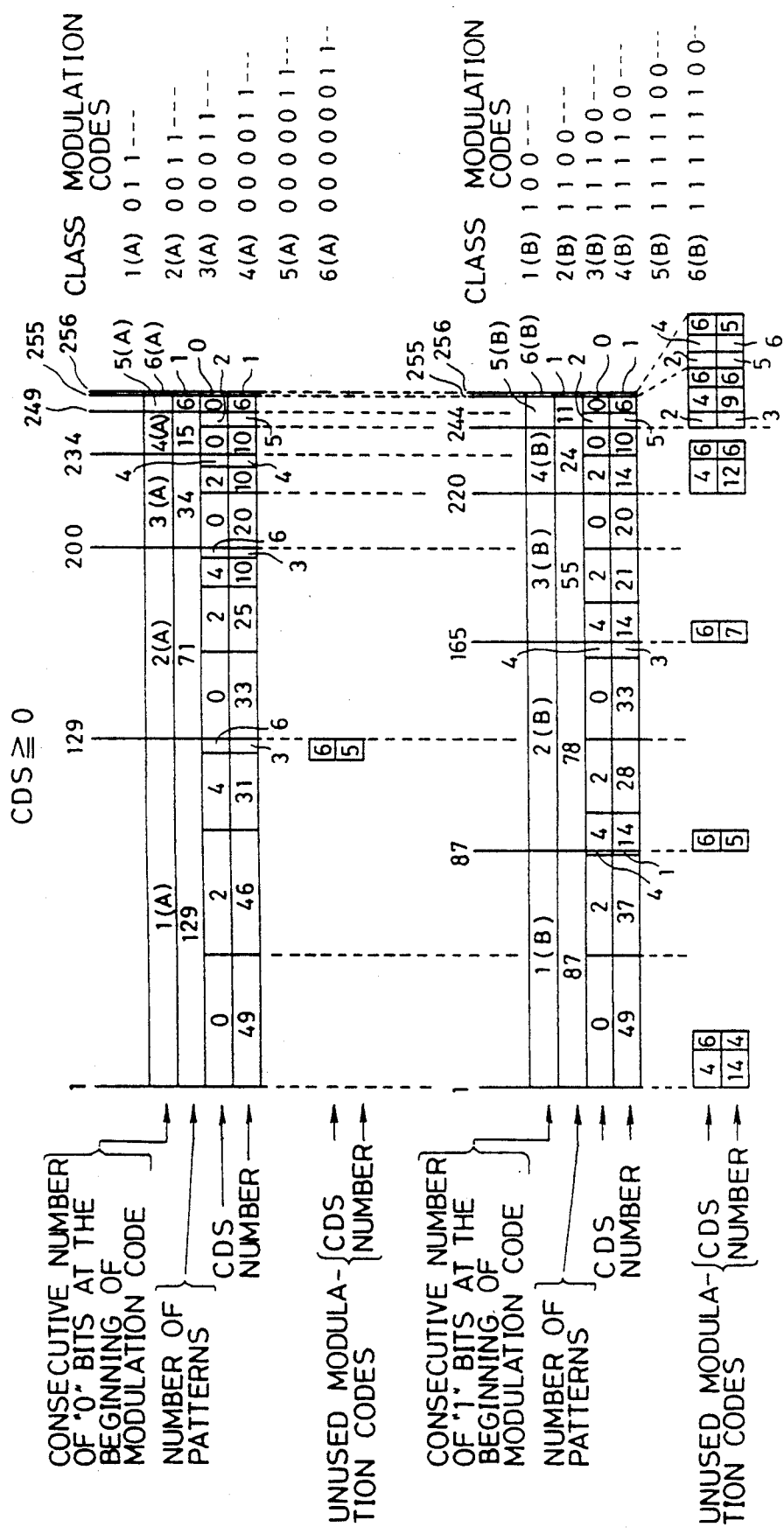
FIG. 8 is a view showing the number of 14-bit digital modulation codes whose CDS $\geq 0$.
Figure 9:
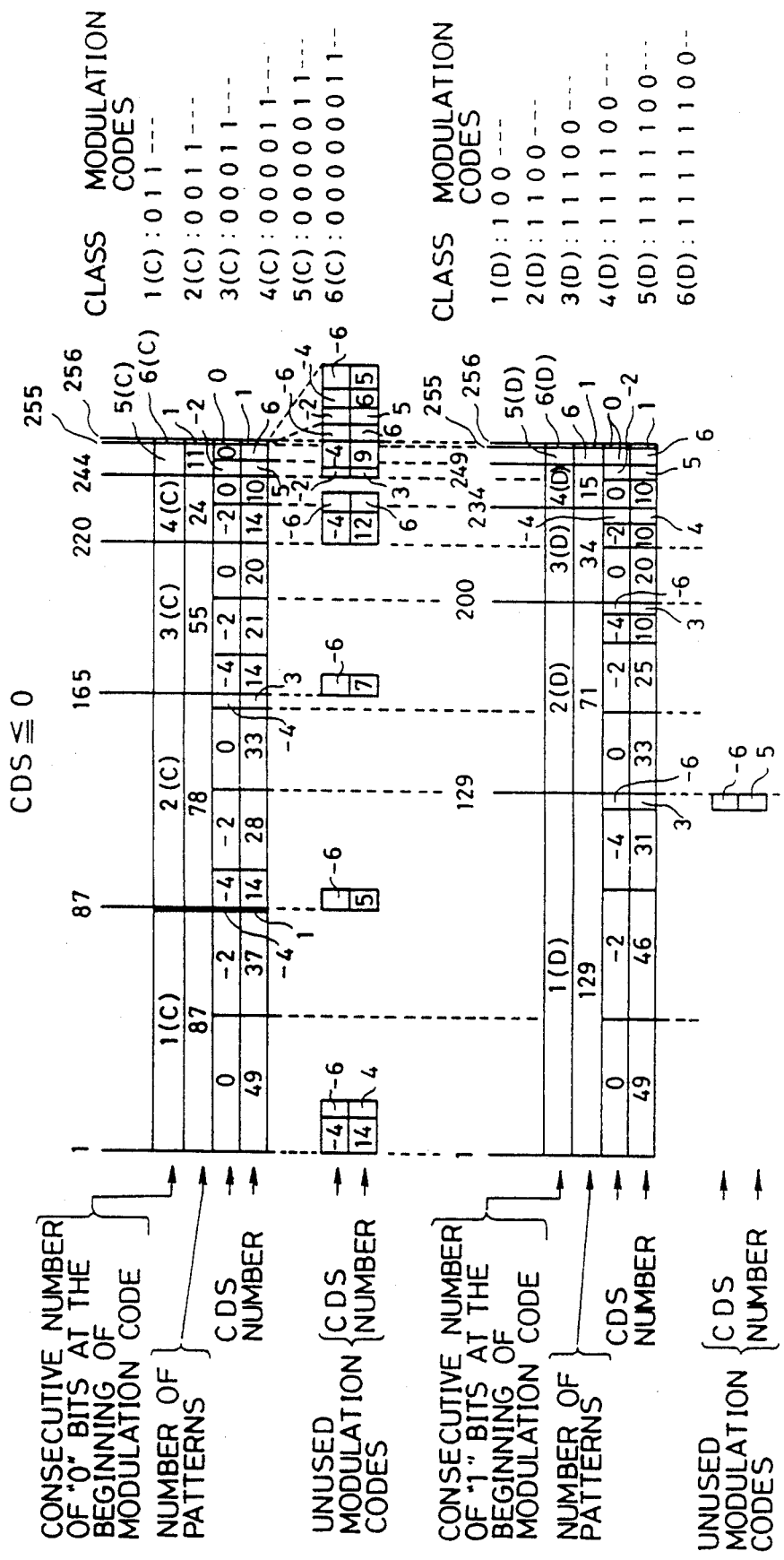
FIG. 9 is a view showing the number of 14-bit digital modulation codes whose CDS $\geq 0$.

FIG. 8 shows the number of modulation codes of respective classes when CDS≧0, and FIG. 9 shows the number of modulation code of respective classes when CDS≦0.

Tables 17 and 18 show the correspondence between the 8-bit data and the modulation codes: Table 17 shows the correspondence when CDS≧0; and Table 18 shows the correspondence when CDS≦0.

TABLE 17

(CDS ≧ 0)

| Class | 8-bit data | Modulation codes beginning with "0" | CDS | Class | 8-bit data | Modulation codes beginning with "1" | CDS |
|---|---|---|---|---|---|---|---|
| | 0 | 01111110000001 | 0 | | 0 | 10000001111110 | 0 |
| | 1 | 01111100110000 | 0 | | 1 | 10000011001111 | 0 |
| | 2 | 01111100011000 | 0 | | 2 | 10000011100111 | 0 |
| | 3 | 01111100001100 | 0 | | 3 | 10000011110011 | 0 |
| | 4 | 01111100000110 | 0 | | 4 | 10000011111001 | 0 |
| | 5 | 01111100000011 | 0 | | 5 | 10000011111100 | 0 |
| | 6 | 01111001110000 | 0 | | 6 | 10000110001111 | 0 |
| | 7 | 01111001100001 | 0 | | 7 | 10000110011110 | 0 |
| | 8 | 01111000111000 | 0 | | 8 | 10000111000111 | 0 |
| | 9 | 01111000110001 | 0 | | 9 | 10000111001110 | 0 |
| | 10 | 01111000011100 | 0 | | 10 | 10000111100011 | 0 |
| | 11 | 01111000011001 | 0 | | 11 | 10000111100110 | 0 |
| | 12 | 01111000001110 | 0 | | 12 | 10000111110001 | 0 |
| | 13 | 01111000000111 | 0 | | 13 | 10000111111000 | 0 |
| | 14 | 01110011110000 | 0 | | 14 | 10001100001111 | 0 |
| | 15 | 01110011100001 | 0 | | 15 | 10001100011110 | 0 |
| | 16 | 01110011001100 | 0 | | 16 | 10001100110011 | 0 |
| | 17 | 01110011000110 | 0 | | 17 | 10001100111001 | 0 |
| | 18 | 01110011000011 | 0 | | 18 | 10001100111100 | 0 |
| | 19 | 01110001111000 | 0 | | 19 | 10001110000111 | 0 |
| | 20 | 01110001110001 | 0 | | 20 | 10001110001110 | 0 |
| | 21 | 01110001100110 | 0 | | 21 | 10001110011001 | 0 |
| | 22 | 01110001100011 | 0 | | 22 | 10001110011100 | 0 |
| | 23 | 01110000111100 | 0 | | 23 | 10001111000011 | 0 |
| | 24 | 01110000111001 | 0 | | 24 | 10001111000110 | 0 |
| 1 (A) | 25 | 01110000110011 | 0 | 1 (B) | 25 | 10001111001100 | 0 |
| | 26 | 01110000011110 | 0 | | 26 | 10001111100001 | 0 |
| | 27 | 01110000001111 | 0 | | 27 | 10001111110000 | 0 |
| | 28 | 01100111110000 | 0 | | 28 | 10011000001111 | 0 |
| | 29 | 01100111100001 | 0 | | 29 | 10011000011110 | 0 |
| | 30 | 01100111001100 | 0 | | 30 | 10011000110011 | 0 |
| | 31 | 01100111000110 | 0 | | 31 | 10011000111001 | 0 |
| | 32 | 01100111000011 | 0 | | 32 | 10011000111100 | 0 |
| | 33 | 01100110011100 | 0 | | 33 | 10011001100011 | 0 |
| | 34 | 01100110011001 | 0 | | 34 | 10011001100110 | 0 |
| | 35 | 01100110001110 | 0 | | 35 | 10011001110001 | 0 |
| | 36 | 01100110000111 | 0 | | 36 | 10011001111000 | 0 |
| | 37 | 01100011111000 | 0 | | 37 | 10011100000111 | 0 |
| | 38 | 01100011110001 | 0 | | 38 | 10011100001110 | 0 |
| | 39 | 01100011100110 | 0 | | 39 | 10011100011001 | 0 |
| | 40 | 01100011100011 | 0 | | 40 | 10011100011100 | 0 |
| | 41 | 01100011001110 | 0 | | 41 | 10011100110001 | 0 |
| | 42 | 01100011000111 | 0 | | 42 | 10011100111000 | 0 |
| | 43 | 01100001111100 | 0 | | 43 | 10011110000011 | 0 |
| | 44 | 01100001111001 | 0 | | 44 | 10011110000110 | 0 |
| | 45 | 01100001110011 | 0 | | 45 | 10011110001100 | 0 |
| | 46 | 01100001100111 | 0 | | 46 | 10011110011000 | 0 |
| | 47 | 01100000111110 | 0 | | 47 | 10011111000001 | 0 |
| | 48 | 01100000011111 | 0 | | 48 | 10011111100000 | 0 |
| | 49 | 01111111000001 | 2 | | 49 | 10000011111110 | 2 |
| | 50 | 01111110011000 | 2 | | 50 | 10000110011111 | 2 |
| | 51 | 01111110001100 | 2 | | 51 | 10000111001111 | 2 |
| | 52 | 01111110000110 | 2 | | 52 | 10000111100111 | 2 |
| | 53 | 01111110000011 | 2 | | 53 | 10000111110011 | 2 |
| | 54 | 01111100111000 | 2 | | 54 | 10000111111001 | 2 |
| | 55 | 01111100110001 | 2 | | 55 | 10000111111100 | 2 |
| | 56 | 01111100011100 | 2 | | 56 | 10001100011111 | 2 |
| | 57 | 01111100011001 | 2 | | 57 | 10001100111110 | 2 |
| | 58 | 01111100001110 | 2 | | 58 | 10001110001111 | 2 |
| | 59 | 01111100000111 | 2 | | 59 | 10001110011110 | 2 |
| | 60 | 01111001111000 | 2 | | 60 | 10001111000111 | 2 |
| | 61 | 01111001110001 | 2 | | 61 | 10001111001110 | 2 |
| | 62 | 01111001100110 | 2 | | 62 | 10001111100011 | 2 |
| | 63 | 01111001100011 | 2 | | 63 | 10001111100110 | 2 |

TABLE 17-continued (CDS ≧ 0)

| Class | 8-bit data | Modulation codes beginning with "0" | CDS | Class | 8-bit data | Modulation codes beginning with "1" | CDS |
|---|---|---|---|---|---|---|---|
| | 64 | 011110001111100 | 2 | | 64 | 10001111110001 | 2 |
| | 65 | 01111000111001 | 2 | | 65 | 10001111111000 | 2 |
| | 66 | 01111000110011 | 2 | | 66 | 10011000011111 | 2 |
| | 67 | 01111000011110 | 2 | | 67 | 10011000111110 | 2 |
| | 68 | 01111000001111 | 2 | | 68 | 10011001100111 | 2 |
| | 69 | 01110011111000 | 2 | | 69 | 10011001110011 | 2 |
| | 70 | 01110011110001 | 2 | | 70 | 10011001111001 | 2 |
| | 71 | 01110011100110 | 2 | | 71 | 10011001111100 | 2 |
| | 72 | 01110011100011 | 2 | | 72 | 10011100001111 | 2 |
| | 73 | 01110011001110 | 2 | | 73 | 10011100011110 | 2 |
| | 74 | 01110011000111 | 2 | | 74 | 10011100110011 | 2 |
| | 75 | 01110001111100 | 2 | | 75 | 10011100111001 | 2 |
| | 76 | 01110001111001 | 2 | | 76 | 10011100111100 | 2 |
| | 77 | 01110001110011 | 2 | 1(B) | 77 | 10011110000111 | 2 |
| | 78 | 01110001100111 | 2 | | 78 | 10011110001110 | 2 |
| | 79 | 01110000111110 | 2 | | 79 | 10011110011001 | 2 |
| | 80 | 01110000011111 | 2 | | 80 | 10011110011100 | 2 |
| | 81 | 01100111111000 | 2 | | 81 | 10011111000011 | 2 |
| | 82 | 01100111110001 | 2 | | 82 | 10011111000110 | 2 |
| | 83 | 01100111100110 | 2 | | 83 | 10011111001100 | 2 |
| | 84 | 01100111100011 | 2 | | 84 | 10011111100001 | 2 |
| | 85 | 01100111001110 | 2 | | 85 | 10011111110000 | 2 |
| 1 (A) | 86 | 01100111000111 | 2 | | 86 | 10011111000111 | 4 |
| | 87 | 01100110011110 | 2 | | 87 | 11000011111110 | 4 |
| | 88 | 01100100001111 | 2 | | 88 | 11000110011111 | 4 |
| | 89 | 01100011111100 | 2 | | 89 | 11000111001111 | 4 |
| | 90 | 01100011111001 | 2 | | 90 | 11000111100111 | 4 |
| | 91 | 01100011110011 | 2 | | 91 | 11000111110011 | 4 |
| | 92 | 01100011100111 | 2 | | 92 | 11000111111001 | 4 |
| | 93 | 01100011001111 | 2 | | 93 | 11000111111100 | 4 |
| | 94 | 01100001111110 | 2 | | 94 | 11001100011111 | 4 |
| | 95 | 01111111001100 | 4 | | 95 | 11001100111110 | 4 |
| | 96 | 01111111000110 | 4 | | 96 | 11001110001111 | 4 |
| | 97 | 01111111000011 | 4 | | 97 | 11001110011110 | 4 |
| | 98 | 01111110011100 | 4 | | 98 | 11001111000111 | 4 |
| | 99 | 01111110011001 | 4 | | 99 | 11001111001110 | 4 |
| | 100 | 01111110001110 | 4 | | 100 | 11001111100011 | 4 |
| | 101 | 01111110000111 | 4 | | 101 | 11000001111110 | 2 |
| | 102 | 01111100111100 | 4 | | 102 | 11000011001111 | 2 |
| | 103 | 01111100111001 | 4 | | 103 | 11000011100111 | 2 |
| | 104 | 01111100110011 | 4 | | 104 | 11000011110011 | 2 |
| | 105 | 01111100011110 | 4 | | 105 | 11000011111001 | 2 |
| | 106 | 01111100001111 | 4 | | 106 | 11000011111100 | 2 |
| | 107 | 01111001111100 | 4 | 2 (B) | 107 | 11000110001111 | 2 |
| | 108 | 01111001111001 | 4 | | 108 | 11000110011110 | 2 |
| | 109 | 01111001110011 | 4 | | 109 | 11000111000111 | 2 |
| | 110 | 01111001100111 | 4 | | 110 | 11000111001110 | 2 |
| | 111 | 01111000111110 | 4 | | 111 | 11000111100011 | 2 |
| | 112 | 01111000011111 | 4 | | 112 | 11000111100110 | 2 |
| | 113 | 01110011111100 | 4 | | 113 | 11000111110001 | 2 |
| | 114 | 01110011111001 | 4 | | 114 | 11000111111000 | 2 |
| | 115 | 01110011110011 | 4 | | 115 | 11001100001111 | 2 |
| | 116 | 01110011100111 | 4 | | 116 | 11001100011110 | 2 |
| | 117 | 01110011001111 | 4 | | 117 | 11001100110011 | 2 |
| | 118 | 01110001111110 | 4 | | 118 | 11001100111001 | 2 |
| | 119 | 01100111111100 | 4 | | 119 | 11001100111100 | 2 |
| | 120 | 01100111111001 | 4 | | 120 | 11001110000111 | 2 |
| | 121 | 01100111110011 | 4 | | 121 | 11001110001110 | 2 |
| | 122 | 01100111100111 | 4 | | 122 | 11001110011001 | 2 |
| | 123 | 01100111001111 | 4 | | 123 | 11001110011100 | 2 |
| | 124 | 01100110011111 | 4 | | 124 | 11001111000011 | 2 |
| | 125 | 01100011111110 | 4 | | 125 | 11001111000110 | 2 |
| | 126 | 01111111000111 | 6 | | 126 | 11001111001100 | 2 |
| | 127 | 01111110001111 | 6 | | 127 | 11001111100001 | 2 |
| | 128 | 01111100011111 | 6 | | 128 | 11001111110000 | 2 |
| | 129 | 00111111100000 | 0 | | 129 | 11000000011111 | 0 |
| | 130 | 00111111000001 | 0 | | 130 | 11000000111110 | 0 |
| 2 (A) | 131 | 00111110011000 | 0 | | 131 | 11000001100111 | 0 |
| | 132 | 00111110001100 | 0 | | 132 | 11000001110011 | 0 |
| | 133 | 00111110000110 | 0 | | 133 | 11000001111001 | 0 |
| | 134 | 00111110000011 | 0 | | 134 | 11000001111100 | 0 |
| | 135 | 00111100111000 | 0 | | 135 | 11000011000111 | 0 |
| | 136 | 00111100110001 | 0 | | 136 | 11000011001110 | 0 |
| | 137 | 00111100011100 | 0 | | 137 | 11000011100011 | 0 |
| | 138 | 00111100001101 | 0 | | 138 | 11000011100110 | 0 |
| | 139 | 00111100001110 | 0 | | 139 | 11000011110001 | 0 |
| | 140 | 00111100000111 | 0 | | 140 | 11000011111000 | 0 |

TABLE 17-continued (CDS ≧ 0)

| Class | 8-bit data | Modulation codes beginning with "0" | CDS | Class | 8-bit data | Modulation codes beginning with "1" | CDS |
|---|---|---|---|---|---|---|---|
| | 141 | 00111001111000 | 0 | | 141 | 11000110000111 | 0 |
| | 142 | 00111001110001 | 0 | | 142 | 11000110001110 | 0 |
| | 143 | 00111001100110 | 0 | | 143 | 11000110011001 | 0 |
| | 144 | 00111001100011 | 0 | | 144 | 11000110011100 | 0 |
| | 145 | 00111000111100 | 0 | | 145 | 11000111000011 | 0 |
| | 146 | 00111000111001 | 0 | 2 (B) | 146 | 11000111000110 | 0 |
| | 147 | 00111000110011 | 0 | | 147 | 11000111001100 | 0 |
| | 148 | 00111000011110 | 0 | | 148 | 11000111100001 | 0 |
| | 149 | 00111000001111 | 0 | | 149 | 11000111110000 | 0 |
| | 150 | 00110011111000 | 0 | | 150 | 11001100000111 | 0 |
| | 151 | 00110011110001 | 0 | | 151 | 11001100001110 | 0 |
| | 152 | 00110011100110 | 0 | | 152 | 11001100011001 | 0 |
| | 153 | 00110011100011 | 0 | | 153 | 11001100011100 | 0 |
| | 154 | 00110011001110 | 0 | | 154 | 11001100110001 | 0 |
| | 155 | 00110011000111 | 0 | | 155 | 11001100111000 | 0 |
| | 156 | 00110001111100 | 0 | | 156 | 11001110000011 | 0 |
| | 157 | 00110001111001 | 0 | | 157 | 11001110000110 | 0 |
| | 158 | 00110001110011 | 0 | | 158 | 11001110001100 | 0 |
| | 159 | 00110001100111 | 0 | | 159 | 11001110011000 | 0 |
| 2 (A) | 160 | 00110000111110 | 0 | | 160 | 11001111000001 | 0 |
| | 161 | 00110000011111 | 0 | | 161 | 11001111100000 | 0 |
| | 162 | 00111111100001 | 2 | | 162 | 11001111100110 | 4 |
| | 163 | 00111111001100 | 2 | | 163 | 11001111110001 | 4 |
| | 164 | 00111111000110 | 2 | | 164 | 11001111111000 | 4 |
| | 165 | 00111111000011 | 2 | | 165 | 11100001111110 | 4 |
| | 166 | 00111110011100 | 2 | | 166 | 11100011001111 | 4 |
| | 167 | 00111110011001 | 2 | | 167 | 11100011100111 | 4 |
| | 168 | 00111110001110 | 2 | | 168 | 11100011110011 | 4 |
| | 169 | 00111110000111 | 2 | | 169 | 11100011111001 | 4 |
| | 170 | 00111100111100 | 2 | | 170 | 11100011111100 | 4 |
| | 171 | 00111100111001 | 2 | | 171 | 11100110001111 | 4 |
| | 172 | 00111100110011 | 2 | | 172 | 11100110011110 | 4 |
| | 173 | 00111100011110 | 2 | | 173 | 11100111000111 | 4 |
| | 174 | 00111100001111 | 2 | | 174 | 11100111001110 | 4 |
| | 175 | 00111001111100 | 2 | | 175 | 11100111100011 | 4 |
| | 176 | 00111001111001 | 2 | | 176 | 11100111100110 | 4 |
| | 177 | 00111001110011 | 2 | | 177 | 11100111110001 | 4 |
| | 178 | 00111001100111 | 2 | | 178 | 11100111111000 | 4 |
| | 179 | 00111000111110 | 2 | | 179 | 11100000011111 | 2 |
| | 180 | 00111000011111 | 2 | | 180 | 11100000111110 | 2 |
| | 181 | 00110011111100 | 2 | 3 (B) | 181 | 11100001100111 | 2 |
| | 182 | 00110011111001 | 2 | | 182 | 11100001110011 | 2 |
| | 183 | 00110011110011 | 2 | | 183 | 11100001111001 | 2 |
| | 184 | 00110011100111 | 2 | | 184 | 11100001111100 | 2 |
| | 185 | 00110011001111 | 2 | | 185 | 11100011000111 | 2 |
| | 186 | 00110001111110 | 2 | | 186 | 11100011001110 | 2 |
| | 187 | 00111111100110 | 4 | | 187 | 11100011100011 | 2 |
| | 188 | 00111111100011 | 4 | | 188 | 11100011100110 | 2 |
| | 189 | 00111111001110 | 4 | | 189 | 11100011110001 | 2 |
| | 190 | 00111111000111 | 4 | | 190 | 11100011111000 | 2 |
| | 191 | 00111110011110 | 4 | | 191 | 11100110000111 | 2 |
| | 192 | 00111110001111 | 4 | | 192 | 11100110001110 | 2 |
| | 193 | 00111100111110 | 4 | | 193 | 11100110011001 | 2 |
| | 194 | 00111100011111 | 4 | | 194 | 11100110011100 | 2 |
| | 195 | 00111001111110 | 4 | | 195 | 11100111000011 | 2 |
| | 196 | 00110011111110 | 4 | | 196 | 11100111000110 | 2 |
| | 197 | 00111111100111 | 6 | | 197 | 11100111001100 | 2 |
| | 198 | 00111111001111 | 6 | | 198 | 11100111100001 | 2 |
| | 199 | 00111110011111 | 6 | | 199 | 11100111110000 | 2 |
| | 200 | 00011111110000 | 0 | | 200 | 11100000001111 | 0 |
| | 201 | 00011111100001 | 0 | | 201 | 11100000011110 | 0 |
| | 202 | 00011111001100 | 0 | | 202 | 11100000100011 | 0 |
| | 203 | 00011111000110 | 0 | | 203 | 11100000111001 | 0 |
| | 204 | 00011111000011 | 0 | | 204 | 11100000111100 | 0 |
| | 205 | 00011110011100 | 0 | | 205 | 11100001100011 | 0 |
| | 206 | 00011110011001 | 0 | | 206 | 11100001100110 | 0 |
| | 207 | 00011110001110 | 0 | | 207 | 11100001110001 | 0 |
| | 208 | 00011110000111 | 0 | | 208 | 11100001111000 | 0 |
| | 209 | 00011100111100 | 0 | 3 (B) | 209 | 11100011000011 | 0 |
| | 210 | 00011100111001 | 0 | | 210 | 11100011000110 | 0 |
| | 211 | 00011100110011 | 0 | | 211 | 11100011001100 | 0 |
| | 212 | 00011100011110 | 0 | | 212 | 11100011100001 | 0 |
| | 213 | 00011100001111 | 0 | | 213 | 11100011110000 | 0 |
| | 214 | 00011001111100 | 0 | | 214 | 11100110000011 | 0 |
| | 215 | 00011001111001 | 0 | | 215 | 11100110000110 | 0 |
| 3 (A) | 216 | 00011001110011 | 0 | | 216 | 11100110001100 | 0 |
| | 217 | 00011001100111 | 0 | | 217 | 11100110011000 | 0 |

TABLE 17-continued (CDS ≧ 0)

| Class | 8-bit data | Modulation codes beginning with "0" | CDS | Class | 8-bit data | Modulation codes beginning with "1" | CDS |
|---|---|---|---|---|---|---|---|
| | 218 | 00011000111110 | 0 | | 218 | 11100111000001 | 0 |
| | 219 | 00011000011111 | 0 | | 219 | 11100111100000 | 0 |
| | 220 | 00011111110001 | 2 | | 220 | 11110000001111 | 2 |
| | 221 | 00011111100110 | 2 | | 221 | 11110000011110 | 2 |
| | 222 | 00011111100011 | 2 | | 222 | 11110000110011 | 2 |
| | 223 | 00011111001110 | 2 | | 223 | 11110000111001 | 2 |
| | 224 | 00011111000111 | 2 | | 224 | 11110000111100 | 2 |
| | 225 | 00011110011110 | 2 | | 225 | 11110001100011 | 2 |
| | 226 | 00011110001111 | 2 | | 226 | 11110001100110 | 2 |
| | 227 | 00011100111110 | 2 | | 227 | 11110001110001 | 2 |
| | 228 | 00011100011111 | 2 | | 228 | 11110001111000 | 2 |
| | 229 | 00011001111110 | 2 | | 229 | 11110011000011 | 2 |
| | 230 | 00011111110011 | 4 | | 230 | 11110011000110 | 2 |
| | 231 | 00011111100111 | 4 | 4 (B) | 231 | 11110011001100 | 2 |
| | 232 | 00011111001111 | 4 | | 232 | 11110011100001 | 2 |
| | 233 | 00011110011111 | 4 | | 233 | 11110011110000 | 2 |
| | 234 | 00001111111000 | 0 | | 234 | 11110000000111 | 0 |
| | 235 | 00001111110001 | 0 | | 235 | 11110000001110 | 0 |
| | 236 | 00001111100110 | 0 | | 236 | 11110000011001 | 0 |
| | 237 | 00001111100011 | 0 | | 237 | 11110000011100 | 0 |
| | 238 | 00001111001110 | 0 | | 238 | 11110000110001 | 0 |
| | 239 | 00001111000111 | 0 | | 239 | 11110000111000 | 0 |
| | 240 | 00001110011110 | 0 | | 240 | 11110001100001 | 0 |
| | 241 | 00001110001111 | 0 | | 241 | 11110001110000 | 0 |
| | 242 | 00001100111110 | 0 | | 242 | 11110011000001 | 0 |
| | 243 | 00001100011111 | 0 | | 243 | 11110011100000 | 0 |
| | 244 | 00001111111001 | 2 | | 244 | 11111000000111 | 2 |
| | 245 | 00001111110011 | 2 | | 245 | 11111000011100 | 2 |
| | 246 | 00001111100111 | 2 | | 246 | 11111000110001 | 2 |
| | 247 | 00001111001111 | 2 | | 247 | 11111000111000 | 2 |
| | 248 | 00001110011111 | 2 | | 248 | 11111001110000 | 2 |
| | 249 | 00000111111100 | 0 | 5 (B) | 249 | 11111000000011 | 0 |
| | 250 | 00000111111001 | 0 | | 250 | 11111000000110 | 0 |
| | 251 | 00000111110011 | 0 | | 251 | 11111000001100 | 0 |
| 5 (A) | 252 | 00000111100111 | 0 | | 252 | 11111000011000 | 0 |
| | 253 | 00000111001111 | 0 | | 253 | 11111000110000 | 0 |
| | 254 | 00000110011111 | 0 | | 254 | 11111001100000 | 0 |
| 6 (A) | 255 | 00000011111110 | 0 | 6 (B) | 255 | 11111100000001 | 0 |

TABLE 18

(CDS ≦ 0)

| Class | 8-bit data | Modulation codes beginning with "0" | CDS | Class | 8-bit data | Modulation codes beginning with "1" | CDS |
|---|---|---|---|---|---|---|---|
| | 0 | 01111110000001 | 0 | | 0 | 10000001111110 | 0 |
| | 1 | 01111100110000 | 0 | | 1 | 10000011001111 | 0 |
| | 2 | 01111100011000 | 0 | | 2 | 10000011100111 | 0 |
| | 3 | 01111100001100 | 0 | | 3 | 10000011110011 | 0 |
| | 4 | 01111100000110 | 0 | | 4 | 10000011111001 | 0 |
| | 5 | 01111100000011 | 0 | | 5 | 10000011111100 | 0 |
| | 6 | 01111001110000 | 0 | | 6 | 10000110001111 | 0 |
| | 7 | 01111001100001 | 0 | | 7 | 10000110011110 | 0 |
| | 8 | 01111000111000 | 0 | | 8 | 10000111000111 | 0 |
| | 9 | 01111000110001 | 0 | | 9 | 10000111001110 | 0 |
| | 10 | 01111000011100 | 0 | | 10 | 10000111100011 | 0 |
| | 11 | 01111000011001 | 0 | | 11 | 10000111100110 | 0 |
| | 12 | 01111000001110 | 0 | | 12 | 10000111110001 | 0 |
| | 13 | 01111000000111 | 0 | | 13 | 10000111111000 | 0 |
| | 14 | 01110011110000 | 0 | | 14 | 10001100001111 | 0 |
| | 15 | 01110011100001 | 0 | | 15 | 10001100011110 | 0 |
| | 16 | 01110011001100 | 0 | | 16 | 10001100110011 | 0 |
| | 17 | 01110011000110 | 0 | | 17 | 10001100111001 | 0 |
| | 18 | 01110011000011 | 0 | | 18 | 10001100111100 | 0 |
| | 19 | 01110001111000 | 0 | | 19 | 10001110000111 | 0 |
| | 20 | 01110001110001 | 0 | | 20 | 10001110001110 | 0 |
| | 21 | 01110001100110 | 0 | | 21 | 10001110011001 | 0 |
| | 22 | 01110001100011 | 0 | | 22 | 10001110011100 | 0 |
| | 23 | 01110000111100 | 0 | | 23 | 10001111000011 | 0 |
| | 24 | 01110000111001 | 0 | | 24 | 10001111000110 | 0 |
| | 25 | 01110000110011 | 0 | | 25 | 10001111001100 | 0 |
| 1 (C) | 26 | 01110000011110 | 0 | 1 (D) | 26 | 10001111100001 | 0 |
| | 27 | 01110000001111 | 0 | | 27 | 10001111110000 | 0 |
| | 28 | 01100111110000 | 0 | | 28 | 10011000001111 | 0 |

TABLE 18-continued (CDS ≦ 0)

| Class | 8-bit data | Modulation codes beginning with "0" | CDS | Class | 8-bit data | Modulation codes beginning with "1" | CDS |
|---|---|---|---|---|---|---|---|
| | 29 | 01100111100001 | 0 | | 29 | 10011000011110 | 0 |
| | 30 | 01100111001100 | 0 | | 30 | 10011000110011 | 0 |
| | 31 | 01100111000110 | 0 | | 31 | 10011000111001 | 0 |
| | 32 | 01100111000011 | 0 | | 32 | 10011000111100 | 0 |
| | 33 | 01100110011100 | 0 | | 33 | 10011001100011 | 0 |
| | 34 | 01100110011001 | 0 | | 34 | 10011001100110 | 0 |
| | 35 | 01100110001110 | 0 | | 35 | 10011001110001 | 0 |
| | 36 | 01100110000111 | 0 | | 36 | 10011001111000 | 0 |
| | 37 | 01100011111000 | 0 | | 37 | 10011100000111 | 0 |
| | 38 | 01100011110001 | 0 | | 38 | 10011100001110 | 0 |
| | 39 | 01100011100110 | 0 | | 39 | 10011100011001 | 0 |
| | 40 | 01100011100011 | 0 | | 40 | 10011100011100 | 0 |
| | 41 | 01100011001110 | 0 | | 41 | 10011100110001 | 0 |
| | 42 | 01100011000111 | 0 | | 42 | 10011100111000 | 0 |
| | 43 | 01100001111100 | 0 | | 43 | 10011110000011 | 0 |
| | 44 | 01100001111001 | 0 | | 44 | 10011110000110 | 0 |
| | 45 | 01100001110011 | 0 | | 45 | 10011110001100 | 0 |
| | 46 | 01100001100111 | 0 | | 46 | 10011110011000 | 0 |
| | 47 | 01100000111110 | 0 | | 47 | 10011111000001 | 0 |
| | 48 | 01100000011111 | 0 | | 48 | 10011111100000 | 0 |
| | 49 | 01111100000001 | −2 | | 49 | 10000000111110 | −2 |
| | 50 | 01111001100000 | −2 | | 50 | 10000001100111 | −2 |
| | 51 | 01111000110000 | −2 | | 51 | 10000001110011 | −2 |
| | 52 | 01111000011000 | −2 | | 52 | 10000001111001 | −2 |
| | 53 | 01111000001100 | −2 | | 53 | 10000001111100 | −2 |
| | 54 | 01111000000110 | −2 | | 54 | 10000011000111 | −2 |
| | 55 | 01111000000011 | −2 | | 55 | 10000011001110 | −2 |
| | 56 | 01110011100000 | −2 | | 56 | 10000011100011 | −2 |
| | 57 | 01110001000001 | −2 | | 57 | 10000011100110 | −2 |
| | 58 | 01110001110000 | −2 | | 58 | 10000011110001 | −2 |
| | 59 | 01110001100001 | −2 | | 59 | 10000011111000 | −2 |
| | 60 | 01110000111000 | −2 | | 60 | 10000110000111 | −2 |
| | 61 | 01110000110001 | −2 | 61 | 10000110001110 | −2 |
| | 62 | 01110000011100 | −2 | | 62 | 10000110011001 | −2 |
| | 63 | 01110000011001 | −2 | | 63 | 10000110011100 | −2 |
| | 64 | 01110000001110 | −2 | | 64 | 10000111000011 | −2 |
| | 65 | 01110000000111 | −2 | | 65 | 10000111000110 | −2 |
| | 66 | 01100111100000 | −2 | | 66 | 10000111001100 | −2 |
| | 67 | 01100111000001 | −2 | | 67 | 10000111100001 | −2 |
| | 68 | 01100110011000 | −2 | | 68 | 10000111110000 | −2 |
| | 69 | 01100110001100 | −2 | | 69 | 10001100000111 | −2 |
| | 70 | 01100110000110 | −2 | | 70 | 10001100001110 | −2 |
| | 71 | 01100110000011 | −2 | | 71 | 10001100011001 | −2 |
| | 72 | 01100011110000 | −2 | | 72 | 10001100011100 | −2 |
| | 73 | 01100011100001 | −2 | | 73 | 10001100110001 | −2 |
| | 74 | 01100011001100 | −2 | | 74 | 10001100111000 | −2 |
| | 75 | 01100011000110 | −2 | | 75 | 10001110000011 | −2 |
| | 76 | 01100011000011 | −2 | | 76 | 10001110000110 | −2 |
| | 77 | 01100001111000 | −2 | | 77 | 10001110001100 | −2 |
| 1 (C) | 78 | 01100001110001 | −2 | | 78 | 10001110011000 | −2 |
| | 79 | 01100001100110 | −2 | | 79 | 10001111000001 | −2 |
| | 80 | 01100001100011 | −2 | | 80 | 10001111100000 | −2 |
| | 81 | 01100000111100 | −2 | | 81 | 10011000000111 | −2 |
| | 82 | 01100000111001 | −2 | | 82 | 10011000001110 | −2 |
| | 83 | 01100000110011 | −2 | | 83 | 10011000011001 | −2 |
| | 84 | 01100000011110 | −2 | | 84 | 10011000011100 | −2 |
| | 85 | 01100000001111 | −2 | | 85 | 10011000110001 | −2 |
| | 86 | 01100000111000 | −4 | | 86 | 10011000111000 | −2 |
| | 87 | 00111100000001 | −4 | 1 (D) | 87 | 10011001100001 | −2 |
| | 88 | 00111001100000 | −4 | | 88 | 10011001110000 | −2 |
| | 89 | 00111000110000 | −4 | | 89 | 10011100000011 | −2 |
| | 90 | 00111000011000 | −4 | | 90 | 10011100000110 | −2 |
| | 91 | 00111000001100 | −4 | | 91 | 10011100001100 | −2 |
| | 92 | 00111000000110 | −4 | | 92 | 10011100011000 | −2 |
| | 93 | 00111000000011 | −4 | | 93 | 10011100110000 | −2 |
| | 94 | 00110011100000 | −4 | | 94 | 10011110000001 | −2 |
| | 95 | 00110011000001 | −4 | | 95 | 10000000110011 | −4 |
| | 96 | 00110001110000 | −4 | | 96 | 10000000111001 | −4 |
| | 97 | 00110001100001 | −4 | | 97 | 10000000111100 | −4 |
| | 98 | 00110000111000 | −4 | | 98 | 10000001100011 | −4 |
| | 99 | 00110000110001 | −4 | | 99 | 10000001100110 | −4 |
| 2(C) | 100 | 00110000011100 | −4 | | 100 | 10000001110001 | −4 |
| | 101 | 00111110000001 | −2 | | 101 | 10000001111000 | −4 |
| | 102 | 00111100110000 | −2 | | 102 | 10000011000011 | −4 |
| | 103 | 00111100011000 | −2 | | 103 | 10000011000110 | −4 |
| | 104 | 00111100001100 | −2 | | 104 | 10000011001100 | −4 |
| | 105 | 00111100000110 | −2 | | 105 | 10000011100001 | −4 |

TABLE 18-continued (CDS ≦ 0)

| Class | 8-bit data | Modulation codes beginning with "0" | CDS | Class | 8-bit data | Modulation codes beginning with "1" | CDS |
|---|---|---|---|---|---|---|---|
| | 106 | 00111100000011 | −2 | | 106 | 10000011110000 | −4 |
| | 107 | 00111001110000 | −2 | | 107 | 10000110000011 | −4 |
| | 108 | 00111001100001 | −2 | | 108 | 10000110000110 | −4 |
| | 109 | 00111000111000 | −2 | | 109 | 10000110001100 | −4 |
| | 110 | 00111000110001 | −2 | | 110 | 10000110011000 | −4 |
| | 111 | 00111000011100 | −2 | | 111 | 10000111000001 | −4 |
| | 112 | 00111000011001 | −2 | | 112 | 10000111100000 | −4 |
| | 113 | 00111000001110 | −2 | | 113 | 10001100000011 | −4 |
| | 114 | 00111000000111 | −2 | | 114 | 10001100000110 | −4 |
| | 115 | 00110011110000 | −2 | | 115 | 10001100001100 | −4 |
| | 116 | 00110011100001 | −2 | | 116 | 10001100011000 | −4 |
| | 117 | 00110011001100 | −2 | | 117 | 10001100110000 | −4 |
| | 118 | 00110011000110 | −2 | | 118 | 10001110000001 | −4 |
| | 119 | 00110011000011 | −2 | | 119 | 10011000000011 | −4 |
| | 120 | 00110001111000 | −2 | | 120 | 10011000000110 | −4 |
| | 121 | 00110001100001 | −2 | | 121 | 10011000001100 | −4 |
| | 122 | 00110001100110 | −2 | | 122 | 10011000011000 | −4 |
| | 123 | 00110001100011 | −2 | | 123 | 10011000110000 | −4 |
| | 124 | 00110000111100 | −2 | | 124 | 10011001100000 | −4 |
| | 125 | 00110000111001 | −2 | | 125 | 10011100000001 | −4 |
| | 126 | 00110000100011 | −2 | | 126 | 10000000111000 | −6 |
| | 127 | 00110000011110 | −2 | | 127 | 10000001110000 | −6 |
| | 128 | 00110000001111 | −2 | | 128 | 10000011100000 | −6 |
| | 129 | 00111111100000 | 0 | | 129 | 11000000011111 | 0 |
| | 130 | 00111111000001 | 0 | | 130 | 11000000111110 | 0 |
| | 131 | 00111110011000 | 0 | 2 (D) | 131 | 11000001100111 | 0 |
| | 132 | 00111110001100 | 0 | | 132 | 11000001110011 | 0 |
| | 133 | 00111110000110 | 0 | | 133 | 11000001111001 | 0 |
| | 134 | 00111110000011 | 0 | | 134 | 11000001111100 | 0 |
| | 135 | 00111100111000 | 0 | | 135 | 11000011000111 | 0 |
| | 136 | 00111100110001 | 0 | | 136 | 11000011001110 | 0 |
| | 137 | 00111100011100 | 0 | | 137 | 11000011100011 | 0 |
| | 138 | 00111100011001 | 0 | | 138 | 11000011100110 | 0 |
| | 139 | 00111100001110 | 0 | | 139 | 11000011110001 | 0 |
| | 140 | 00111100000111 | 0 | | 140 | 11000011111000 | 0 |
| | 141 | 00111001111000 | 0 | | 141 | 11000110000111 | 0 |
| | 142 | 00111001110001 | 0 | | 142 | 11000110001110 | 0 |
| | 143 | 00111001100110 | 0 | | 143 | 11000110011001 | 0 |
| | 144 | 00111001100011 | 0 | | 144 | 11000110011100 | 0 |
| | 145 | 00111000111100 | 0 | | 145 | 11000111000011 | 0 |
| | 146 | 00111000111001 | 0 | | 146 | 11000111000110 | 0 |
| | 147 | 00111000110011 | 0 | | 147 | 11000111001100 | 0 |
| 2 (C) | 148 | 00111000011110 | 0 | | 148 | 11000111100001 | 0 |
| | 149 | 00111000001111 | 0 | | 149 | 11000111110000 | 0 |
| | 150 | 00110011111000 | 0 | | 150 | 11001100000111 | 0 |
| | 151 | 00110011110001 | 0 | | 151 | 11001100001110 | 0 |
| | 152 | 00110011100110 | 0 | | 152 | 11001100011001 | 0 |
| | 153 | 00110011100011 | 0 | | 153 | 11001100011100 | 0 |
| | 154 | 00110011001110 | 0 | | 154 | 11001100110001 | 0 |
| | 155 | 00110011000111 | 0 | | 155 | 11001100111000 | 0 |
| | 156 | 00110001111100 | 0 | | 156 | 11001110000011 | 0 |
| | 157 | 00110001111001 | 0 | 2 (D) | 157 | 11001110000110 | 0 |
| | 158 | 00110001110011 | 0 | | 158 | 11001110001100 | 0 |
| | 159 | 00110001100111 | 0 | | 159 | 11001110011000 | 0 |
| | 160 | 00110000111110 | 0 | | 160 | 11001111000001 | 0 |
| | 161 | 00110000011111 | 0 | | 161 | 11001111100000 | 0 |
| | 162 | 00110000011001 | −4 | | 162 | 11000000011110 | −2 |
| | 163 | 00110000001110 | −4 | | 163 | 11000000110011 | −2 |
| | 164 | 00110000000111 | −4 | | 164 | 11000000111001 | −2 |
| | 165 | 00011110000001 | −4 | | 165 | 11000000111100 | −2 |
| | 166 | 00011100110000 | −4 | | 166 | 11000001100011 | −2 |
| | 167 | 00011100011000 | −4 | | 167 | 11000001100110 | −2 |
| | 168 | 00011100001100 | −4 | | 168 | 11000001110001 | −2 |
| | 169 | 00011100000110 | −4 | | 169 | 11000001111000 | −2 |
| | 170 | 00011100000011 | −4 | | 170 | 11000011000011 | −2 |
| | 171 | 00011001110000 | −4 | | 171 | 11000011000110 | −2 |
| | 172 | 00011001100001 | −4 | | 172 | 11000011001100 | −2 |
| | 173 | 00011000111000 | −4 | | 173 | 11000011100001 | −2 |
| | 174 | 00011000110001 | −4 | | 174 | 11000011110000 | −2 |
| | 175 | 00011000011100 | −4 | | 175 | 11000110000011 | −2 |
| | 176 | 00011000011001 | −4 | | 176 | 11000110000110 | −2 |
| | 177 | 00011000001110 | −4 | | 177 | 11000110001100 | −2 |
| 3 (C) | 178 | 00011000000111 | −4 | | 178 | 11000110011000 | −2 |
| | 179 | 00011111100000 | −2 | | 179 | 11000111000001 | −2 |
| | 180 | 00011111000001 | −2 | | 180 | 11000111100000 | −2 |
| | 181 | 00011110011000 | −2 | | 181 | 11001100000011 | −2 |
| | 182 | 00011110001100 | −2 | | 182 | 11001100000110 | −2 |

TABLE 18-continued (CDS ≦ 0)

| Class | 8-bit data | Modulation codes beginning with "0" | CDS | Class | 8-bit data | Modulation codes beginning with "1" | CDS |
|---|---|---|---|---|---|---|---|
| | 183 | 000111100000110 | −2 | | 183 | 11001100001100 | −2 |
| | 182 | 000111110000011 | −2 | | 184 | 11001100011000 | −2 |
| | 185 | 000111100111000 | −2 | | 185 | 11001100110000 | −2 |
| | 186 | 000111100110001 | −2 | | 186 | 11001110000001 | −2 |
| | 187 | 000111100011100 | −2 | | 187 | 11000000011001 | −4 |
| | 188 | 000111100011001 | −2 | | 188 | 11000000011100 | −4 |
| | 189 | 000111100001110 | −2 | | 189 | 11000000110001 | −4 |
| | 190 | 000111100000111 | −2 | | 190 | 11000000111000 | −4 |
| | 191 | 000110011111000 | −2 | | 191 | 11000001100001 | −4 |
| | 192 | 000110011110001 | −2 | | 192 | 11000001110000 | −4 |
| | 193 | 000110011100110 | −2 | | 193 | 11000011000001 | −4 |
| | 194 | 000110011100011 | −2 | | 194 | 11000011100000 | −4 |
| | 195 | 000110001111100 | −2 | | 195 | 11000110000001 | −4 |
| | 196 | 000110001111001 | −2 | | 196 | 11001100000001 | −4 |
| | 197 | 000110001100011 | −2 | | 197 | 11000000011000 | −6 |
| | 198 | 000110000111110 | −2 | | 198 | 11000000110000 | −6 |
| | 199 | 000110000001111 | −2 | | 199 | 11000001100000 | −6 |
| | 200 | 000111111110000 | 0 | | 200 | 11100000001111 | 0 |
| | 201 | 000111111100001 | 0 | | 201 | 11100000011110 | 0 |
| | 202 | 000111111001100 | 0 | | 202 | 11100000110011 | 0 |
| | 203 | 000111111000110 | 0 | | 203 | 11100000111001 | 0 |
| | 204 | 000111111000011 | 0 | | 204 | 11100000111100 | 0 |
| | 205 | 000111110011100 | 0 | | 205 | 11100001100011 | 0 |
| | 206 | 000111110011001 | 0 | | 206 | 11100001100110 | 0 |
| | 207 | 000111110001110 | 0 | | 207 | 11100001110001 | 0 |
| | 208 | 000111110000111 | 0 | | 208 | 11100001111000 | 0 |
| 3 (C) | 209 | 000111100111100 | 0 | | 209 | 11100011000011 | 0 |
| | 210 | 000111100111001 | 0 | | 210 | 11100011000110 | 0 |
| | 211 | 000111100110011 | 0 | | 211 | 11100011001100 | 0 |
| | 212 | 000111100011110 | 0 | | 212 | 11100011100001 | 0 |
| | 213 | 000111100001111 | 0 | | 213 | 11100011110000 | 0 |
| | 214 | 000110011111100 | 0 | | 214 | 11100110000011 | 0 |
| | 215 | 000110011111001 | 0 | | 215 | 11100110000110 | 0 |
| | 216 | 000110011110011 | 0 | | 216 | 11100110001100 | 0 |
| | 217 | 000110011100111 | 0 | 3 (D) | 217 | 11100110011000 | 0 |
| | 218 | 000110001111110 | 0 | | 218 | 11100111000001 | 0 |
| | 219 | 000110000011111 | 0 | | 219 | 11100111100000 | 0 |
| | 220 | 000011111110000 | −2 | | 220 | 11100000001110 | −2 |
| | 221 | 000011111100001 | −2 | | 221 | 11100000011001 | −2 |
| | 222 | 000011111001100 | −2 | | 222 | 11100000011100 | −2 |
| | 223 | 000011111000110 | −2 | | 223 | 11100000110001 | −2 |
| | 224 | 000011111000011 | −2 | | 224 | 11100000111000 | −2 |
| | 225 | 000011100011100 | −2 | | 225 | 11100001100001 | −2 |
| | 226 | 000011100011001 | −2 | | 226 | 11100001110000 | −2 |
| | 227 | 000011100001110 | −2 | | 227 | 11100011000001 | −2 |
| | 228 | 000011100000111 | −2 | | 228 | 11100011100000 | −2 |
| | 229 | 000011001111100 | −2 | | 229 | 11100110000001 | −2 |
| | 230 | 000011001111001 | −2 | | 230 | 11100000001100 | −4 |
| 4 (C) | 231 | 000011001110011 | −2 | | 231 | 11100000011000 | −4 |
| | 232 | 000011001001110 | −2 | | 232 | 11100000110000 | −4 |
| | 233 | 000011000001111 | −2 | | 233 | 11100001100000 | −4 |
| | 234 | 000011111111000 | 0 | | 234 | 11110000000111 | 0 |
| | 235 | 000011111110001 | 0 | | 235 | 11110000001110 | 0 |
| | 236 | 000011111100110 | 0 | | 236 | 11110000011001 | 0 |
| | 237 | 000011111100011 | 0 | | 237 | 11110000011100 | 0 |
| | 238 | 000011111001110 | 0 | | 238 | 11110000110001 | 0 |
| | 239 | 000011111000111 | 0 | | 239 | 11110000111000 | 0 |
| | 240 | 000011100011110 | 0 | | 240 | 11110001100001 | 0 |
| | 241 | 000011100001111 | 0 | | 241 | 11110001110000 | 0 |
| | 242 | 000011100111110 | 0 | | 242 | 11110011000001 | 0 |
| | 243 | 000011100011111 | 0 | | 243 | 11110011100000 | 0 |
| | 244 | 000001111111000 | −2 | | 244 | 11110000000110 | −2 |
| | 245 | 000001111100011 | −2 | | 244 | 11110000001100 | −2 |
| | 246 | 000001110011110 | −2 | | 246 | 11110000011000 | −2 |
| | 247 | 000001110000111 | −2 | | 247 | 11110000110000 | −2 |
| 5 (C) | 248 | 000000110001111 | −2 | | 248 | 11110001100000 | −2 |
| | 249 | 000000111111100 | 0 | | 249 | 11111000000011 | 0 |
| | 250 | 000000111111001 | 0 | | 250 | 11111000000110 | 0 |
| | 251 | 000000111110011 | 0 | 5 (D) | 251 | 11111000001100 | 0 |
| | 252 | 000000111100111 | 0 | | 252 | 11111000011000 | 0 |
| | 253 | 000000111001111 | 0 | | 253 | 11111000110000 | 0 |
| | 254 | 000000110011111 | 0 | | 254 | 11111001100000 | 0 |
| 6 (C) | 255 | 000000011111110 | 0 | 6 (D) | 255 | 11111100000001 | 0 |

Types of the modulation codes that are allowed to take place according to the end pattern of the preceding modulation code are shown in Table 19.

code, and selects the modulation code the DSV of which gives the least absolute value. As a result, the maximum value of the absolute value of the end DSV

TABLE 19

| | Consecutive number of "0" bits at the beginning of modulation code | | | | | | Consecutive number of "1" bits at the beginning of modulation code | | | | | |
|---|---|---|---|---|---|---|---|---|---|---|---|---|
| End pattern of the preceding modulation codes | | | | | | | | | | | | |
| CDS≥0 | 1 (A) | 2 (A) | 3 (A) | 4 (A) | 5 (A) | 6 (A) | 1 (B) | 2 (B) | 3 (B) | 4 (B) | 5 (B) | 6 (B) |
| CDS≤0 | 1 (C) | 2 (C) | 3 (C) | 4 (C) | 5 (C) | 6 (C) | 1 (D) | 2 (D) | 3 (D) | 4 (D) | 5 (D) | 6 (D) |
| 110 | o | o | o | o | o | o | | | | | | |
| 1100 | o | o | o | o | o | | | o | o | o | o | o |
| 11000 | o | o | o | o | | | | o | o | o | o | o |
| 110000 | o | o | o | | | | | o | o | o | o | o |
| 1100000 | o | o | | | | | | o | o | o | o | o |
| 001 | | | | | | | o | o | o | o | o | o |
| 0011 | | o | o | o | o | o | o | o | o | o | o | |
| 00111 | | o | o | o | o | o | o | o | o | | | |
| 001111 | | o | o | o | o | o | o | o | | | | |
| 0011111 | | o | o | o | o | o | o | | | | | |

"o" mark indicates that the modulation codes are allowed.

For example, when the end pattern of the preceding modulation code is "...11000", and the end DSV of the preceding modulation code is −4, the modulation codes of classes 1(A), 2(A), 3(A), 4(A), 2(B), 3(B), 4(B), 5(B) and (6B) in Table 17 can take place as a current modulation code.

In this case, suppose that the current 8-bit data is "166". Then, one of the two possible modulation codes "00111110011100" (CDS=2; 2(A)), and "11100011001111" (CDS=4; 2(B)) is selected: the end DSV at the end of the preceding modulation code and the CDS of the current modulation code are added so as to obtain the end DSV at the end of the current modulation code; the modulation code which will give less DSV is selected, that is, the modulation code "11100011001111" (CDS=4) is selected. The resultant DSV is 0 and it indicates that the direct current component is removed.

FIG. 3A shows the CNR (carrier-to-noise ratio) characteristics when a sine wave recorded on magnetic tape is reproduced, FIG. 3B shows the power spectrum at the output terminal of the modulator of the embodiment when random 8-bit data are inputted to the modulator, and FIG. 3C shows the power spectrum of the scrambled NRZ at the output terminal of the scrambled NRZ modulator when random 8-bit data are inputted to the scrambled NRZ modulator.

As described above, the embodiment restricts the number of consecutive identical bits in a stream of modulation codes to 2–7. As a result, the minimum magnetization transition width is 1.14 T (=(2×8)T/14, where T is the bit period of the 8-bit data), the maximum magnetization transition width is 4.00 T (=(7×8)T/14), DR is 1.14 (=(2×8)/14), and the ratio of the maximum magnetization transition width to the minimum magnetization transition width is 3.5. Consequently, the bit error rate of the magnetic recording is reduced, and the high-density recording becomes possible. In addition, azimuth recording and high quality over-writing become possible.

Furthermore, the embodiment restricts the absolute value of CDS of the modulation codes equal to or less than 6, allocates up to 4 modulation codes to each 8-bit data according to the DSV at the end of the preceding modulation code and the end pattern of the preceding can be restricted within 4. Thus, the direct current component can be effectively removed, and hence, the transmission of the modulation codes becomes possible by using a rotary transformer that does not pass the direct current component.

Although specific embodiments of a digital modulation method in accordance with the present invention have been disclosed, it is not intended that the invention be restricted to either the specific configurations or the uses disclosed herein. Modifications may be made in a manner obvious to those skilled in the art. Accordingly, it is intended that the invention be limited only by the scope of the appended claims.

What is claimed is:

1. A digital modulation method for converting 8-bit digital data into 14-bit digital modulation codes, said digital modulation method comprising:

step 1 for selecting up to four 14-bit digital modulation codes for each 8-bit digital data, said 14-bit digital modulation code is selected by the procedures of (a) selecting among the $2^{14}$ 14-bit digital codes, a digital code the numbers of consecutive identical bits in which are 5 or less in the first 6 bits, 2–7 from the second bit to 13th bit, and 6 or less in the last 7 bits, the absolute value of CDS (code word digital sum) of the selected digital code being 4 or less, and repeating this selecting procedure, (b) selecting among the selected 14-bit digital codes at the procedure (a), a digital code the first bit of which is "0", and the value of CDS of which is 0, and pairing the selected 14-bit digital code with the reversal code thereof to make the 2 digital codes one group, or selecting among the selected 14-bit digital codes at the procedure (a), a digital code the first bit of which is "1", and the value of CDS of which is +2 or +4, combining the selected 14-bit digital codes with the reversal codes thereof, and further combining the two 14-bit digital codes with a pair of 14-bit digital codes selected at the above procedure to make the 4 digital codes one group, and repeating this selecting procedure, (c) selecting among the selected 14-bit digital codes at the procedure (a), a digital code the first bit of which is "0", and the value of CDS of which is +2, and another digital code the first bit of which is "1", and the value of CDS of which is +2 or +4, and combining the two selected 14-bit digital codes with the reversal codes thereof to make the 4 digital codes one group, and repeating this selecting procedure, (d) selecting among the selected 14-bit digital codes at the procedure (a), a digital code the first bit of which is "0", and the value of CDS of which is +4, and another digital code the first bit of which is "1", and the value of CDS of which is +2, and combining the two selected 14-bit digital codes with the reversal codes thereof to make the 4 digital codes one group, and repeating this selecting procedure, and (e) selecting 256 groups among the groups formed in the above procedures as the 14-bit digital modulation codes;

step 2 for selecting one group of 14-bit digital modulation codes among the 256 groups of the 14-bit digital modulation codes, the selected group corresponding to inputted 8-bit digital data;

step 3 for further selecting one or more 14-bit digital modulation codes in the selected group at step 2, each of the 14-bit digital modulation codes satisfying the requirement that the number of consecutive identical bits at the joint portion of the preceding 14-bit digital modulation code already selected and the 14-bit digital modulation code to be selected is 2–7; and step 4 for further selecting one 14-bit digital modulation code among the selected modulation codes at step 3 so that said one 14-bit bit digital modulation code satisfies the requirement that the absolute value of bit DSV (Digital Sum Value) for each bit in the modulation code is equal to or less than 7.

2. A digital modulation method as claimed in claim 1, wherein said step 3 comprises the procedures of:

selecting any one of the digital modulation codes the first bits of which are "01", "001", "0001", "00001", and "000001" when the preceding digital modulation code that has already been selected terminates with "10";

selecting any one of the digital modulation codes the first bits of which are "10", "110", "1110", "11110", and "111110" when the preceding digital modulation code that has already been selected terminates with "01";

selecting any one of the digital modulation codes the first bits of which are "110", "1110", "11110", "111110", "01", "001", "0001", "00001", and "000001" when the preceding digital modulation code that has already been selected terminates with "100";

selecting any one of the digital modulation codes the first bits of which are "001", "0001", "00001", "000001", "10", "110", "1110", "11110", and "111110" when the preceding digital modulation code that has already been selected terminates with "011";

selecting any one of the digital modulation codes the first bits of which are "110", "1110", "11110", "111110", "01", "001", "0001", and "00001" when the preceding digital modulation code that has already been selected terminates with "1000";

selecting any one of the digital modulation codes the first bits of which are "001", "0001", "00001", "000001", "10", "110", "1110", and "11110" when the preceding digital modulation code that has already been selected terminates with "0111";

selecting any one of the digital modulation codes the first bits of which are "110", "1110", "11110", "111110", "01", "001", and "0001" when the preceding digital modulation code that has already been selected terminates with "10000";

selecting any one of the digital modulation codes the first bits of which are "001", "0001", "00001", "000001", "10", "110", and "1110" when the preceding digital modulation code that has already been selected terminates with "01111";

selecting any one of the digital modulation codes the first bits of which are "110", "1110", "11110", "111110", "01", and "001" when the preceding digital modulation code that has already been selected terminates with "100000";

selecting any one of the digital modulation codes the first bits of which are "001", "0001", "00001", "000001", "10", and "110" when the preceding digital modulation code that has already been selected terminates with "011111";

selecting any one of the digital modulation codes the first bits of which are "110", "1110", "11110", "111110", and "01" when the preceding digital modulation code that has already been selected terminates with "1000000"; and selecting any one of the digital modulation codes the first bits of which are "001", "0001", "00001", "000001", and "10" when the preceding digital modulation code that has already been selected terminates with "0111111".

3. A digital modulation method as claimed in claim 1, wherein said step 4 comprises the procedures of:

selecting any one of the digital modulation codes the CDS of which are 0, −2 and −4, when the DSV at the end of the preceding 14-bit digital modulation Code that has already been selected is +2;

selecting any one of the digital modulation codes the CDS of which are +2, 0 and −2, when the DSV at the end of the preceding 14-bit digital modulation code that has already been selected is 0; and selecting any one of the digital modulation codes the CDS of which are +4, +2, and 0 when the DSV at the end of the preceding 14-bit digital modulation code that has already been selected is −2.

4. A digital modulation method as claimed in claim 1, wherein said digital modulation codes obtained at step 1 are the codes described in the following Tables 4 and 5, or the codes obtained by substituting a part of Table 4 by the following Table 12, or the codes obtained by substituting a part of Table 5 by the following Table 13.

TABLE 4

| | | | (CDS ≧ 0) | | | | | |
|---|---|---|---|---|---|---|---|---|
| Class | 8-bit data | Modulation codes beginning with "0" | CDS | | Class | 8-bit data | Modulation codes beginning with "1" | CDS |
| 1 (A) | 0 | 01111110000001 | 0 | | 1 (B) | 0 | 10000001111110 | 0 |
| | 1 | 01111100110000 | 0 | | | 1 | 10000011001111 | 0 |

TABLE 4-continued (CDS ≧ 0)

| Class | 8-bit data | Modulation codes beginning with "0" | CDS | Class | 8-bit data | Modulation codes beginning with "1" | CDS |
|---|---|---|---|---|---|---|---|
| | 2 | 01111100011000 | 0 | | 2 | 10000011100111 | 0 |
| | 3 | 01111100001100 | 0 | | 3 | 10000011110011 | 0 |
| | 4 | 01111100000110 | 0 | | 4 | 10000011111001 | 0 |
| | 5 | 01111100000011 | 0 | | 5 | 10000011111100 | 0 |
| | 6 | 01111001110000 | 0 | | 6 | 10000110001111 | 0 |
| | 7 | 01111001100001 | 0 | | 7 | 10000110011110 | 0 |
| | 8 | 01111000111000 | 0 | | 8 | 10000111000111 | 0 |
| | 9 | 01111000110001 | 0 | | 9 | 10000111001110 | 0 |
| | 10 | 01111000011100 | 0 | | 10 | 10000111100011 | 0 |
| | 11 | 01111000011001 | 0 | | 11 | 10000111100110 | 0 |
| | 12 | 01111000001110 | 0 | | 12 | 10000111110001 | 0 |
| | 13 | 01111000000111 | 0 | | 13 | 10000111111000 | 0 |
| | 14 | 01110011110000 | 0 | | 14 | 10001100001111 | 0 |
| | 15 | 01110011100001 | 0 | | 15 | 10001100011110 | 0 |
| | 16 | 01110011001100 | 0 | | 16 | 10001100110011 | 0 |
| | 17 | 01110011000110 | 0 | | 17 | 10001100111001 | 0 |
| | 18 | 01110011000011 | 0 | | 18 | 10001100111100 | 0 |
| | 19 | 01110001111000 | 0 | | 19 | 10001110000111 | 0 |
| | 20 | 01110001110001 | 0 | | 20 | 10001110001110 | 0 |
| | 21 | 01110001100110 | 0 | | 21 | 10001110011001 | 0 |
| | 22 | 01110001100011 | 0 | | 22 | 10001110011100 | 0 |
| | 23 | 01110000111100 | 0 | | 23 | 10001111000011 | 0 |
| | 24 | 01110000111001 | 0 | | 24 | 10001111000110 | 0 |
| | 25 | 01110000110011 | 0 | | 25 | 10001111001100 | 0 |
| | 26 | 01110000011110 | 0 | | 26 | 10001111100001 | 0 |
| | 27 | 01110000001111 | 0 | | 27 | 10001111110000 | 0 |
| | 28 | 01100111110000 | 0 | | 28 | 10011000001111 | 0 |
| | 29 | 01100111100001 | 0 | | 29 | 10011000011110 | 0 |
| | 30 | 01100111001100 | 0 | | 30 | 10011000110011 | 0 |
| | 31 | 01100111000110 | 0 | | 31 | 10011000111001 | 0 |
| | 32 | 01100111000011 | 0 | | 32 | 10011000111100 | 0 |
| | 33 | 01100110011100 | 0 | | 33 | 10011001100011 | 0 |
| | 34 | 01100110011001 | 0 | | 34 | 10011001100110 | 0 |
| | 35 | 01100110001110 | 0 | | 35 | 10011001110001 | 0 |
| | 36 | 01100110000111 | 0 | | 36 | 10011001111000 | 0 |
| | 37 | 01100011111000 | 0 | | 37 | 10011100000111 | 0 |
| | 38 | 01100011110001 | 0 | | 38 | 10011100001110 | 0 |
| | 39 | 01100011100110 | 0 | | 39 | 10011100011001 | 0 |
| | 40 | 01100011100011 | 0 | | 40 | 10011100011100 | 0 |
| | 41 | 01100011001110 | 0 | | 41 | 10011100110001 | 0 |
| | 42 | 01100011000111 | 0 | | 42 | 10011100111000 | 0 |
| | 43 | 01100001111100 | 0 | | 43 | 10011110000011 | 0 |
| | 44 | 01100001111001 | 0 | | 44 | 10011110000110 | 0 |
| | 45 | 01100001110011 | 0 | | 45 | 10011110001100 | 0 |
| | 46 | 01100001100111 | 0 | | 46 | 10011110011000 | 0 |
| | 47 | 01100000111110 | 0 | | 47 | 10011111000001 | 0 |
| | 48 | 01100000011111 | 0 | | 48 | 10011111100000 | 0 |
| | 49 | 01111111001100 | 4 | | 49 | 10000011111110 | 2 |
| | 50 | 01111111000110 | 4 | | 50 | 10000110011111 | 2 |
| | 51 | 01111111000011 | 4 | | 51 | 10000111001111 | 2 |
| | 52 | 01111110011100 | 4 | | 52 | 10000111100111 | 2 |
| | 53 | 01111110011001 | 4 | | 53 | 10000111110011 | 2 |
| | 54 | 01111110001110 | 4 | | 54 | 10000111111001 | 2 |
| | 55 | 01111110000111 | 4 | | 55 | 10000111111100 | 2 |
| | 56 | 01111100111100 | 4 | | 56 | 10001100011111 | 2 |
| | 57 | 01111100111001 | 4 | | 57 | 10001100111110 | 2 |
| | 58 | 01111100110011 | 4 | | 58 | 10001110001111 | 2 |
| | 59 | 01111100011110 | 4 | | 59 | 10001110011110 | 2 |
| | 60 | 01111100001111 | 4 | | 60 | 10001111000111 | 2 |
| | 61 | 01111001111100 | 4 | | 61 | 10000111001110 | 2 |
| | 62 | 01111001111001 | 4 | | 62 | 10001111100011 | 2 |
| | 63 | 01111001110011 | 4 | | 63 | 10001111100110 | 2 |
| | 64 | 01111001100111 | 4 | | 64 | 10001111110001 | 2 |
| | 65 | 01111000111110 | 4 | | 65 | 10001111111000 | 2 |
| | 66 | 01111000011111 | 4 | | 66 | 10011000011111 | 2 |
| | 67 | 01110011111100 | 4 | | 67 | 10011000111110 | 2 |
| | 68 | 01110011111001 | 4 | | 68 | 10011001100111 | 2 |
| | 69 | 01110011110011 | 4 | | 69 | 10011001110011 | 2 |
| | 70 | 01110011100111 | 4 | | 70 | 10011001111001 | 2 |
| | 71 | 01110011001111 | 4 | | 71 | 10011001111100 | 2 |
| | 72 | 01110001111110 | 4 | | 72 | 10011100001111 | 2 |
| | 73 | 01110000111111 | 4 | | 73 | 10011100011110 | 2 |
| | 74 | 01100111111100 | 4 | | 74 | 10011100110011 | 2 |
| | 75 | 01100111111001 | 4 | | 75 | 10011100111001 | 2 |
| | 76 | 01100111110011 | 4 | | 76 | 10011100111100 | 2 |
| | 77 | 01100111100111 | 4 | | 77 | 10011110000111 | 2 |
| | 78 | 01100111001111 | 4 | | 78 | 10011110001110 | 2 |
| | 79 | 01100110011111 | 4 | | 79 | 10011110011001 | 2 |
| | 80 | 01100011111110 | 4 | | 80 | 10011110011100 | 2 |

TABLE 4-continued

| | | (CDS ≥ 0) | | | | |
|---|---|---|---|---|---|---|
| Class | 8-bit data | Modulation codes beginning with "0" | CDS | Class | 8-bit data | Modulation codes beginning with "1" | CDS |
| | 81 | 01111111000001 | 2 | | 81 | 10011111000011 | 2 |
| | 82 | 01111110011000 | 2 | | 82 | 10011111000110 | 2 |
| | 83 | 01111110001100 | 2 | | 83 | 10011111001100 | 2 |
| | 84 | 01111110000110 | 2 | | 84 | 10011111100001 | 2 |
| | 85 | 01111110000011 | 2 | | 85 | 10011111110000 | 2 |
| | 86 | 01111100111000 | 2 | | 86 | 10001111001111 | 4 |
| | 87 | 01111100110001 | 2 | | 87 | 10001111100111 | 4 |
| | 88 | 01111100011100 | 2 | | 88 | 10001111110011 | 4 |
| | 89 | 01111100011001 | 2 | | 89 | 10011001111110 | 4 |
| | 90 | 01111100001110 | 2 | | 90 | 10011100111110 | 4 |
| | 91 | 01111100000111 | 2 | | 91 | 10011110001111 | 4 |
| | 92 | 01111001111000 | 2 | | 92 | 10011110011110 | 4 |
| | 93 | 01111001110001 | 2 | | 93 | 10011111000111 | 4 |
| | 94 | 01111001100110 | 2 | | 94 | 10011111001110 | 4 |
| | 95 | 01111001100011 | 2 | | 95 | 10011111100011 | 4 |
| | 96 | 01111000111100 | 2 | | 96 | 10011111100110 | 4 |
| | 97 | 01111000111001 | 2 | 2 (B) | 97 | 11000111100111 | 4 |
| | 98 | 01111000110011 | 2 | | 98 | 11000111110011 | 4 |
| | 99 | 01111000011110 | 2 | | 99 | 11000000111111 | 2 |
| | 100 | 01111000001111 | 2 | | 100 | 11000001111110 | 2 |
| | 101 | 01110011111000 | 2 | | 101 | 11000011001111 | 2 |
| | 102 | 01110011110001 | 2 | | 102 | 11000011100111 | 2 |
| | 103 | 01110011100110 | 2 | | 103 | 11000011110011 | 2 |
| | 104 | 01110011100011 | 2 | | 104 | 11000011111001 | 2 |
| | 105 | 01110011001110 | 2 | | 105 | 11000011111100 | 2 |
| | 106 | 01110011000111 | 2 | | 106 | 11000110001111 | 2 |
| | 107 | 01110001111100 | 2 | | 107 | 11000110011110 | 2 |
| | 108 | 01110001111001 | 2 | | 108 | 11000111000111 | 2 |
| | 109 | 01110001110011 | 2 | | 109 | 11000111001110 | 2 |
| | 110 | 01110001100111 | 2 | | 110 | 11000111100011 | 2 |
| | 111 | 01110000111110 | 2 | | 111 | 11000111100110 | 2 |
| | 112 | 01110000011111 | 2 | | 112 | 11000111110001 | 2 |
| | 113 | 01100111111000 | 2 | | 113 | 11000111111000 | 2 |
| | 114 | 01100111110001 | 2 | | 114 | 11001100001111 | 2 |
| | 115 | 01100111100110 | 2 | | 115 | 11001100011110 | 2 |
| | 116 | 01100111100011 | 2 | | 116 | 11001100110011 | 2 |
| | 117 | 01100011001110 | 2 | | 117 | 11001100111001 | 2 |
| | 118 | 01100111000111 | 2 | | 118 | 11001100111100 | 2 |
| | 119 | 01100110011110 | 2 | | 119 | 11001110000111 | 2 |
| | 120 | 01100110001111 | 2 | | 120 | 11001110001110 | 2 |
| | 121 | 01100011111100 | 2 | | 121 | 11001110011001 | 2 |
| | 122 | 01100011111001 | 2 | | 122 | 11001110011100 | 2 |
| | 123 | 01100011110011 | 2 | | 123 | 11001111000011 | 2 |
| | 124 | 01100011100111 | 2 | | 124 | 11001111000110 | 2 |
| | 125 | 01100011001111 | 2 | | 125 | 11001111001100 | 2 |
| | 126 | 01100001111110 | 2 | | 126 | 11001111100001 | 2 |
| | 127 | 01100000111111 | 2 | | 127 | 11001111110000 | 2 |
| 2 (A) | 128 | 00111111000000 | 0 | | 128 | 11000000011111 | 0 |
| | 129 | 00111111000001 | 0 | | 129 | 11000000111110 | 0 |
| | 130 | 00111110011000 | 0 | | 130 | 11000001100111 | 0 |
| | 131 | 00111110001100 | 0 | | 131 | 11000001110011 | 0 |
| | 132 | 00111110000110 | 0 | | 132 | 11000001111001 | 0 |
| | 133 | 00111110000011 | 0 | | 133 | 11000001111100 | 0 |
| | 134 | 00111100111000 | 0 | | 134 | 11000011000111 | 0 |
| | 135 | 00111100110001 | 0 | | 135 | 11000011001110 | 0 |
| | 136 | 00111100011100 | 0 | | 136 | 11000011100011 | 0 |
| | 137 | 00111100011001 | 0 | | 137 | 11000011100110 | 0 |
| | 138 | 00111100001110 | 0 | | 138 | 11000011110001 | 0 |
| | 139 | 00111100000111 | 0 | | 139 | 11000011111000 | 0 |
| | 140 | 00111001111000 | 0 | | 140 | 11000110000111 | 0 |
| | 141 | 00111001110001 | 0 | | 141 | 11000110001110 | 0 |
| | 142 | 00111001100110 | 0 | | 142 | 11000110011001 | 0 |
| | 143 | 00111001100011 | 0 | | 143 | 11000110011100 | 0 |
| | 144 | 00111000111100 | 0 | | 144 | 11000111000011 | 0 |
| | 145 | 00111000111001 | 0 | | 145 | 11000111000110 | 0 |
| | 146 | 00111000110011 | 0 | | 146 | 11000111001100 | 0 |
| | 147 | 00111000011110 | 0 | | 147 | 11000111100001 | 0 |
| | 148 | 00111000001111 | 0 | | 148 | 11000111110000 | 0 |
| | 149 | 00110011111000 | 0 | | 149 | 11001100000111 | 0 |
| | 150 | 00110011110001 | 0 | | 150 | 11001100001110 | 0 |
| | 151 | 00110011100110 | 0 | | 151 | 11001100011001 | 0 |
| | 152 | 00110011100011 | 0 | | 152 | 11001100011100 | 0 |
| | 153 | 00110011001110 | 0 | | 153 | 11001100110001 | 0 |
| | 154 | 00110011000111 | 0 | | 154 | 11001100111000 | 0 |
| | 155 | 00110001111100 | 0 | | 155 | 11001110000011 | 0 |
| | 156 | 00110001111001 | 0 | | 156 | 11001110000110 | 0 |
| | 157 | 00110001110011 | 0 | | 157 | 11001110001100 | 0 |
| | 158 | 00110001100111 | 0 | | 158 | 11001110011000 | 0 |
| | 159 | 00110000111110 | 0 | | 159 | 11001111000001 | 0 |

TABLE 4-continued (CDS ≧ 0)

| Class | 8-bit data | Modulation codes beginning with "0" | CDS | Class | 8-bit data | Modulation codes beginning with "1" | CDS |
|---|---|---|---|---|---|---|---|
| | 160 | 00110000011111 | 0 | | 160 | 11001111100000 | 0 |
| | 161 | 00111111100001 | 2 | | 161 | 11001100111110 | 4 |
| | 162 | 00111111001100 | 2 | | 162 | 11001110011110 | 4 |
| | 163 | 00111111000110 | 2 | | 163 | 11001111000111 | 4 |
| | 164 | 00111111000011 | 2 | | 164 | 11001111001110 | 4 |
| | 165 | 00111110011100 | 2 | | 165 | 11001111100011 | 4 |
| | 166 | 00111110011001 | 2 | | 166 | 11001111100110 | 4 |
| | 167 | 00111110001110 | 2 | 3 (B) | 167 | 11100001111110 | 4 |
| | 168 | 00111110000111 | 2 | | 168 | 11100011100111 | 4 |
| | 169 | 00111100111100 | 2 | | 169 | 11100011110011 | 4 |
| | 170 | 00111100111001 | 2 | | 170 | 11100011111100 | 4 |
| | 171 | 00111100110011 | 2 | | 171 | 11100110011110 | 4 |
| | 172 | 00111100011110 | 2 | | 172 | 11100111000111 | 4 |
| | 173 | 00111100001111 | 2 | | 173 | 11100111001110 | 4 |
| | 174 | 00111001111100 | 2 | | 174 | 11100111100011 | 4 |
| | 175 | 00111001111001 | 2 | | 175 | 11100111100110 | 4 |
| | 176 | 00111001110011 | 2 | | 176 | 11100111111000 | 4 |
| | 177 | 00111001100111 | 2 | | 177 | 11100000011111 | 2 |
| | 178 | 00111000111110 | 2 | | 178 | 11100000111110 | 2 |
| | 179 | 00111000011111 | 2 | | 179 | 11100001100111 | 2 |
| | 180 | 00110011111100 | 2 | | 180 | 11100001110011 | 2 |
| | 181 | 00110011111001 | 2 | | 181 | 11100001111001 | 2 |
| | 182 | 00110011110011 | 2 | | 182 | 11100001111100 | 2 |
| | 183 | 00110011100111 | 2 | | 183 | 11100011000111 | 2 |
| | 184 | 00110011001111 | 2 | | 184 | 11100011001110 | 2 |
| | 185 | 00110001111110 | 2 | | 185 | 11100011100011 | 2 |
| | 186 | 00110000111111 | 2 | | 186 | 11100011100110 | 2 |
| | 187 | 00111111100110 | 4 | | 187 | 11100011110001 | 2 |
| | 188 | 00111111100011 | 4 | | 188 | 11100011111000 | 2 |
| | 189 | 00111111001110 | 4 | | 189 | 11100110000111 | 2 |
| | 190 | 00111111000111 | 4 | | 190 | 11100110001110 | 2 |
| | 191 | 00111110011110 | 4 | | 191 | 11100110011001 | 2 |
| | 192 | 00111110001111 | 4 | | 192 | 11100110011100 | 2 |
| | 193 | 00111100111110 | 4 | | 193 | 11100111000011 | 2 |
| | 194 | 00111100011111 | 4 | | 194 | 11100111000110 | 2 |
| | 195 | 00111001111110 | 4 | | 195 | 11100111001100 | 2 |
| | 196 | 00111000111111 | 4 | | 196 | 11100111100001 | 2 |
| | 197 | 00110011111110 | 4 | | 197 | 11100111110000 | 2 |
| 3 (A) | 198 | 00011111110000 | 0 | | 198 | 11100000001111 | 0 |
| | 199 | 00011111100001 | 0 | | 199 | 11100000011110 | 0 |
| | 200 | 00011111001100 | 0 | | 200 | 11100000110011 | 0 |
| | 201 | 00011111000110 | 0 | | 201 | 11100000111001 | 0 |
| | 202 | 00011111000011 | 0 | | 202 | 11100000111100 | 0 |
| | 203 | 00011110011100 | 0 | | 203 | 11100001100011 | 0 |
| | 204 | 00011110011001 | 0 | | 204 | 11100001100110 | 0 |
| | 205 | 00011110001110 | 0 | | 205 | 11100001110001 | 0 |
| | 206 | 00011110000111 | 0 | | 206 | 11100001111000 | 0 |
| | 207 | 00011100111100 | 0 | | 207 | 11100011000011 | 0 |
| | 208 | 00011100111001 | 0 | | 208 | 11100011000110 | 0 |
| | 209 | 00011100110011 | 0 | | 209 | 11100011001100 | 0 |
| | 210 | 00011100011110 | 0 | | 210 | 11100011100001 | 0 |
| | 211 | 00011100001111 | 0 | | 211 | 11100011110000 | 0 |
| | 212 | 00011001111100 | 0 | | 212 | 11100110000011 | 0 |
| | 213 | 00011001111001 | 0 | | 213 | 11100110000110 | 0 |
| | 214 | 00011001110011 | 0 | | 214 | 11100110001100 | 0 |
| | 215 | 00011001100111 | 0 | | 215 | 11100110011000 | 0 |
| | 216 | 00011000111110 | 0 | | 216 | 11100111000001 | 0 |
| | 217 | 00011000011111 | 0 | | 217 | 11100111100000 | 0 |
| | 218 | 00011111110001 | 2 | 4 (B) | 218 | 11110001111100 | 4 |
| | 219 | 00011111100110 | 2 | | 219 | 11110011111000 | 4 |
| | 220 | 00011111100011 | 2 | | 220 | 11110000001111 | 2 |
| | 221 | 00011111001110 | 2 | | 221 | 11110000011110 | 2 |
| | 222 | 00011111000111 | 2 | | 222 | 11110000110011 | 2 |
| | 223 | 00011110011110 | 2 | | 223 | 11110000111001 | 2 |
| | 224 | 00011110001111 | 2 | | 224 | 11110000111100 | 2 |
| | 225 | 00011100111110 | 2 | | 225 | 11110001100011 | 2 |
| | 226 | 00011100011111 | 2 | | 226 | 11110001100110 | 2 |
| | 227 | 00011001111110 | 2 | | 227 | 11110001110001 | 2 |
| | 228 | 00011000111111 | 2 | | 228 | 11110001111000 | 2 |
| | 229 | 00011111110011 | 4 | | 229 | 11110011000011 | 2 |
| | 230 | 00011111100111 | 4 | | 230 | 11110011000110 | 2 |
| | 231 | 00011111001111 | 4 | | 231 | 11110011001100 | 2 |
| | 232 | 00011110011111 | 4 | | 232 | 11110011100001 | 2 |
| | 233 | 00011100111111 | 4 | | 233 | 11110011110000 | 2 |
| 4 (A) | 234 | 00001111111000 | 0 | | 234 | 11110000000111 | 0 |
| | 235 | 00001111110001 | 0 | | 235 | 11110000001110 | 0 |
| | 236 | 00001111100110 | 0 | | 236 | 11110000011001 | 0 |
| | 237 | 00001111100011 | 0 | | 237 | 11110000011100 | 0 |
| | 238 | 00001111001110 | 0 | | 238 | 11110000110001 | 0 |

TABLE 4-continued (CDS ≧ 0)

| Class | 8-bit data | Modulation codes beginning with "0" | CDS | Class | 8-bit data | Modulation codes beginning with "1" | CDS |
|---|---|---|---|---|---|---|---|
| | 239 | 000011110001111 | 0 | | 239 | 111100000111000 | 0 |
| | 240 | 000011100011110 | 0 | | 240 | 111100011100001 | 0 |
| | 241 | 000011100011111 | 0 | | 241 | 111100011100000 | 0 |
| | 242 | 000011001111110 | 0 | | 242 | 111100110000001 | 0 |
| | 243 | 000011000111111 | 0 | | 243 | 111100111000000 | 0 |
| | 244 | 000011111111001 | 2 | 5 (B) | 244 | 111110000000111 | 2 |
| | 245 | 000011111110011 | 2 | | 245 | 111110000001110 | 2 |
| | 246 | 000011111100111 | 2 | | 246 | 111110000011001 | 2 |
| | 247 | 000011111001111 | 2 | | 247 | 111110000011100 | 2 |
| | 248 | 000011100111111 | 2 | | 248 | 111111000111000 | 2 |
| | 249 | 000011001111111 | 2 | | 249 | 111111001110000 | 2 |
| 5 (A) | 250 | 000001111111100 | 0 | | 250 | 111111000000011 | 0 |
| | 251 | 000001111111001 | 0 | | 251 | 111111000000110 | 0 |
| | 252 | 000001111110011 | 0 | | 252 | 111111000001100 | 0 |
| | 253 | 000001111100111 | 0 | | 253 | 111111000011000 | 0 |
| | 254 | 000001111001111 | 0 | | 254 | 111111000110000 | 0 |
| | 255 | 000000110011111 | 0 | | 255 | 111111001100000 | 0 |

TABLE 5

(CDS ≦ 0)

| Class | 8-bit data | Modulation codes beginning with "0" | CDS | Class | 8-bit data | Modulation codes beginning with "1" | CDS |
|---|---|---|---|---|---|---|---|
| 1 (C) | 0 | 011111110000001 | 0 | 1 (D) | 0 | 100000001111110 | 0 |
| | 1 | 011111100110000 | 0 | | 1 | 100000011001111 | 0 |
| | 2 | 011111100011000 | 0 | | 2 | 100000011100111 | 0 |
| | 3 | 011111100001100 | 0 | | 3 | 100000011110011 | 0 |
| | 4 | 011111100000110 | 0 | | 4 | 100000011111001 | 0 |
| | 5 | 011111100000011 | 0 | | 5 | 100000011111100 | 0 |
| | 6 | 011110011110000 | 0 | | 6 | 100001100001111 | 0 |
| | 7 | 011111001100001 | 0 | | 7 | 100001100011110 | 0 |
| | 8 | 011110001110000 | 0 | | 8 | 100001110001111 | 0 |
| | 9 | 011110001100001 | 0 | | 9 | 100001110011110 | 0 |
| | 10 | 011110000111100 | 0 | | 10 | 100001111000011 | 0 |
| | 11 | 011110000110011 | 0 | | 11 | 100001111001100 | 0 |
| | 12 | 011110000011110 | 0 | | 12 | 100001111110001 | 0 |
| | 13 | 011110000000111 | 0 | | 13 | 100001111111000 | 0 |
| | 14 | 011100111110000 | 0 | | 14 | 100011000011111 | 0 |
| | 15 | 011100111100001 | 0 | | 15 | 100011000111110 | 0 |
| | 16 | 011100110011100 | 0 | | 16 | 100011001100011 | 0 |
| | 17 | 011100110000110 | 0 | | 17 | 100011001111001 | 0 |
| | 18 | 011100110000011 | 0 | | 18 | 100011001111100 | 0 |
| | 19 | 011100011111000 | 0 | | 19 | 100011100000111 | 0 |
| | 20 | 011100011110001 | 0 | | 20 | 100011100001110 | 0 |
| | 21 | 011100011100110 | 0 | | 21 | 100011100011001 | 0 |
| | 22 | 011100011100011 | 0 | | 22 | 100011100011100 | 0 |
| | 23 | 011100001111100 | 0 | | 23 | 100011110000011 | 0 |
| | 24 | 011100001111001 | 0 | | 24 | 100011110000110 | 0 |
| | 25 | 011100001100011 | 0 | | 25 | 100011110011100 | 0 |
| | 26 | 011100000111110 | 0 | | 26 | 100011111100001 | 0 |
| | 27 | 011100000001111 | 0 | | 27 | 100011111110000 | 0 |
| | 28 | 011001111110000 | 0 | | 28 | 100110000001111 | 0 |
| | 29 | 011001111100001 | 0 | | 29 | 100110000011110 | 0 |
| | 30 | 011001110011100 | 0 | | 30 | 100110001100011 | 0 |
| | 31 | 011001110001110 | 0 | | 31 | 100110001111001 | 0 |
| | 32 | 011001110000011 | 0 | | 32 | 100110001111100 | 0 |
| | 33 | 011001100011100 | 0 | | 33 | 100110011000011 | 0 |
| | 34 | 011001100011001 | 0 | | 34 | 100110011001100 | 0 |
| | 35 | 011001100001110 | 0 | | 35 | 100110011110001 | 0 |
| | 36 | 011001100000111 | 0 | | 36 | 100110011111000 | 0 |
| | 37 | 011000111111000 | 0 | | 37 | 100111000000111 | 0 |
| | 38 | 011000111110001 | 0 | | 38 | 100111000001110 | 0 |
| | 39 | 011000111100110 | 0 | | 39 | 100111000011001 | 0 |
| | 40 | 011000111100011 | 0 | | 40 | 100111000011100 | 0 |
| | 41 | 011000110011110 | 0 | | 41 | 100111001100001 | 0 |
| | 42 | 011000110000111 | 0 | | 42 | 100111001111000 | 0 |
| | 43 | 011000011111100 | 0 | | 43 | 100111100000011 | 0 |
| | 44 | 011000011111001 | 0 | | 44 | 100111100000110 | 0 |
| | 45 | 011000011100011 | 0 | | 45 | 100111100001100 | 0 |
| | 46 | 011000011100111 | 0 | | 46 | 100111100011000 | 0 |
| | 47 | 011000001111110 | 0 | | 47 | 100111110000001 | 0 |
| | 48 | 011000000011111 | 0 | | 48 | 100111111000000 | 0 |
| | 49 | 011111100000001 | −2 | | 49 | 100000000110011 | −4 |
| | 50 | 011111001100000 | −2 | | 50 | 100000000111001 | −4 |
| | 51 | 011111000110000 | −2 | | 51 | 100000000111100 | −4 |
| | 52 | 011111000011000 | −2 | | 52 | 100000001100011 | −4 |
| | 53 | 011111000001100 | −2 | | 53 | 100000001100110 | −4 |

TABLE 5-continued (CDS ≦ 0)

| Class | 8-bit data | Modulation codes beginning with "0" | CDS | Class | 8-bit data | Modulation codes beginning with "1" | CDS |
|---|---|---|---|---|---|---|---|
| | 54 | 01111000000110 | −2 | | 54 | 10000001110001 | −4 |
| | 55 | 01111000000011 | −2 | | 55 | 10000001111000 | −4 |
| | 56 | 01110011100000 | −2 | | 56 | 10000011000011 | −4 |
| | 57 | 01110011000001 | −2 | | 57 | 10000011000110 | −4 |
| | 58 | 01110001110000 | −2 | | 58 | 10000011001100 | −4 |
| | 59 | 01110001100001 | −2 | | 59 | 10000011100001 | −4 |
| | 60 | 01110000111000 | −2 | | 60 | 10000011110000 | −4 |
| | 61 | 01110000110001 | −2 | | 61 | 10000110000011 | −4 |
| | 62 | 01110000011100 | −2 | | 62 | 10000110000110 | −4 |
| | 63 | 01110000011001 | −2 | | 63 | 10000110001100 | −4 |
| | 64 | 01110000001110 | −2 | | 64 | 10000110011000 | −4 |
| | 65 | 01110000000111 | −2 | | 65 | 10000111000001 | −4 |
| | 66 | 01100111100000 | −2 | | 66 | 10000111100000 | −4 |
| | 67 | 01100111000001 | −2 | | 67 | 10001100000011 | −4 |
| | 68 | 01100110011000 | −2 | | 68 | 10001100000110 | −4 |
| | 69 | 01100110001100 | −2 | | 69 | 10001100001100 | −4 |
| | 70 | 01100110000110 | −2 | | 70 | 10001100011000 | −4 |
| | 71 | 01100110000011 | −2 | | 71 | 10001100110000 | −4 |
| | 72 | 01100011110000 | −2 | | 72 | 10001110000001 | −4 |
| | 73 | 01100011100001 | −2 | | 73 | 10001111000000 | −4 |
| | 74 | 01100011001100 | −2 | | 74 | 10011000000011 | −4 |
| | 75 | 01100011000110 | −2 | | 75 | 10011000000110 | −4 |
| | 76 | 01100011000011 | −2 | | 76 | 10011000001100 | −4 |
| | 77 | 01100001111000 | −2 | | 77 | 10011000011000 | −4 |
| | 78 | 01100001110001 | −2 | | 78 | 10011000110000 | −4 |
| | 79 | 01100001100110 | −2 | | 79 | 10011001100000 | −4 |
| | 80 | 01100001100011 | −2 | | 80 | 10011100000001 | −4 |
| | 81 | 01100000111100 | −2 | | 81 | 10000000111110 | −2 |
| | 82 | 01100000111001 | −2 | | 82 | 10000001100111 | −2 |
| | 83 | 01100000110011 | −2 | | 83 | 10000001110011 | −2 |
| | 84 | 01100000011110 | −2 | | 84 | 10000001111001 | −2 |
| | 85 | 01100000001111 | −2 | | 85 | 10000001111100 | −2 |
| | 86 | 01110000110000 | −4 | | 86 | 10000011000111 | −2 |
| | 87 | 01110000011000 | −4 | | 87 | 10000011001110 | −2 |
| | 88 | 01110000001100 | −4 | | 88 | 10000011100011 | −2 |
| | 89 | 01100110000001 | −4 | | 89 | 10000011100110 | −2 |
| | 90 | 01100011000001 | −4 | | 90 | 10000011110001 | −2 |
| | 91 | 01100001110000 | −4 | | 91 | 10000011111000 | −2 |
| | 92 | 01100001100001 | −4 | | 92 | 10000110000111 | −2 |
| | 93 | 01100000111000 | −4 | | 93 | 10000110001110 | −2 |
| | 94 | 01100000110001 | −4 | | 94 | 10000110011001 | −2 |
| | 95 | 01100000011100 | −4 | | 95 | 10000110011100 | −2 |
| | 96 | 01100000011001 | −4 | | 96 | 10000111000011 | −2 |
| 2 (C) | 97 | 00111000011000 | −4 | | 97 | 10000111000110 | −2 |
| | 98 | 00111000001100 | −4 | | 98 | 10000111001100 | −2 |
| | 99 | 00111111000000 | −2 | | 99 | 10000111100001 | −2 |
| | 100 | 00111110000001 | −2 | | 100 | 10000111110000 | −2 |
| | 101 | 00111100110000 | −2 | | 101 | 10001100000111 | −2 |
| | 102 | 00111100011000 | −2 | | 102 | 10001100001110 | −2 |
| | 103 | 00111100001100 | −2 | | 103 | 10001100011001 | −2 |
| | 104 | 00111100000110 | −2 | | 104 | 10001100011100 | −2 |
| | 105 | 00111100000011 | −2 | | 105 | 10001100110001 | −2 |
| | 106 | 00111001110000 | −2 | | 106 | 10001100111000 | −2 |
| | 107 | 00111001100001 | −2 | | 107 | 10001110000011 | −2 |
| | 108 | 00111000111000 | −2 | | 108 | 10001110000110 | −2 |
| | 109 | 00111000110001 | −2 | | 109 | 10001110001100 | −2 |
| | 110 | 00111000011100 | −2 | | 110 | 10001110011000 | −2 |
| | 111 | 00111000011001 | −2 | | 111 | 10001111000001 | −2 |
| | 112 | 00111000001110 | −2 | | 112 | 10001111100000 | −2 |
| | 113 | 00111000000111 | −2 | | 113 | 10011000000111 | −2 |
| | 114 | 00110011110000 | −2 | | 114 | 10011000001110 | −2 |
| | 115 | 00110011100001 | −2 | | 115 | 10011000011001 | −2 |
| | 116 | 00110011001100 | −2 | | 116 | 10011000011100 | −2 |
| | 117 | 00110011000110 | −2 | | 117 | 10011000110001 | −2 |
| | 118 | 00110011000011 | −2 | | 118 | 10011000111000 | −2 |
| | 119 | 00110001111000 | −2 | | 119 | 10011001100001 | −2 |
| | 120 | 00110001110001 | −2 | | 120 | 10011001110000 | −2 |
| | 121 | 00110001100110 | −2 | | 121 | 10011100000011 | −2 |
| | 122 | 00110001100011 | −2 | | 122 | 10011100000110 | −2 |
| | 123 | 00110000111100 | −2 | | 123 | 10011100001100 | −2 |
| | 124 | 00110000111001 | −2 | | 124 | 10011100011000 | −2 |
| | 125 | 00110000110011 | −2 | | 125 | 10011100110000 | −2 |
| | 126 | 00110000011110 | −2 | | 126 | 10011110000001 | −2 |
| | 127 | 00110000001111 | −2 | | 127 | 10011111000000 | −2 |
| | 128 | 00111111100000 | 0 | 2 (D) | 128 | 11000000111111 | 0 |
| | 129 | 00111111000001 | 0 | | 129 | 11000000111110 | 0 |
| | 130 | 00111110011000 | 0 | | 130 | 11000001100111 | 0 |
| | 131 | 00111110001100 | 0 | | 131 | 11000001110011 | 0 |
| | 132 | 00111110000110 | 0 | | 132 | 11000001111001 | 0 |

TABLE 5-continued (CDS ≦ 0)

| Class | 8-bit data | Modulation codes beginning with "0" | CDS | Class | 8-bit data | Modulation codes beginning with "1" | CDS |
|---|---|---|---|---|---|---|---|
| | 133 | 00111110000011 | 0 | | 133 | 11000001111100 | 0 |
| | 134 | 00111100111000 | 0 | | 134 | 11000011000111 | 0 |
| | 135 | 00111100110001 | 0 | | 135 | 11000011001110 | 0 |
| | 136 | 00111100011100 | 0 | | 136 | 11000011100011 | 0 |
| | 137 | 00111100011001 | 0 | | 137 | 11000011100110 | 0 |
| | 138 | 00111100001110 | 0 | | 138 | 11000011110001 | 0 |
| | 139 | 00111100000111 | 0 | | 139 | 11000011111000 | 0 |
| | 140 | 00110011111000 | 0 | | 140 | 11000110001111 | 0 |
| | 141 | 00110011110001 | 0 | | 141 | 11000110001110 | 0 |
| | 142 | 00110011100110 | 0 | | 142 | 11000110011001 | 0 |
| | 143 | 00110011100011 | 0 | | 143 | 11000110011100 | 0 |
| | 144 | 00111000111100 | 0 | | 144 | 11000111000011 | 0 |
| | 145 | 00111000111001 | 0 | | 145 | 11000111000110 | 0 |
| | 146 | 00111000110011 | 0 | | 146 | 11000111001100 | 0 |
| | 147 | 00111000011110 | 0 | | 147 | 11000111100001 | 0 |
| | 148 | 00111000001111 | 0 | | 148 | 11000111110000 | 0 |
| | 149 | 00110011111000 | 0 | | 149 | 11001100000111 | 0 |
| | 150 | 00110011110001 | 0 | | 150 | 11001100001110 | 0 |
| | 151 | 00110011100110 | 0 | | 151 | 11001100011001 | 0 |
| | 152 | 00110011100011 | 0 | | 152 | 11001100011100 | 0 |
| | 153 | 00110011001110 | 0 | | 153 | 11001100110001 | 0 |
| | 154 | 00110011000111 | 0 | | 154 | 11001100111000 | 0 |
| | 155 | 00110001111100 | 0 | | 155 | 11001110000011 | 0 |
| | 156 | 00110001111001 | 0 | | 156 | 11001110000110 | 0 |
| | 157 | 00110001110011 | 0 | | 157 | 11001110001100 | 0 |
| | 158 | 00110001100111 | 0 | | 158 | 11001110011000 | 0 |
| | 159 | 00110000111110 | 0 | | 159 | 11001111000001 | 0 |
| | 160 | 00110000011111 | 0 | | 160 | 11001111100000 | 0 |
| | 161 | 00110011000001 | −4 | | 161 | 11000000011110 | −2 |
| | 162 | 00110001100001 | −4 | | 162 | 11000000110011 | −2 |
| | 163 | 00110000111000 | −4 | | 163 | 11000000111001 | −2 |
| | 164 | 00110000110001 | −4 | | 164 | 11000000111100 | −2 |
| | 165 | 00110000011100 | −4 | | 165 | 11000001100011 | −2 |
| | 166 | 00110000011001 | −4 | | 166 | 11000001100110 | −2 |
| 3 (C) | 167 | 00011110000001 | −4 | | 167 | 11000001110001 | −2 |
| | 168 | 00011100011000 | −4 | | 168 | 11000001111000 | −2 |
| | 169 | 00011100001100 | −4 | | 169 | 11000011000011 | −2 |
| | 170 | 00011100000011 | −4 | | 170 | 11000011000110 | −2 |
| | 171 | 00011001100001 | −4 | | 171 | 11000011001100 | −2 |
| | 172 | 00011000111000 | −4 | | 172 | 11000011100001 | −2 |
| | 173 | 00011000110001 | −4 | | 173 | 11000011110000 | −2 |
| | 174 | 00011000011100 | −4 | | 174 | 11000110000011 | −2 |
| | 175 | 00011000011001 | −4 | | 175 | 11000110000110 | −2 |
| | 176 | 00011000000111 | −4 | | 176 | 11000110001100 | −2 |
| | 177 | 00011111100000 | −2 | | 177 | 11000110011000 | −2 |
| | 178 | 00011111000001 | −2 | | 178 | 11000111000001 | −2 |
| | 179 | 00011110011000 | −2 | | 179 | 11000111100000 | −2 |
| | 180 | 00011110001100 | −2 | | 180 | 11001100000011 | −2 |
| | 181 | 00011110000110 | −2 | | 181 | 11001100000110 | −2 |
| | 182 | 00011110000011 | −2 | | 182 | 11001100001100 | −2 |
| | 183 | 00011100111000 | −2 | | 183 | 11001100011000 | −2 |
| | 184 | 00011100110001 | −2 | | 184 | 11001100110000 | −2 |
| | 185 | 00011100011100 | −2 | | 185 | 11001110000001 | −2 |
| | 186 | 00011100011001 | −2 | | 186 | 11001111000000 | −2 |
| | 187 | 00011100001110 | −2 | | 187 | 11000000011001 | −4 |
| | 188 | 00011100000111 | −2 | | 188 | 11000000011100 | −4 |
| | 189 | 00011001111000 | −2 | | 189 | 11000000110011 | −4 |
| | 190 | 00011001110001 | −2 | | 190 | 11000000111000 | −4 |
| | 191 | 00011001100110 | −2 | | 191 | 11000001100001 | −4 |
| | 192 | 00011001100011 | −2 | | 192 | 11000001110000 | −4 |
| | 193 | 00011000111100 | −2 | | 193 | 11000011000001 | −4 |
| | 194 | 00011000111001 | −2 | | 194 | 11000011100000 | −4 |
| | 195 | 00011000110011 | −2 | | 195 | 11000110000001 | −4 |
| | 196 | 00011000011110 | −2 | | 196 | 11000111000000 | −4 |
| | 197 | 00011000001111 | −2 | | 197 | 11001100000001 | −4 |
| | 198 | 00011111110000 | 0 | 3 (D) | 198 | 11100000001111 | 0 |
| | 199 | 00011111100001 | 0 | | 199 | 11100000011110 | 0 |
| | 200 | 00011111001100 | 0 | | 200 | 11100000110011 | 0 |
| | 201 | 00011111000110 | 0 | | 201 | 11100000111001 | 0 |
| | 202 | 00011111000011 | 0 | | 202 | 11100000111100 | 0 |
| | 203 | 00011110011100 | 0 | | 203 | 11100001100011 | 0 |
| | 204 | 00011110011001 | 0 | | 204 | 11100001100110 | 0 |
| | 205 | 00011110001110 | 0 | | 205 | 11100001110001 | 0 |
| | 206 | 00011110000111 | 0 | | 206 | 11100001111000 | 0 |
| | 207 | 00011100111100 | 0 | | 207 | 11100011000011 | 0 |
| | 208 | 00011100111001 | 0 | | 208 | 11100011000110 | 0 |
| | 209 | 00011100110011 | 0 | | 209 | 11100011001100 | 0 |
| | 210 | 00011100011110 | 0 | | 210 | 11100011100001 | 0 |
| | 211 | 00011100001111 | 0 | | 211 | 11100011110000 | 0 |

TABLE 5-continued (CDS ≦ 0)

| Class | 8-bit data | Modulation codes beginning with "0" | CDS | Class | 8-bit data | Modulation codes beginning with "1" | CDS |
|---|---|---|---|---|---|---|---|
|  | 212 | 00011001111100 | 0 |  | 212 | 11100110000011 | 0 |
|  | 213 | 00011001111001 | 0 |  | 213 | 11100110000110 | 0 |
|  | 214 | 00011001110011 | 0 |  | 214 | 11100110001100 | 0 |
|  | 215 | 00011001100111 | 0 |  | 215 | 11100110011000 | 0 |
|  | 216 | 00011000111110 | 0 |  | 216 | 11100111000001 | 0 |
|  | 217 | 00011000011111 | 0 |  | 217 | 11100111100000 | 0 |
| 4 (C) | 218 | 00001110000011 | −4 |  | 218 | 11100000001110 | −2 |
|  | 219 | 00001100000111 | −4 |  | 219 | 11100000011001 | −2 |
|  | 220 | 00001111110000 | −2 |  | 220 | 11100000011100 | −2 |
|  | 221 | 00001111100001 | −2 |  | 221 | 11100000110001 | −2 |
|  | 222 | 00001111001100 | −2 |  | 222 | 11100001111000 | −2 |
|  | 223 | 00001111000110 | −2 |  | 223 | 11100001100001 | −2 |
|  | 224 | 00001111000011 | −2 |  | 224 | 11100001110000 | −2 |
|  | 225 | 00001110011100 | −2 |  | 225 | 11100011000001 | −2 |
|  | 226 | 00001110011001 | −2 |  | 226 | 11100011100000 | −2 |
|  | 227 | 00001110001110 | −2 |  | 227 | 11100110000001 | −2 |
|  | 228 | 00001110000111 | −2 |  | 228 | 11100111000000 | −2 |
|  | 229 | 00001100111100 | −2 |  | 229 | 11100000001100 | −4 |
|  | 230 | 00001100111001 | −2 |  | 230 | 11100000011000 | −4 |
|  | 231 | 00001100110011 | −2 |  | 231 | 11100000110000 | −4 |
|  | 232 | 00001100011110 | −2 |  | 232 | 11100001100000 | −4 |
|  | 233 | 00001100001111 | −2 |  | 233 | 11100011000000 | −4 |
|  | 234 | 00001111111000 | 0 | 4 (D) | 234 | 11110000000111 | 0 |
|  | 235 | 00001111110001 | 0 |  | 235 | 11110000001110 | 0 |
|  | 236 | 00001111100110 | 0 |  | 236 | 11110000011001 | 0 |
|  | 237 | 00001111100011 | 0 |  | 237 | 11110000011100 | 0 |
|  | 238 | 00001111001110 | 0 |  | 238 | 11110000110001 | 0 |
|  | 239 | 00001111000111 | 0 |  | 239 | 11110000111000 | 0 |
|  | 240 | 00001110011110 | 0 |  | 240 | 11110001100001 | 0 |
|  | 241 | 00001110001111 | 0 |  | 241 | 11110001110000 | 0 |
|  | 242 | 00001100111110 | 0 |  | 242 | 11110011000001 | 0 |
|  | 243 | 00001100011111 | 0 |  | 243 | 11110011100000 | 0 |
| 5 (C) | 244 | 00000111111000 | −2 |  | 244 | 11110000000110 | −2 |
|  | 245 | 00000111110001 | −2 |  | 245 | 11110000001100 | −2 |
|  | 246 | 00000111100110 | −2 |  | 246 | 11110000011000 | −2 |
|  | 247 | 00000111100011 | −2 |  | 247 | 11110000110000 | −2 |
|  | 248 | 00000111000111 | −2 |  | 248 | 11110001100000 | −2 |
|  | 249 | 00000110001111 | −2 |  | 249 | 11110011000000 | −2 |
|  | 250 | 00000111111100 | 0 | 5 (D) | 250 | 11111000000011 | 0 |
|  | 251 | 00000111111001 | 0 |  | 251 | 11111000000110 | 0 |
|  | 252 | 00000111110011 | 0 |  | 252 | 11111000001100 | 0 |
|  | 253 | 00000111100111 | 0 |  | 253 | 11111000011000 | 0 |
|  | 254 | 00000111001111 | 0 |  | 254 | 11111000110000 | 0 |
|  | 255 | 00000110011111 | 0 |  | 255 | 11111001100000 | 0 |

TABLE 12

| 8-bit data | Modulation codes | CDS |
|---|---|---|
| 248 | 11111000110001 | 2 |
| 249 | 11111000111000 | 2 |
| 250 | 11111001100001 | 2 |
| 251 | 11111001110000 | 2 |

TABLE 13

| 8-bit data | Modulation codes | CDS |
|---|---|---|
| 248 | 00000111001110 | −2 |
| 249 | 00000111000111 | −2 |
| 250 | 00000110011110 | −2 |
| 251 | 00000110001111 | −2 |

5. A digital modulation method for converting 8-bit digital data into 14-bit digital modulation codes, said digital modulation method comprising:
step 1 for selecting up to four 14-bit digital modulation codes for each 8-bit digital data, said 14-bit digital modulation code is selected by the procedures of
(a) selecting among the $2^{14}$ 14-bit digital codes, a digital code the numbers of consecutive identical bits in which are 6 or less in the first 7 bits, 2-7 from the second bit to 13th bit, and 5 or less in the last 6 bits, and repeating this selecting procedure,
(b) selecting among the 14-bit digital codes selected at the procedure (a), a digital code the first bit of which is "0", and the CDS of which has the absolute value equal to or less than 6, and repeating this selecting procedure,
(c) selecting among the 14-bit digital codes selected at the procedure (a), a digital code the first bit of which is "1", and the CDS of which has the absolute value equal to or less than 4, and repeating this selecting procedure,
(d) selecting among the 14-bit digital codes selected at the procedure (b), a digital code the value of CDS of which is 0, and pairing the selected 14-bit digital code with the reversal code thereof to make the 2 digital codes one group, and repeating this selecting procedure,
(e) selecting among the 14-bit digital codes selected at the procedure (b), a digital code the value of CDS of which is +2, +4 or +6, selecting among the 14-bit digital codes selected at the procedure (c), a digital code the value of CDS of which is +2 or +4, and combining the two selected 14-bit digital codes with the reversal codes thereof to make the 4 digital codes one group, and repeating this selecting procedure, and
(f) selecting 256 groups among the groups formed in the above procedures as the 14-bit digital modulation codes;
step 2 for selecting one group of 14-bit digital modulation codes among the 256 groups of the 14-bit digital modulation codes, said selected group corresponding to inputted 8-bit digital data;
step 3 for further selecting one or more 14-bit digital modulation codes in the selected group at step 2, each of the 14-bit digital modulation codes satisfying the requirement that the number of consecutive identical bits at the joint portion of the preceding 14-bit digital modulation code already selected and the 14-bit digital modulation code to be selected is 2-7; and
step 4 for further selecting one 14-bit digital modulation code among the selected modulation codes at step 3 so that said one 14-bit digital modulation code satisfies the requirement that the absolute value of bit DSV for each bit in the modulation code is equal to or less than 8.

6. A digital modulation method as claimed in claim 5, wherein said step 3 comprises the procedures of:
selecting any one of the digital modulation codes the first bits of which are "01", "001", "0001", "00001", "000001", and "0000001" when the preceding digital modulation code that has already been selected terminates with "10";
selecting any one of the digital modulation codes the first bits of which are "10", "110", "1110", "11110", "111110", and "1111110" when the preceding digital modulation code that has already been selected terminates with "01";
selecting any one of the digital modulation codes the first bits of which are "110", "1110", "11110", "111110", "1111110", "01", "001", "0001", "00001", and "000001" when the preceding digital modulation code that has already been selected terminates with "100";
selecting any one of the digital modulation codes the first bits of which are "001", "0001", "00001", "000001", "0000001", "10", "110", "1110", "11110", and "111110" when the preceding digital modulation code that has already been selected terminates with "011"; 20 selecting any one of the digital modulation codes the first bits of which are "110", "1110", "11110", "111110", "1111110", "01", "001", "0001", and "00001" when the preceding digital modulation code that has already been selected terminates with "1000";
selecting any one of the digital modulation codes the first bits of which are "001", "0001", "00001", "000001", "0000001", "10", "110", "1110", and "11110" when the preceding digital modulation code that has already been selected terminates with "0111";
selecting any one of the digital modulation codes the first bits of which are "110", "1110", "11110", "111110", "1111110", "01", "001", and "0001" when the preceding digital modulation code that has already been selected terminates with "10000";
selecting any one of the digital modulation codes the first bits of which are "001", "0001", "00001", "000001", "0000001", "10", "110", and "1110" when the preceding digital modulation code that has already been selected terminates with "01111";
selecting any one of the digital modulation codes the first bits of which are "110", "1110", "11110", "111110", "1111110", "01", and "001" when the preceding digital modulation code that has already been selected terminates with "100000"; and
selecting any one of the digital modulation codes the first bits of which are "001", "0001", "00001", "000001", "0000001", "10", and "110" when the preceding digital modulation code that has already been selected terminates with "011111".

7. A digital modulation method as claimed in claim 5, wherein said step 4 comprises the procedures of:
selecting any one of the digital modulation codes the CDS of which are 0, −2, −4, and −6 when the DSV at the end of the preceding 14-bit digital modulation code that has already been selected is +4 or +2;
selecting any one of the digital modulation codes the CDS of which are +4, +2, 0, −2, and −4 when the DSV at the end of the preceding 14-bit digital modulation code that has already been selected is 0; and
selecting any one of the digital modulation codes the CDS of which are +6, +4, +2, and 0 when the DSV at the end of the preceding 14-bit digital modulation code that has already been selected is −2 or −4.

8. A digital modulation method as claimed in claim 5, wherein said digital modulation codes are the codes described in the following Tables 17 and 18.

TABLE 17

| Class | 8-bit data | Modulation codes beginning with "0" | CDS | Class | 8-bit data | Modulation codes beginning with "1" | CDS |
|---|---|---|---|---|---|---|---|
| 1(A) | 0 | 01111110000001 | 0 | 1(B) | 0 | 10000001111110 | 0 |
| | 1 | 01111100110000 | 0 | | 1 | 10000011001111 | 0 |
| | 2 | 01111100011000 | 0 | | 2 | 10000011100111 | 0 |
| | 3 | 01111100001100 | 0 | | 3 | 10000011110011 | 0 |
| | 4 | 01111100000110 | 0 | | 4 | 10000011111001 | 0 |
| | 5 | 01111100000011 | 0 | | 5 | 10000011111100 | 0 |
| | 6 | 01111001110000 | 0 | | 6 | 10000110001111 | 0 |
| | 7 | 01111001100001 | 0 | | 7 | 10000110011110 | 0 |
| | 8 | 01111000111000 | 0 | | 8 | 10000111000111 | 0 |
| | 9 | 01111000110001 | 0 | | 9 | 10000111001110 | 0 |
| | 10 | 01111000011100 | 0 | | 10 | 10000111100011 | 0 |
| | 11 | 01111000011001 | 0 | | 11 | 10000111100110 | 0 |
| | 12 | 01111000001110 | 0 | | 12 | 10000111110001 | 0 |
| | 13 | 01111000000111 | 0 | | 13 | 10000111111000 | 0 |
| | 14 | 01110011110000 | 0 | | 14 | 10001100001111 | 0 |
| | 15 | 01110011100001 | 0 | | 15 | 10001100011110 | 0 |

TABLE 17-continued (CDS ≧ 0)

| Class | 8-bit data | Modulation codes beginning with "0" | CDS | Class | 8-bit data | Modulation codes beginning with "1" | CDS |
|---|---|---|---|---|---|---|---|
| | 16 | 01110011001100 | 0 | | 16 | 10001100110011 | 0 |
| | 17 | 01110011000110 | 0 | | 17 | 10001100111001 | 0 |
| | 18 | 01110011000011 | 0 | | 18 | 10001100111100 | 0 |
| | 19 | 01110001111000 | 0 | | 19 | 10001110000111 | 0 |
| | 20 | 01110001110001 | 0 | | 20 | 10001110001110 | 0 |
| | 21 | 01110001100110 | 0 | | 21 | 10001110011001 | 0 |
| | 22 | 01110001100011 | 0 | | 22 | 10001110011100 | 0 |
| | 23 | 01110000111100 | 0 | | 23 | 10001111000011 | 0 |
| | 24 | 01110000111001 | 0 | | 24 | 10001111000110 | 0 |
| | 25 | 01110000110011 | 0 | | 25 | 10001111001100 | 0 |
| | 26 | 01110000011110 | 0 | | 26 | 10001111100001 | 0 |
| | 27 | 01110000001111 | 0 | | 27 | 10001111110000 | 0 |
| | 28 | 01100111110000 | 0 | | 28 | 10011000001111 | 0 |
| | 29 | 01100111100001 | 0 | | 29 | 10011000011110 | 0 |
| | 30 | 01100111001100 | 0 | | 30 | 10011000110011 | 0 |
| | 31 | 01100111000110 | 0 | | 31 | 10011000111001 | 0 |
| | 32 | 01100111000011 | 0 | | 32 | 10011000111100 | 0 |
| | 33 | 01100110011100 | 0 | | 33 | 10011001100011 | 0 |
| | 34 | 01100110011001 | 0 | | 34 | 10011001100110 | 0 |
| | 35 | 01100110001110 | 0 | | 35 | 10011001110001 | 0 |
| | 36 | 01100110000111 | 0 | | 36 | 10011001111000 | 0 |
| | 37 | 01100011111000 | 0 | | 37 | 10011100000111 | 0 |
| | 38 | 01100011110001 | 0 | | 38 | 10011100001110 | 0 |
| | 39 | 01100011100110 | 0 | | 39 | 10011100011001 | 0 |
| | 40 | 01100011100011 | 0 | | 40 | 10011100011100 | 0 |
| | 41 | 01100011001110 | 0 | | 41 | 10011100110001 | 0 |
| | 42 | 01100011000111 | 0 | | 42 | 10011100111000 | 0 |
| | 43 | 01100001111100 | 0 | | 43 | 10011110000011 | 0 |
| | 44 | 01100001111001 | 0 | | 44 | 10011110000110 | 0 |
| | 45 | 01100001110011 | 0 | | 45 | 10011110001100 | 0 |
| | 46 | 01100001100111 | 0 | | 46 | 10011110011000 | 0 |
| | 47 | 01100000111110 | 0 | | 47 | 10011111000001 | 0 |
| | 48 | 01100000011111 | 0 | | 48 | 10011111100000 | 0 |
| | 49 | 01111111000001 | 2 | | 49 | 10000011111110 | 2 |
| | 50 | 01111110011000 | 2 | | 50 | 10000110011111 | 2 |
| | 51 | 01111110001100 | 2 | | 51 | 10000111001111 | 2 |
| | 52 | 01111110000110 | 2 | | 52 | 10000111100111 | 2 |
| | 53 | 01111110000011 | 2 | | 53 | 10000111110011 | 2 |
| | 54 | 01111100111000 | 2 | | 54 | 10000111111001 | 2 |
| | 55 | 01111100110001 | 2 | | 55 | 10000111111100 | 2 |
| | 56 | 01111100011100 | 2 | | 56 | 10001100011111 | 2 |
| | 57 | 01111100011001 | 2 | | 57 | 10001100111110 | 2 |
| | 58 | 01111100001110 | 2 | | 58 | 10001110001111 | 2 |
| | 59 | 01111100000111 | 2 | | 59 | 10001110011110 | 2 |
| | 60 | 01111001111000 | 2 | | 60 | 10001111000111 | 2 |
| | 61 | 01111001110001 | 2 | | 61 | 10001111001110 | 2 |
| | 62 | 01111001100110 | 2 | | 62 | 10001111100011 | 2 |
| | 63 | 01111001100011 | 2 | | 63 | 10001111100110 | 2 |
| | 64 | 01111000111100 | 2 | | 64 | 10001111110001 | 2 |
| | 65 | 01111000111001 | 2 | | 65 | 10001111111000 | 2 |
| | 66 | 01111000110011 | 2 | | 66 | 10011000011111 | 2 |
| | 67 | 01111000011110 | 2 | | 67 | 10011000111110 | 2 |
| | 68 | 01111000001111 | 2 | | 68 | 10011001100111 | 2 |
| | 69 | 01110011111000 | 2 | | 69 | 10011001110011 | 2 |
| | 70 | 01110011110001 | 2 | | 70 | 10011001111001 | 2 |
| | 71 | 01110011100110 | 2 | | 71 | 10011001111100 | 2 |
| | 72 | 01110011100011 | 2 | | 72 | 10011100001111 | 2 |
| | 73 | 01110011001110 | 2 | | 73 | 10011100011110 | 2 |
| | 74 | 01110011000111 | 2 | | 74 | 10011100100011 | 2 |
| | 75 | 01110001111100 | 2 | | 75 | 10011100111001 | 2 |
| | 76 | 01110001111001 | 2 | | 76 | 10011100111100 | 2 |
| | 77 | 01110001100011 | 2 | | 77 | 10011110000111 | 2 |
| | 78 | 01110001100111 | 2 | | 78 | 10011110001110 | 2 |
| | 79 | 01110000111110 | 2 | | 79 | 10011110011001 | 2 |
| | 80 | 01110000011111 | 2 | | 80 | 10011110011100 | 2 |
| | 81 | 01100111111000 | 2 | | 81 | 10011111000011 | 2 |
| | 82 | 01100111110001 | 2 | | 82 | 10011111000110 | 2 |
| | 83 | 01100111100110 | 2 | | 83 | 10011111001100 | 2 |
| | 84 | 01100111100011 | 2 | | 84 | 10011111100001 | 2 |
| | 85 | 01100111001110 | 2 | | 85 | 10011111110000 | 2 |
| | 86 | 01100111000111 | 2 | | 86 | 10011111000111 | 4 |
| 2(B) | 87 | 01100110011110 | 2 | | 87 | 11000011111110 | 4 |
| | 88 | 01100110001111 | 2 | | 88 | 11000110011111 | 4 |
| | 89 | 01100011111100 | 2 | | 89 | 11000111001111 | 4 |
| | 90 | 01100011111001 | 2 | | 90 | 11000111100111 | 4 |
| | 91 | 01100011110011 | 2 | | 91 | 11000111110011 | 4 |
| | 92 | 01100011100111 | 2 | | 92 | 11000111111001 | 4 |
| | 93 | 01100011001111 | 2 | | 93 | 11000111111100 | 4 |

TABLE 17-continued (CDS ≧ 0)

| Class | 8-bit data | Modulation codes beginning with "0" | CDS | Class | 8-bit data | Modulation codes beginning with "1" | CDS |
|---|---|---|---|---|---|---|---|
| | 94 | 01100001111110 | 2 | | 94 | 11001100011111 | 4 |
| | 95 | 01111111001100 | 4 | | 95 | 11001100111110 | 4 |
| | 96 | 01111111000110 | 4 | | 96 | 11001110001111 | 4 |
| | 97 | 01111111000011 | 4 | | 97 | 11001110011110 | 4 |
| | 98 | 01111110011100 | 4 | | 98 | 11001111000111 | 4 |
| | 99 | 01111110011001 | 4 | | 99 | 11001111001110 | 4 |
| | 100 | 01111110001110 | 4 | | 100 | 11001111100011 | 4 |
| | 101 | 01111110000111 | 4 | | 101 | 11000001111110 | 2 |
| | 102 | 01111100111100 | 4 | | 102 | 11000011001111 | 2 |
| | 103 | 01111100111001 | 4 | | 103 | 11000011100111 | 2 |
| | 104 | 01111100110011 | 4 | | 104 | 11000011110011 | 2 |
| | 105 | 01111100011110 | 4 | | 105 | 11000011111001 | 2 |
| | 106 | 01111100001111 | 4 | | 106 | 11000011111100 | 2 |
| | 107 | 01111001111100 | 4 | | 107 | 11000110001111 | 2 |
| | 108 | 01111001111001 | 4 | | 108 | 11000110011110 | 2 |
| | 109 | 01111001110011 | 4 | | 109 | 11000111000111 | 2 |
| | 110 | 01111001100111 | 4 | | 110 | 11000111001110 | 2 |
| | 111 | 01111000111110 | 4 | | 111 | 11000111100011 | 2 |
| | 112 | 01111000011111 | 4 | | 112 | 11000111100110 | 2 |
| | 113 | 01110011111100 | 4 | | 113 | 11000111110001 | 2 |
| | 114 | 01110011111001 | 4 | | 114 | 11000111111000 | 2 |
| | 115 | 01110011110011 | 4 | | 115 | 11001100001111 | 2 |
| | 116 | 01110011100111 | 4 | | 116 | 11001100011110 | 2 |
| | 117 | 01110011001111 | 4 | | 117 | 11001100100011 | 2 |
| | 118 | 01110001111110 | 4 | | 118 | 11001100111001 | 2 |
| | 119 | 01100111111100 | 4 | | 119 | 11001100111100 | 2 |
| | 120 | 01100111111001 | 4 | | 120 | 11001110000111 | 2 |
| | 121 | 01100111110011 | 4 | | 121 | 11001110001110 | 2 |
| | 122 | 01100111100111 | 4 | | 122 | 11001110011001 | 2 |
| | 123 | 01100111001111 | 4 | | 123 | 11001110011100 | 2 |
| | 124 | 01100110011111 | 4 | | 124 | 11001111000011 | 2 |
| | 125 | 01100001111110 | 4 | | 125 | 11001111000110 | 2 |
| | 126 | 01111111000111 | 6 | | 126 | 11001111001100 | 2 |
| | 127 | 01111110001111 | 6 | | 127 | 11001111100001 | 2 |
| | 128 | 01111100011111 | 6 | | 128 | 11001111110000 | 2 |
| 2(A) | 129 | 00111111100000 | 0 | | 129 | 11000000011111 | 0 |
| | 130 | 00111111000001 | 0 | | 130 | 11000000111110 | 0 |
| | 131 | 00111110011000 | 0 | | 131 | 11000001100111 | 0 |
| | 132 | 00111110001100 | 0 | | 132 | 11000001110011 | 0 |
| | 133 | 00111110000110 | 0 | | 133 | 11000001111001 | 0 |
| | 134 | 00111110000011 | 0 | | 134 | 11000001111100 | 0 |
| | 135 | 00111100111000 | 0 | | 135 | 11000011000111 | 0 |
| | 136 | 00111100110001 | 0 | | 136 | 11000011001110 | 0 |
| | 137 | 00111100011100 | 0 | | 137 | 11000011100011 | 0 |
| | 138 | 00111100011001 | 0 | | 138 | 11000011100110 | 0 |
| | 139 | 00111100001110 | 0 | | 139 | 11000011110001 | 0 |
| | 140 | 00111100000111 | 0 | | 140 | 11000011111000 | 0 |
| | 141 | 00111001111000 | 0 | | 141 | 11000110000111 | 0 |
| | 142 | 00111001110001 | 0 | | 142 | 11000110001110 | 0 |
| | 143 | 00111001100110 | 0 | | 143 | 11000110011001 | 0 |
| | 144 | 00111001100011 | 0 | | 144 | 11000110011100 | 0 |
| | 145 | 00111000111100 | 0 | | 145 | 11000111000011 | 0 |
| | 146 | 00111000111001 | 0 | | 146 | 11000111000110 | 0 |
| | 147 | 00111000110011 | 0 | | 147 | 11000111001100 | 0 |
| | 148 | 00111000111110 | 0 | | 148 | 11000111100001 | 0 |
| | 149 | 00111000001111 | 0 | | 149 | 11000111110000 | 0 |
| | 150 | 00110011111000 | 0 | | 150 | 11001100000111 | 0 |
| | 151 | 00110011110001 | 0 | | 151 | 11001100001110 | 0 |
| | 152 | 00110011100110 | 0 | | 152 | 11001100011001 | 0 |
| | 153 | 00110011100011 | 0 | | 153 | 11001100011100 | 0 |
| | 154 | 00110011001110 | 0 | | 154 | 11001100110001 | 0 |
| | 155 | 00110011000111 | 0 | | 155 | 11001100111000 | 0 |
| | 156 | 00110001111100 | 0 | | 156 | 11001110000011 | 0 |
| | 157 | 00110001111001 | 0 | | 157 | 11001110000110 | 0 |
| | 158 | 00110001110011 | 0 | | 158 | 11001110001100 | 0 |
| | 159 | 00110001100111 | 0 | | 159 | 11001110011000 | 0 |
| | 160 | 00110000111110 | 0 | | 160 | 11001111000001 | 0 |
| | 161 | 00110000011111 | 0 | | 161 | 11001111100000 | 0 |
| | 162 | 00111111100001 | 2 | | 162 | 11001111100110 | 4 |
| | 163 | 00111111001100 | 2 | | 163 | 11001111110001 | 4 |
| | 164 | 00111111000110 | 2 | | 164 | 11001111111000 | 4 |
| | 165 | 00111111000011 | 2 | 3(B) | 165 | 11100001111110 | 4 |
| | 166 | 00111110011100 | 2 | | 166 | 11100011001111 | 4 |
| | 167 | 00111110011001 | 2 | | 167 | 11100011100111 | 4 |
| | 168 | 00111110001110 | 2 | | 168 | 11100011110011 | 4 |
| | 169 | 00111110000111 | 2 | | 169 | 11100011111001 | 4 |
| | 170 | 00111100111100 | 2 | | 170 | 11100011111100 | 4 |
| | 171 | 00111100111001 | 2 | | 171 | 11100110001111 | 4 |

TABLE 17-continued (CDS ≧ 0)

| Class | 8-bit data | Modulation codes beginning with "0" | CDS | Class | 8-bit data | Modulation codes beginning with "1" | CDS |
|---|---|---|---|---|---|---|---|
| | 172 | 00111100110011 | 2 | | 172 | 11100110011110 | 4 |
| | 173 | 00111100011110 | 2 | | 173 | 11100111000111 | 4 |
| | 174 | 00111100001111 | 2 | | 174 | 11100111001110 | 4 |
| | 175 | 00111001111100 | 2 | | 175 | 11100111100011 | 4 |
| | 176 | 00111001111001 | 2 | | 176 | 11100111100110 | 4 |
| | 177 | 00111001110011 | 2 | | 177 | 11100111110001 | 4 |
| | 178 | 00111001100111 | 2 | | 178 | 11100111111000 | 4 |
| | 179 | 00111000111110 | 2 | | 179 | 11100000011111 | 2 |
| | 180 | 00111000011111 | 2 | | 180 | 11100000111110 | 2 |
| | 181 | 00110011111100 | 2 | | 181 | 11100001100111 | 2 |
| | 182 | 00110011111001 | 2 | | 182 | 11100001110011 | 2 |
| | 183 | 00110011110011 | 2 | | 183 | 11100001111001 | 2 |
| | 184 | 00110011100111 | 2 | | 184 | 11100001111100 | 2 |
| | 185 | 00110011001111 | 2 | | 185 | 11100011000111 | 2 |
| | 186 | 00110001111110 | 2 | | 186 | 11100011001110 | 2 |
| | 187 | 00111111100110 | 4 | | 187 | 11100011100011 | 2 |
| | 188 | 00111111100011 | 4 | | 188 | 11100011100110 | 2 |
| | 189 | 00111111001110 | 4 | | 189 | 11100011110001 | 2 |
| | 190 | 00111111000111 | 4 | | 190 | 11100011111000 | 2 |
| | 191 | 00111110011110 | 4 | | 191 | 11100110000111 | 2 |
| | 192 | 00111110001111 | 4 | | 192 | 11100110001110 | 2 |
| | 193 | 00111100111110 | 4 | | 193 | 11100110011001 | 2 |
| | 194 | 00111100011111 | 4 | | 194 | 11100110011100 | 2 |
| | 195 | 00111001111110 | 4 | | 195 | 11100111000011 | 2 |
| | 196 | 00110011111110 | 4 | | 196 | 11100111000110 | 2 |
| | 197 | 00111111100111 | 6 | | 197 | 11100111001100 | 2 |
| | 198 | 00111111001111 | 6 | | 198 | 11100111100001 | 2 |
| | 199 | 00111110011111 | 6 | | 199 | 11100111110000 | 2 |
| 3(A) | 200 | 00111111110000 | 0 | | 200 | 11100000001111 | 0 |
| | 201 | 00011111100001 | 0 | | 201 | 11100000011110 | 0 |
| | 202 | 00011111001100 | 0 | | 202 | 11100000110011 | 0 |
| | 203 | 00011111000110 | 0 | | 203 | 11100000111001 | 0 |
| | 204 | 00011111000011 | 0 | | 204 | 11100000111100 | 0 |
| | 205 | 00011110011100 | 0 | | 205 | 11100001100011 | 0 |
| | 206 | 00011110011001 | 0 | | 206 | 11100001100110 | 0 |
| | 207 | 00011110001110 | 0 | | 207 | 11100001110001 | 0 |
| | 208 | 00011110000111 | 0 | | 208 | 11100001111000 | 0 |
| | 209 | 00011100111100 | 0 | | 209 | 11100011000011 | 0 |
| | 210 | 00011100111001 | 0 | | 210 | 11100011000110 | 0 |
| | 211 | 00011100110011 | 0 | | 211 | 11100011001100 | 0 |
| | 212 | 00011100011110 | 0 | | 212 | 11100011100001 | 0 |
| | 213 | 00011100001111 | 0 | | 213 | 11100011110000 | 0 |
| | 214 | 00011001111100 | 0 | | 214 | 11100110000011 | 0 |
| | 215 | 00011001111001 | 0 | | 215 | 11100110000110 | 0 |
| | 216 | 00011001110011 | 0 | | 216 | 11100110001100 | 0 |
| | 217 | 00011001100111 | 0 | | 217 | 11100110011000 | 0 |
| | 218 | 00011000111110 | 0 | | 218 | 11100111000001 | 0 |
| | 219 | 00011000011111 | 0 | | 219 | 11100111100000 | 0 |
| | 220 | 00011111110001 | 2 | 4(B) | 220 | 11110000001111 | 2 |
| | 221 | 00011111100110 | 2 | | 221 | 11110000011110 | 2 |
| | 222 | 00011111100011 | 2 | | 222 | 11110000110011 | 2 |
| | 223 | 00011111001110 | 2 | | 223 | 11110000111001 | 2 |
| | 224 | 00011111000111 | 2 | | 224 | 11110000111100 | 2 |
| | 225 | 00011110011110 | 2 | | 225 | 11110001100011 | 2 |
| | 226 | 00011110001111 | 2 | | 226 | 11110001100110 | 2 |
| | 227 | 00011100111110 | 2 | | 227 | 11110001110001 | 2 |
| | 228 | 00011100011111 | 2 | | 228 | 11110001111000 | 2 |
| | 229 | 00011001111110 | 2 | | 229 | 11110011000011 | 2 |
| | 230 | 00011111110011 | 4 | | 230 | 11110011000110 | 2 |
| | 231 | 00011111100111 | 4 | | 231 | 11110011001100 | 2 |
| | 232 | 00011111001111 | 4 | | 232 | 11110011100001 | 2 |
| | 233 | 00011110011111 | 4 | | 233 | 11110011110000 | 2 |
| 4(A) | 234 | 00001111111000 | 0 | | 234 | 11110000000111 | 0 |
| | 235 | 00001111110001 | 0 | | 235 | 11110000001110 | 0 |
| | 236 | 00001111100110 | 0 | | 236 | 11110000011001 | 0 |
| | 237 | 00001111100011 | 0 | | 237 | 11110000011100 | 0 |
| | 238 | 00001111001110 | 0 | | 238 | 11110000110001 | 0 |
| | 239 | 00001111000111 | 0 | | 239 | 11110000111000 | 0 |
| | 240 | 00001110011110 | 0 | | 240 | 11110001100001 | 0 |
| | 241 | 00001110001111 | 0 | | 241 | 11110001110000 | 0 |
| | 242 | 00001100111110 | 0 | | 242 | 11110011000001 | 0 |
| | 243 | 00001100011111 | 0 | | 243 | 11110011100000 | 0 |
| | 244 | 00001111111001 | 2 | 5(B) | 244 | 11111000000111 | 2 |
| | 245 | 00001111110011 | 2 | | 245 | 11111000011100 | 2 |
| | 246 | 00001111100111 | 2 | | 246 | 11111000110001 | 2 |
| | 247 | 00001111001111 | 2 | | 247 | 11111000111000 | 2 |
| | 248 | 00001110011111 | 2 | | 248 | 11111001110000 | 2 |
| 5(A) | 249 | 00000111111100 | 0 | | 249 | 11111000000011 | 0 |

TABLE 17-continued (CDS ≧ 0)

| Class | 8-bit data | Modulation codes beginning with "0" | CDS | Class | 8-bit data | Modulation codes beginning with "1" | CDS |
|---|---|---|---|---|---|---|---|
| | 250 | 000001111111001 | 0 | | 250 | 111110000000110 | 0 |
| | 251 | 000001111110011 | 0 | | 251 | 111110000001100 | 0 |
| | 252 | 000001111100111 | 0 | | 252 | 111110000011000 | 0 |
| | 253 | 000001111001111 | 0 | | 253 | 111110000110000 | 0 |
| | 254 | 000001100011111 | 0 | | 254 | 111110011000000 | 0 |
| 6(A) | 255 | 000000111111110 | 0 | 6(B) | 255 | 111111000000001 | 0 |

TABLE 18

(CDS ≦ 0)

| Class | 8-bit data | Modulation codes beginning with "0" | CDS | Class | 8-bit data | Modulation codes beginning with "1" | CDS |
|---|---|---|---|---|---|---|---|
| 1(C) | 0 | 011111100000001 | 0 | 1(D) | 0 | 100000001111110 | 0 |
| | 1 | 011111100110000 | 0 | | 1 | 100000011001111 | 0 |
| | 2 | 011111100011000 | 0 | | 2 | 100000011100111 | 0 |
| | 3 | 011111100001100 | 0 | | 3 | 100000111110011 | 0 |
| | 4 | 011111100000110 | 0 | | 4 | 100000011111001 | 0 |
| | 5 | 011111100000011 | 0 | | 5 | 100000011111100 | 0 |
| | 6 | 011110011100000 | 0 | | 6 | 100001100001111 | 0 |
| | 7 | 011110011000001 | 0 | | 7 | 100001100011110 | 0 |
| | 8 | 011110001110000 | 0 | | 8 | 100001110001111 | 0 |
| | 9 | 011110001100001 | 0 | | 9 | 100001110011110 | 0 |
| | 10 | 011110000011100 | 0 | | 10 | 100001111100011 | 0 |
| | 11 | 011110000011001 | 0 | | 11 | 100001111100110 | 0 |
| | 12 | 011110000001110 | 0 | | 12 | 100001111110001 | 0 |
| | 13 | 011110000000111 | 0 | | 13 | 100001111111000 | 0 |
| | 14 | 011100111110000 | 0 | | 14 | 100011000001111 | 0 |
| | 15 | 011100111100001 | 0 | | 15 | 100011000011110 | 0 |
| | 16 | 011100110011100 | 0 | | 16 | 100011001100011 | 0 |
| | 17 | 011100110000110 | 0 | | 17 | 100011001111001 | 0 |
| | 18 | 011100110000011 | 0 | | 18 | 100011001111100 | 0 |
| | 19 | 011100011110000 | 0 | | 19 | 100011100001111 | 0 |
| | 20 | 011100011100001 | 0 | | 20 | 100011100011110 | 0 |
| | 21 | 011100011001100 | 0 | | 21 | 100011100110011 | 0 |
| | 22 | 011100011000011 | 0 | | 22 | 100011100111100 | 0 |
| | 23 | 011100000111100 | 0 | | 23 | 100011110000011 | 0 |
| | 24 | 011100000111001 | 0 | | 24 | 100011110000110 | 0 |
| | 25 | 011100000110011 | 0 | | 25 | 100011110011100 | 0 |
| | 26 | 011100000011110 | 0 | | 26 | 100011111100001 | 0 |
| | 27 | 011100000001111 | 0 | | 27 | 100011111110000 | 0 |
| | 28 | 011001111110000 | 0 | | 28 | 100110000001111 | 0 |
| | 29 | 011001111100001 | 0 | | 29 | 100110000011110 | 0 |
| | 30 | 011001110011100 | 0 | | 30 | 100110001100011 | 0 |
| | 31 | 011001110000110 | 0 | | 31 | 100110001111001 | 0 |
| | 32 | 011001110000011 | 0 | | 32 | 100110001111100 | 0 |
| | 33 | 011001100111100 | 0 | | 33 | 100110011000011 | 0 |
| | 34 | 011001100110011 | 0 | | 34 | 100110011001100 | 0 |
| | 35 | 011001100001110 | 0 | | 35 | 100110011110001 | 0 |
| | 36 | 011001100000111 | 0 | | 36 | 100110011111000 | 0 |
| | 37 | 011000111111000 | 0 | | 37 | 100111000000111 | 0 |
| | 38 | 011000111110001 | 0 | | 38 | 100111000001110 | 0 |
| | 39 | 011000111100110 | 0 | | 39 | 100111000011001 | 0 |
| | 40 | 011000111100011 | 0 | | 40 | 100111000011100 | 0 |
| | 41 | 011000110011110 | 0 | | 41 | 100111001100001 | 0 |
| | 42 | 011000110001111 | 0 | | 42 | 100111001110000 | 0 |
| | 43 | 011000011111100 | 0 | | 43 | 100111100000011 | 0 |
| | 44 | 011000011111001 | 0 | | 44 | 100111100000110 | 0 |
| | 45 | 011000011110011 | 0 | | 45 | 100111100001100 | 0 |
| | 46 | 011000011001111 | 0 | | 46 | 100111100110000 | 0 |
| | 47 | 011000000111110 | 0 | | 47 | 100111111000001 | 0 |
| | 48 | 011000000111111 | 0 | | 48 | 100111111100000 | 0 |
| | 49 | 011111100000001 | −2 | | 49 | 100000000111110 | −2 |
| | 50 | 011111001100000 | −2 | | 50 | 100000001100111 | −2 |
| | 51 | 011110000110001 | −2 | | 51 | 100000001110011 | −2 |
| | 52 | 011110000011000 | −2 | | 52 | 100000001111001 | −2 |
| | 53 | 011110000001100 | −2 | | 53 | 100000001111100 | −2 |
| | 54 | 011110000000110 | −2 | | 54 | 100000011000111 | −2 |
| | 55 | 011110000000011 | −2 | | 55 | 100000011001110 | −2 |
| | 56 | 011100111000000 | −2 | | 56 | 100000011100011 | −2 |
| | 57 | 011100110000001 | −2 | | 57 | 100000011100110 | −2 |
| | 58 | 011100011110000 | −2 | | 58 | 100000011110001 | −2 |
| | 59 | 011100011100001 | −2 | | 59 | 100000011111000 | −2 |
| | 60 | 011100001111000 | −2 | | 60 | 100001100001111 | −2 |
| | 61 | 011100001100001 | −2 | | 61 | 100001100011110 | −2 |
| | 62 | 011100000011100 | −2 | | 62 | 100001100110011 | −2 |

TABLE 18-continued (CDS ≦ 0)

| Class | 8-bit data | Modulation codes beginning with "0" | CDS | Class | 8-bit data | Modulation codes beginning with "1" | CDS |
|---|---|---|---|---|---|---|---|
| | 63 | 01110000011001 | −2 | | 63 | 10000110011100 | −2 |
| | 64 | 01110000001110 | −2 | | 64 | 10000111000011 | −2 |
| | 65 | 01110000000111 | −2 | | 65 | 10000111000110 | −2 |
| | 66 | 01100111100000 | −2 | | 66 | 10000111001100 | −2 |
| | 67 | 01100111000001 | −2 | | 67 | 10000111100001 | −2 |
| | 68 | 01100110011000 | −2 | | 68 | 10000111110000 | −2 |
| | 69 | 01100110001100 | −2 | | 69 | 10001100000111 | −2 |
| | 70 | 01100110000110 | −2 | | 70 | 10001100001110 | −2 |
| | 71 | 01100110000011 | −2 | | 71 | 10001100011001 | −2 |
| | 72 | 01100011110000 | −2 | | 72 | 10001100011100 | −2 |
| | 73 | 01100011100001 | −2 | | 73 | 10001100110001 | −2 |
| | 74 | 01100011001100 | −2 | | 74 | 10001100111000 | −2 |
| | 75 | 01100011000110 | −2 | | 75 | 10001110000011 | −2 |
| | 76 | 01100011000011 | −2 | | 76 | 10001110000110 | −2 |
| | 77 | 01100001111000 | −2 | | 77 | 10001110001100 | −2 |
| | 78 | 01100001110001 | −2 | | 78 | 10001110011000 | −2 |
| | 79 | 01100001100110 | −2 | | 79 | 10001111000001 | −2 |
| | 80 | 01100001100011 | −2 | | 80 | 10001111100000 | −2 |
| | 81 | 01100000111100 | −2 | | 81 | 10011000000111 | −2 |
| | 82 | 01100000111001 | −2 | | 82 | 10011000001110 | −2 |
| | 83 | 01100000110011 | −2 | | 83 | 10011000011001 | −2 |
| | 84 | 01100000011110 | −2 | | 84 | 10011000011100 | −2 |
| | 85 | 01100000001111 | −2 | | 85 | 10011000110001 | −2 |
| | 86 | 01100000111000 | −4 | | 86 | 10011000111000 | −2 |
| 2(C) | 87 | 00111100000001 | −4 | | 87 | 10011001100001 | −2 |
| | 88 | 00111001100000 | −4 | | 88 | 10011001110000 | −2 |
| | 89 | 00111000110000 | −4 | | 89 | 10011100000011 | −2 |
| | 90 | 00111000011000 | −4 | | 90 | 10011100000110 | −2 |
| | 91 | 00111000001100 | −4 | | 91 | 10011100001100 | −2 |
| | 92 | 00111000000110 | −4 | | 92 | 10011100011000 | −2 |
| | 93 | 00111000000011 | −4 | | 93 | 10011100110000 | −2 |
| | 94 | 00110011100000 | −4 | | 94 | 10011110000001 | −2 |
| | 95 | 00110011000001 | −4 | | 95 | 10000000110011 | −4 |
| | 96 | 00110001110000 | −4 | | 96 | 10000000111001 | −4 |
| | 97 | 00110001100001 | −4 | | 97 | 10000000111100 | −4 |
| | 98 | 00110000111000 | −4 | | 98 | 10000001100011 | −4 |
| | 99 | 00110000110001 | −4 | | 99 | 10000001100110 | −4 |
| | 100 | 00110000011100 | −4 | | 100 | 10000001110001 | −4 |
| | 101 | 00111110000001 | −2 | | 101 | 10000001111000 | −4 |
| | 102 | 00111100110000 | −2 | | 102 | 10000011000011 | −4 |
| | 103 | 00111100011000 | −2 | | 103 | 10000011000110 | −4 |
| | 104 | 00111100001100 | −2 | | 104 | 10000011001100 | −4 |
| | 105 | 00111100000110 | −2 | | 105 | 10000011100001 | −4 |
| | 106 | 00111100000011 | −2 | | 106 | 10000011110000 | −4 |
| | 107 | 00111001110000 | −2 | | 107 | 10000110000011 | −4 |
| | 108 | 00111001100001 | −2 | | 108 | 10000110000110 | −4 |
| | 109 | 00111000111000 | −2 | | 109 | 10000110001100 | −4 |
| | 110 | 00111000110001 | −2 | | 110 | 10000110011000 | −4 |
| | 111 | 00111000001100 | −2 | | 111 | 10000111000001 | −4 |
| | 112 | 00111000011001 | −2 | | 112 | 10000111100000 | −4 |
| | 113 | 00111000001110 | −2 | | 113 | 10001100000011 | −4 |
| | 114 | 00111000000111 | −2 | | 114 | 10001100000110 | −4 |
| | 115 | 00110011110000 | −2 | | 115 | 10001100001100 | −4 |
| | 116 | 00110011100001 | −2 | | 116 | 10001100011000 | −4 |
| | 117 | 00110011001100 | −2 | | 117 | 10001100110000 | −4 |
| | 118 | 00110011000110 | −2 | | 118 | 10001110000001 | −4 |
| | 119 | 00110011000011 | −2 | | 119 | 10011000000011 | −4 |
| | 120 | 00110001111000 | −2 | | 120 | 10011000000110 | −4 |
| | 121 | 00110001110001 | −2 | | 121 | 10011000001100 | −4 |
| | 122 | 00110001100110 | −2 | | 122 | 10011000011000 | −4 |
| | 123 | 00110001100011 | −2 | | 123 | 10011000110000 | −4 |
| | 124 | 00110000111100 | −2 | | 124 | 10011001100000 | −4 |
| | 125 | 00110000111001 | −2 | | 125 | 10011100000001 | −4 |
| | 126 | 00110000110011 | −2 | | 126 | 10000000111000 | −6 |
| | 127 | 00110000011110 | −2 | | 127 | 10000001110000 | −6 |
| | 128 | 00110000001111 | −2 | | 128 | 10000011100000 | −6 |
| | 129 | 00111111100000 | 0 | 2(D) | 129 | 11000000011111 | 0 |
| | 130 | 00111111000001 | 0 | | 130 | 11000000111110 | 0 |
| | 131 | 00111110011000 | 0 | | 131 | 11000001100111 | 0 |
| | 132 | 00111110001100 | 0 | | 132 | 11000001110011 | 0 |
| | 133 | 00111110000110 | 0 | | 133 | 11000001111001 | 0 |
| | 134 | 00111110000011 | 0 | | 134 | 11000001111100 | 0 |
| | 135 | 00111100111000 | 0 | | 135 | 11000011000111 | 0 |
| | 136 | 00111100110001 | 0 | | 136 | 11000011001110 | 0 |
| | 137 | 00111100011100 | 0 | | 137 | 11000011100011 | 0 |
| | 138 | 00111100011001 | 0 | | 138 | 11000011100110 | 0 |
| | 139 | 00111100001110 | 0 | | 139 | 11000011110001 | 0 |
| | 140 | 00111100000111 | 0 | | 140 | 11000011111000 | 0 |

TABLE 18-continued (CDS ≤ 0)

| Class | 8-bit data | Modulation codes beginning with "0" | CDS | Class | 8-bit data | Modulation codes beginning with "1" | CDS |
|---|---|---|---|---|---|---|---|
| | 141 | 00111001111000 | 0 | | 141 | 11000110000111 | 0 |
| | 142 | 00111001110001 | 0 | | 142 | 11000110001110 | 0 |
| | 143 | 00111001100110 | 0 | | 143 | 11000110011001 | 0 |
| | 144 | 00111001100011 | 0 | | 144 | 11000110011100 | 0 |
| | 145 | 00111000111100 | 0 | | 145 | 11000111000011 | 0 |
| | 146 | 00111000111001 | 0 | | 146 | 11000111000110 | 0 |
| | 147 | 00111000110011 | 0 | | 147 | 11000111001100 | 0 |
| | 148 | 00111000011110 | 0 | | 148 | 11000111100001 | 0 |
| | 149 | 00111000001111 | 0 | | 149 | 11000111110000 | 0 |
| | 150 | 00110011111000 | 0 | | 150 | 11001100000111 | 0 |
| | 151 | 00110011110001 | 0 | | 151 | 11001100001110 | 0 |
| | 152 | 00110011100110 | 0 | | 152 | 11001100011001 | 0 |
| | 153 | 00110011100011 | 0 | | 153 | 11001100011100 | 0 |
| | 154 | 00110011001110 | 0 | | 154 | 11001100110001 | 0 |
| | 155 | 00110011000111 | 0 | | 155 | 11001100111000 | 0 |
| | 156 | 00110001111100 | 0 | | 156 | 11001110000011 | 0 |
| | 157 | 00110001111001 | 0 | | 157 | 11001110000110 | 0 |
| | 158 | 00110001110011 | 0 | | 158 | 11001110001100 | 0 |
| | 159 | 00110001100111 | 0 | | 159 | 11001110011000 | 0 |
| | 160 | 00110000111110 | 0 | | 160 | 11001111000001 | 0 |
| | 161 | 00110000011111 | 0 | | 161 | 11001111100000 | 0 |
| | 162 | 00110000011001 | −4 | | 162 | 11000000011110 | −2 |
| | 163 | 00110000001110 | −4 | | 163 | 11000000110011 | −2 |
| | 164 | 00110000000111 | −4 | | 164 | 11000000111001 | −2 |
| 3(C) | 165 | 00011110000001 | −4 | | 165 | 11000000111100 | −2 |
| | 166 | 00011100110000 | −4 | | 166 | 11000001100011 | −2 |
| | 167 | 00011100011000 | −4 | | 167 | 11000001100110 | −2 |
| | 168 | 00011100001100 | −4 | | 168 | 11000001110001 | −2 |
| | 169 | 00011100000110 | −4 | | 169 | 11000001111000 | −2 |
| | 170 | 00011100000011 | −4 | | 170 | 11000011000011 | −2 |
| | 171 | 00011001110000 | −4 | | 171 | 11000011000110 | −2 |
| | 172 | 00011001100001 | −4 | | 172 | 11000011001100 | −2 |
| | 173 | 00011000111000 | −4 | | 173 | 11000011100001 | −2 |
| | 174 | 00011000110001 | −4 | | 174 | 11000011110000 | −2 |
| | 175 | 00011000011100 | −4 | | 175 | 11000110000011 | −2 |
| | 176 | 00011000011001 | −4 | | 176 | 11000110000110 | −2 |
| | 177 | 00011000001110 | −4 | | 177 | 11000110001100 | −2 |
| | 178 | 00011000000111 | −4 | | 178 | 11000110011000 | −2 |
| | 179 | 00011111100000 | −2 | | 179 | 11000111000001 | −2 |
| | 180 | 00011111000001 | −2 | | 180 | 11000111100000 | −2 |
| | 181 | 00011110011000 | −2 | | 181 | 11001100000011 | −2 |
| | 182 | 00011110001100 | −2 | | 182 | 11001100000110 | −2 |
| | 183 | 00011110000110 | −2 | | 183 | 11001100001100 | −2 |
| | 184 | 00011110000011 | −2 | | 184 | 11001100011000 | −2 |
| | 185 | 00011100111000 | −2 | | 185 | 11001100110000 | −2 |
| | 186 | 00011100110001 | −2 | | 186 | 11001110000001 | −2 |
| | 187 | 00011100011100 | −2 | | 187 | 11000000011001 | −4 |
| | 188 | 00011100011001 | −2 | | 188 | 11000000011100 | −4 |
| | 189 | 00011100001110 | −2 | | 189 | 11000000110001 | −4 |
| | 190 | 00011100000111 | −2 | | 190 | 11000000111000 | −4 |
| | 191 | 00011001111000 | −2 | | 191 | 11000001100001 | −4 |
| | 192 | 00011001110001 | −2 | | 192 | 11000001110000 | −4 |
| | 193 | 00011001100110 | −2 | | 193 | 11000011000001 | −4 |
| | 194 | 00011001100011 | −2 | | 194 | 11000011100000 | −4 |
| | 195 | 00011000111100 | −2 | | 195 | 11000110000001 | −4 |
| | 196 | 00011000111001 | −2 | | 196 | 11001100000001 | −4 |
| | 197 | 00011000110011 | −2 | | 197 | 11000000011000 | −6 |
| | 198 | 00011000011110 | −2 | | 198 | 11000000110000 | −6 |
| | 199 | 00011000001111 | −2 | | 199 | 11000001100000 | −6 |
| | 200 | 00011111110000 | 0 | 3(D) | 200 | 11100000001111 | 0 |
| | 201 | 00011111100001 | 0 | | 201 | 11100000011110 | 0 |
| | 202 | 00011111001100 | 0 | | 202 | 11100000110011 | 0 |
| | 203 | 00011111000110 | 0 | | 203 | 11100000111001 | 0 |
| | 204 | 00011111000011 | 0 | | 204 | 11100000111100 | 0 |
| | 205 | 00011110011100 | 0 | | 205 | 11100001100011 | 0 |
| | 206 | 00011110011001 | 0 | | 206 | 11100001100110 | 0 |
| | 207 | 00011110001110 | 0 | | 207 | 11100001110001 | 0 |
| | 208 | 00011110000111 | 0 | | 208 | 11100001111000 | 0 |
| | 209 | 00011100111100 | 0 | | 209 | 11100011000011 | 0 |
| | 210 | 00011100111001 | 0 | | 210 | 11100011000110 | 0 |
| | 211 | 00011100110011 | 0 | | 211 | 11100011001100 | 0 |
| | 212 | 00011100011110 | 0 | | 212 | 11100011100001 | 0 |
| | 213 | 00011100001111 | 0 | | 213 | 11100011110000 | 0 |
| | 214 | 00011001111100 | 0 | | 214 | 11100110000011 | 0 |
| | 215 | 00011001111001 | 0 | | 215 | 11100110000110 | 0 |
| | 216 | 00011001110011 | 0 | | 216 | 11100110001100 | 0 |
| | 217 | 00011001100111 | 0 | | 217 | 11100110011000 | 0 |
| | 218 | 00011000111110 | 0 | | 218 | 11100111000001 | 0 |

TABLE 18-continued (CDS ≤ 0)

| Class | 8-bit data | Modulation codes beginning with "0" | CDS | Class | 8-bit data | Modulation codes beginning with "1" | CDS |
|---|---|---|---|---|---|---|---|
| | 219 | 00011000011111 | 0 | | 219 | 11100111100000 | 0 |
| 4(C) | 220 | 00001111110000 | −2 | | 220 | 11100000001110 | −2 |
| | 221 | 00001111100001 | −2 | | 221 | 11100000011001 | −2 |
| | 222 | 00001111001100 | −2 | | 222 | 11100000011100 | −2 |
| | 223 | 00001111000110 | −2 | | 223 | 11100000110001 | −2 |
| | 224 | 00001111000011 | −2 | | 224 | 11100000111000 | −2 |
| | 225 | 00001110011100 | −2 | | 225 | 11100001100001 | −2 |
| | 226 | 00001110011001 | −2 | | 226 | 11100001110000 | −2 |
| | 227 | 00001110001110 | −2 | | 227 | 11100011000001 | −2 |
| | 228 | 00001110000111 | −2 | | 228 | 11100011100000 | −2 |
| | 229 | 00001100111100 | −2 | | 229 | 11100110000001 | −2 |
| | 230 | 00001100111001 | −2 | | 230 | 11100000001100 | −4 |
| | 231 | 00001100110011 | −2 | | 231 | 11100000011000 | −4 |
| | 232 | 00001100011110 | −2 | | 232 | 11100000110000 | −4 |
| | 233 | 00001100001111 | −2 | | 233 | 11100001100000 | −4 |
| | 234 | 00001111111000 | 0 | 4(D) | 234 | 11110000000111 | 0 |
| | 235 | 00001111110001 | 0 | | 235 | 11110000001110 | 0 |
| | 236 | 00001111100110 | 0 | | 236 | 11110000011001 | 0 |
| | 237 | 00001111100011 | 0 | | 237 | 11110000011100 | 0 |
| | 238 | 00001111001110 | 0 | | 238 | 11110000110001 | 0 |
| | 239 | 00001111000111 | 0 | | 239 | 11110000111000 | 0 |
| | 240 | 00001110011110 | 0 | | 240 | 11110001100001 | 0 |
| | 241 | 00001110001111 | 0 | | 241 | 11110001110000 | 0 |
| | 242 | 00001100111110 | 0 | | 242 | 11110011000001 | 0 |
| | 243 | 00001100011111 | 0 | | 243 | 11110011100000 | 0 |
| 5(C) | 244 | 00000111111000 | −2 | | 244 | 11110000000110 | −2 |
| | 245 | 00000111100011 | −2 | | 245 | 11110000001100 | −2 |
| | 246 | 00000111001110 | −2 | | 246 | 11110000011000 | −2 |
| | 247 | 00000111000111 | −2 | | 247 | 11110000110000 | −2 |
| | 248 | 00000110001111 | −2 | | 248 | 11110001100000 | −2 |
| | 249 | 00000111111100 | 0 | 5(D) | 249 | 11111000000011 | 0 |
| | 250 | 00000111111001 | 0 | | 250 | 11111000000110 | 0 |
| | 251 | 00000111110011 | 0 | | 251 | 11111000001100 | 0 |
| | 252 | 00000111100111 | 0 | | 252 | 11111000011000 | 0 |
| | 253 | 00000111001111 | 0 | | 253 | 11111000110000 | 0 |
| | 254 | 00000110011111 | 0 | | 254 | 11111001100000 | 0 |
| 6(C) | 255 | 00000011111110 | 0 | 6(D) | 255 | 11111100000001 | 0 |